(12) United States Patent
Jeffries-EL et al.

(10) Patent No.: US 9,023,964 B2
(45) Date of Patent: May 5, 2015

(54) CONJUGATED POLYMER AND SEMICONDUCTOR DEVICES INCLUDING THE SAME

(71) Applicant: Iowa State University Research Foundation, Inc., Ames, IA (US)

(72) Inventors: Malika Jeffries-EL, Ames, IA (US); Jeremy J. Intermann, Seattle, WA (US); Brian C. Tlach, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 14/207,033

(22) Filed: Mar. 12, 2014

(65) Prior Publication Data
US 2014/0275459 A1   Sep. 18, 2014

Related U.S. Application Data

(60) Provisional application No. 61/780,202, filed on Mar. 13, 2013.

(51) Int. Cl.
C08F 28/06    (2006.01)
H01L 51/00    (2006.01)
H01L 51/50    (2006.01)

(52) U.S. Cl.
CPC ........ *H01L 51/0036* (2013.01); *H01L 51/0035* (2013.01); *H01L 51/5012* (2013.01); *Y02E 10/549* (2013.01)

(58) Field of Classification Search
USPC ............ 526/257; 548/148; 528/377, 380, 378
See application file for complete search history.

(56) References Cited

FOREIGN PATENT DOCUMENTS

JP          10340786 A      12/1998
JP         2007238530 A      9/2007

OTHER PUBLICATIONS

Hellerich et al., Macromolecules 2012, 45, 6888-6897.*
Park et al., Journal of the Korean Physical Society, 2012, 60, 925-928.*
Hegedus, L. S, et al., "Synthesis of 2,B-Disubstituted 3,6-Diamino-1,4-benzoquinones", J. Org. Chem., 47, (1982), 2607-2613.
Kim, I. T, et al., "Synthesis, characterization, and properties of a new thiophene-benzobisthiazole copolymer", Synthetic Metals, 156, (2006), 38-41.
Klare, J. E, et al., "Cruciform pi-systems for molecular electronics applications", J Am Chem Soc., 125(20), (May 21, 2003), 6030-1.
Lim, J., et al., "Benzobisoxazole Cruciforms: Heterocyclic Fluorophores with Spatially Separated Frontier Molecular Orbitals", J. Org. Chem., 76, (2011), 10207-10219.
Osowska, K., et al., "Supramolecular organization of extended benzobisoxazole cruciforms", Chem Commun (Camb), 46(24), (Jun. 28, 2010), 4276-8.
Tlach, B. C, et al., "Tuning the optical and electronic properties of 4,8-disubstituted benzobisoxazoles via alkyne substitution", J Org Chem., 76(21), (Nov. 4, 2011), 8670-81.

* cited by examiner

*Primary Examiner* — Shane Fang
(74) *Attorney, Agent, or Firm* — Schwegman Lundberg & Woessner, P.A.

(57) ABSTRACT

The present invention relates to conjugated polymers. In various embodiments, the present invention provides a conjugated polymer including a repeating unit including a benzene ring conjugated with the polymer backbone, wherein the benzene ring is fused to two 5-membered rings, wherein each fused 5-membered ring includes N and at least one of O and S. In various embodiments, the present invention provides semiconductor devices including the polymer, and methods of making the polymer.

21 Claims, 47 Drawing Sheets

CONJUGATED POLYMER AND SEMICONDUCTOR DEVICES INCLUDING THE SAME

CROSS-REFERENCE TO RELATED APPLICATION

This application claims the benefit of priority to U.S. Provisional Patent Application Ser. No. 61/780,202, filed Mar. 13, 2013, the disclosure of which is incorporated herein in its entirety by reference.

STATEMENT OF GOVERNMENT SUPPORT

This invention was made with U.S. Government support under Grant No. DMR-0846607 awarded by the National Science Foundation. The U.S. Government has certain rights in this invention.

BACKGROUND OF THE INVENTION

Conjugated polymers (CP)s are of tremendous scientific and technological importance, due to the impact they can make in the emerging field of organic semiconductors. Due to their unique combination of semiconducting and polymer processing properties, these materials offer a potential for enormous cost savings in electronic devices. Applications include field effect transistors (FET)s, organic light emitting diodes (OLED)s and photovoltaic cells (PVC)s. The use of conjugated polymers in organic semiconducting applications requires both electron-donating and electron-accepting materials. While there are a large number of known conjugated small molecules, oligomers and polymers, the vast majority of structure-property investigations are on p-type (electron donating, hole transporting) materials. In contrast, research on n-type (electron accepting, electron transporting) organic materials has fallen behind. In many instances the synthesis of such materials is difficult, preventing structural modification required for optimization of properties such as solubility, electron affinity and electron, mobility.

Organic light-emitting diodes are an advancing technology for use in, for example, flat panel display and solid-state light applications. Polymer LEDs (PLEDs) are an example of OLED-based technologies. The performance of some polymer in PLEDs can be limited. For example, some polymers can aggregate and cause fluorescence quenching. In addition, some polymers can have incomplete Forster resonance energy transfer (FRET) with hosts such as poly(N-vinylcarbazole), which can give rise to substantial host contributions to the electroluminescence spectrum.

SUMMARY OF THE INVENTION

In various embodiments, the present invention provides a conjugated polymer including a repeating unit including structure (I):

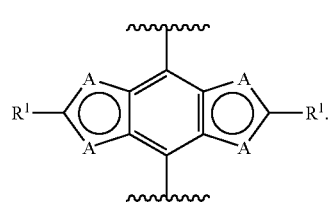

In structure (I), each $R^1$ at each occurrence is independently chosen from $-R^2$, $-H$, $-OH$, $-OR^2$, $-NR^2_2$ and halide, wherein $R^2$ at each occurrence is independently chosen from $-H$ and substituted or unsubstituted $C_{1-60}$ hydrocarbyl. Each A at each occurrence is independently chosen from N, S, and O. Each 5-membered ring in structure (I) independently at each occurrence has one A that is N and one A that is S or O.

In various embodiments, the present invention provides a conjugated polymer having the formula

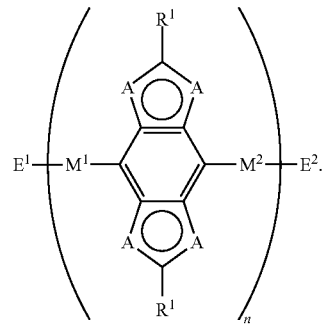

Each A at each occurrence is independently chosen from N, S, and O, wherein each 5-membered ring in the fused benzene ring system independently at each occurrence has one A that is N and one A that is S or O. The variables $M^1$ and $M^2$ are each independently at each occurrence chosen from a bond and

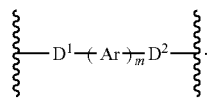

Each of $D^1$ and $D^2$ at each occurrence are independently chosen from a bond, substituted or unsubstituted ethenylene, and ethynylene. Each m at each occurrence is 0 to 30. At least one of $M^1$ and $M^2$ is not a bond. The variable Ar at each occurrence is independently chosen from

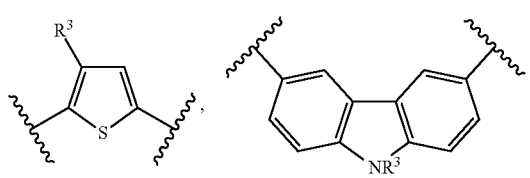

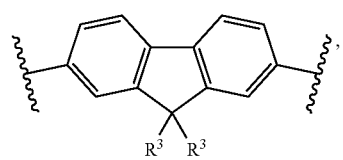

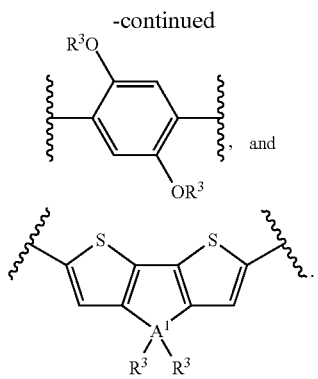

, and

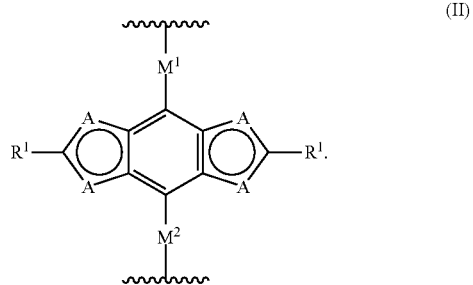

Each R³ at each occurrence is independently chosen from —H and C$_{1-15}$ hydrocarbyl. The variable n is about 2 to about 10,000. The variables E¹ and E² are each independently at each occurrence chosen from substituted or unsubstituted —R⁵, —H, —OH, —OR⁵, —NR⁵$_2$ and halide. The variable R⁵ at each occurrence is independently chosen from —H and substituted or unsubstituted C$_{1-60}$ hydrocarbyl.

In various embodiments, the present invention provides a method of making a polymer. The method includes obtaining or providing a fused benzene ring system having the structure (III)

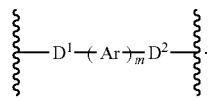

In structure (III), each A at each occurrence is independently chosen from N, S, and O. Each 5-membered ring in structure (III) independently at each occurrence has one A that is N and one A that is S or O. Each R¹ at each occurrence is independently chosen from —R², —H, —OH, —OR², —NR²$_2$ and halide. The variable R² at each occurrence is independently chosen from —H and substituted or unsubstituted C$_{1-60}$ hydrocarbyl, and X is —I, —Br, —Cl, or —F. Each R⁶ at each occurrence is independently a bond or Ar. Each Ar at each occurrence is independently chosen from substituted or unsubstituted aryl and substituted or unsubstituted heteroaryl. The method also includes obtaining or providing a conjugated linker having the structure

Each L at each occurrence is —Sn(R⁷)$_3$ or —B(OR⁸)$_2$. The variable R⁷ at each occurrence is independently $_{1-15}$ hydrocarbyl. The variable R⁸ is C$_{1-30}$ hydrocarbyl or together with another R⁸ is a C$_{2-30}$ hydrocarbylene that forms a cyclic boronic acid ester structure with the —B(O—)$_2$. Each m at each occurrence is 0 to 30. The method also includes contacting the fused benzene ring system and the conjugated linker under conditions so as to provide a conjugated polymer having a repeating unit including structure (II)

(II)

In structure (II), M¹ and M² are each independently at each occurrence chosen from a bond and $$\xi\!\!-\!\!D^1\!\!-\!\!(Ar)_{\overline{m}}\!\!-\!\!D^2\!\!-\!\!\xi.$$

Each of D¹ and D² at each occurrence are independently chosen from a bond and ethynylene, and at least one of M¹ and M² is not a bond.

Certain embodiments provide various advantages over other conjugated polymers, semiconductor devices including the same, and methods of making the same, at least some of which are unexpected. In some embodiments, the conjugated polymer can increase at least one of the electronic affinity, electron transport, photoluminescence, oxidative stability, and thermal stability, of materials containing the conjugated polymer, wherein the increase is greater than that experienced by materials containing other conjugated polymers. In some embodiments, the conjugated polymer can be an n-type (electron accepting, electron transporting) semiconducting organic material, that can be more easily, less expensively, or more quickly synthesized than other n-type semiconducting organic materials.

Conjugated polymers can have semiconducting properties in part because of electron delocalization within their π-orbitals, which can also lead to efficient stacking and render the conjugated polymers insoluble in organic solvents in their native state. In some embodiments, the conjugated polymer can aggregate less, such as pi-stack less, than other conjugated polymers, such as polybenzobisoxazoles conjugated through the oxazole and benzene rings, thus providing higher solubility in organic solvents. In some embodiments, the conjugated polymer can be functionalized with groups that enhance its solubility in organic solvents, such as flexible groups. The enhanced organic solvent-solubility can make some embodiments of the conjugated polymer easier to process and fabricate into various materials than other conjugated polymers, and can improve the film-forming properties of the conjugated polymer and materials including the conjugated polymer.

In various embodiments, a decreased propensity for aggregation or use of flexible side chains can positively affect the nanoscale morphology and electronic, optical, and physical properties of the conjugated polymer, as compared to other conjugated polymers. In various embodiments, the decreased propensity for aggregation or use of flexible side chains can allow the conjugated polymer to be more processable, allowing it to be used to fabricate a wider variety of semiconductor devices more easily, with less cost, or with higher quality.

In some embodiments, the starting materials and resulting conjugated polymer can be more robust than other conjugated polymers and starting materials therefor, allowing the starting materials and polymer to withstand a great variety of conditions than other polymers and starting materials therefor that can degrade under similar conditions. In some embodiments, the synthetic route to generate the conjugated polymers is simple and high yielding, making it easier and more efficient for scaling up the procedure than other methods of generating conjugated polymers.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION OF THE INVENTION

Figure 1A:
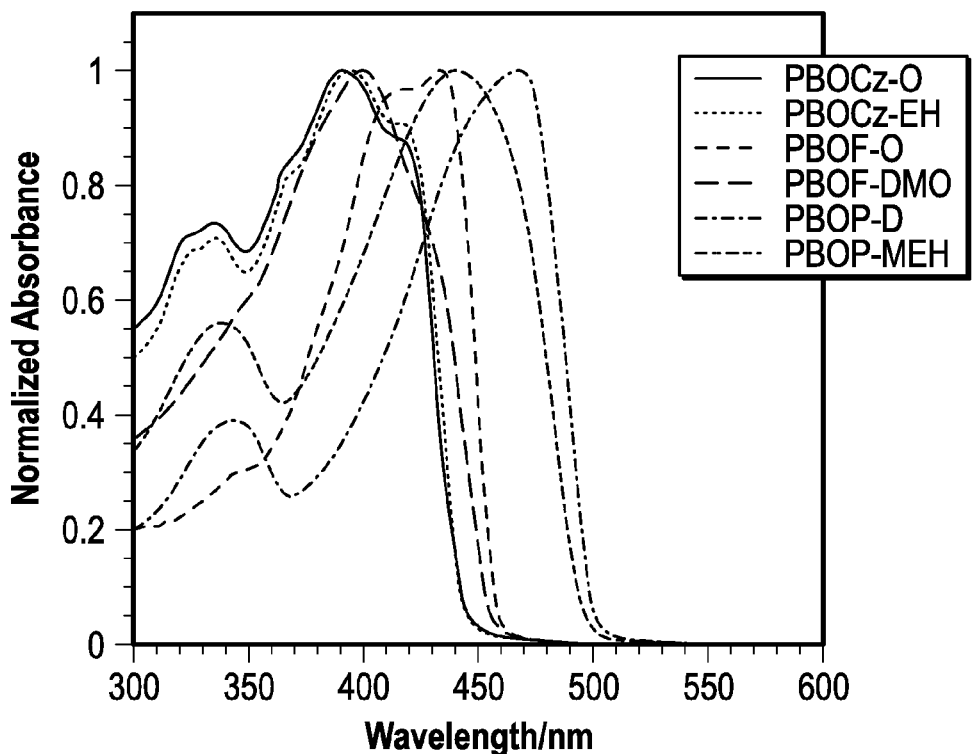
FIGS. 1a-b illustrate UV-vis spectra of benzobisoxazole polymers a) in chloroform solutions and b) as thin films, in accordance with various embodiments.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of manufacturing described herein, the steps can be carried out in any order without departing from the principles of the invention, except when a temporal or operational sequence is explicitly recited. Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more.

The term "organic group" as used herein refers to but is not limited to any carbon-containing functional group. For example, an oxygen-containing group such as alkoxy groups, aryloxy groups, aralkyloxy groups, oxo(carbonyl) groups, carboxyl groups including carboxylic acids, carboxylates, and carboxylate esters; a sulfur-containing group such as alkyl and aryl sulfide groups; and other heteroatom-containing groups. Non-limiting examples of organic groups include OR', OC(O)N(R')$_2$, CN, CF$_3$, OCF$_3$, R', C(O), methylenedioxy, ethylenedioxy, N(R')$_2$, SR', SOR', SO$_2$R', SO$_2$N(R')$_2$, SO$_3$R', C(O)R', C(O)C(O)R', C(O)CH$_2$C(O)R', C(S)R', C(O)OR', OC(O)R', C(O)N(R')$_2$, OC(O)N(R')$_2$, C(S)N(R')$_2$, (CH$_2$)$_{0-2}$N(R')C(O)R', (CH$_2$)$_{0-2}$N(R')N(R')$_2$, N(R')N(R')C(O)R', N(R')N(R')C(O)OR', N(R')N(R')CON(R')$_2$, N(R')SO$_2$R', N(R')SO$_2$N(R')$_2$, N(R')C(O)OR', N(R')C(O)R', N(R')C(S)R', N(R')C(O)N(R')$_2$, N(R')C(S)N(R')$_2$, N(COR')COR', N(OR')R', C(=NH)N(R')$_2$, C(O)N(OR')R', or C(=NOR')R' wherein R' can be hydrogen (in examples that include other carbon atoms) or a carbon-based moiety, and wherein the carbon-based moiety can itself be further substituted; for example, wherein R' can be hydrogen (in examples that include other carbon atoms), alkyl, acyl, cycloalkyl, aryl, aralkyl, heterocyclyl, heteroaryl, or heteroarylalkyl, wherein any alkyl, acyl, cycloalkyl, aryl, aralkyl, heterocyclyl, heteroaryl, or heteroarylalkyl, or R' can be independently mono- or multi-substituted with J; or wherein two R' groups bonded to a nitrogen atom or to adjacent nitrogen atoms can together with the nitrogen atom or atoms form a heterocyclyl, which can be mono- or independently multi-substituted with J. Examples of organic groups include linear and/or branched groups such as alkyl groups, fully or partially halogen-substituted haloalkyl groups, alkenyl groups, alkynyl groups, aromatic groups, acrylate functional groups, and methacrylate functional groups; and other organic functional groups such as ether groups, cyanate ester groups, ester groups, carboxylate salt groups, and masked isocyano groups. Examples of organic groups include, but are not limited to, alkyl groups such as methyl, ethyl, propyl, isopropyl, n-butyl, s-butyl, and t-butyl groups, acrylate functional groups such as acryloyloxypropyl groups and methacryloyloxypropyl groups; alkenyl groups such as vinyl, allyl, and butenyl groups; alkynyl groups such as ethynyl and propynyl groups; aromatic groups such as phenyl, tolyl, and xylyl groups; cyanoalkyl groups such as cyanoethyl and cyanopropyl groups; halogenated hydrocarbon groups such as 3,3,3-trifluoropropyl, 3-chloropropyl, dichlorophenyl, and 6,6,6,5,5,4,4,3,3-nonafluorohexyl groups; alkenyloxypoly(oxyalkyene) groups such as allyloxy(polyoxyethylene), allyloxypoly(oxypropylene), and allyloxy-poly(oxypropylene)-co-poly(oxyethylene) groups; alkyloxypoly(oxyalkyene) groups such as propyloxy (polyoxyethylene), propyloxypoly(oxypropylene), and propyloxy-poly(oxypropylene)-co-poly(oxyethylene) groups; halogen substituted alkyloxypoly(oxyalkyene) groups such as perfluoropropyloxy(polyoxyethylene), perfluoropropyloxypoly(oxypropylene), and perfluoropropyloxy-poly(oxypropylene)-co-poly(oxyethylene) groups; alkoxy groups such as methoxy, ethoxy, n-propoxy, isopropoxy, n-butoxy, and ethylhexyloxy groups; aminoalkyl groups such as 3-aminopropyl, 6-aminohexyl, 11-aminoundecyl, 3-(N-allylamino)propyl, N-(2-aminoethyl)-3-aminopropyl, N-(2-aminoethyl)-3-aminoisobutyl, p-aminophenyl, 2-ethylpyridine, and 3-propylpyrrole groups; epoxyalkyl groups such as 3-glycidoxypropyl, 2-(3,4,-epoxycyclohexyl)ethyl, and 5,6-epoxyhexyl groups; ester functional groups such as actetoxyethyl and benzoyloxypropyl groups; hydroxy functional groups such as 2-hydroxyethyl groups; masked isocyanate functional groups such as propyl-t-butylcarbamate, and propylethylcarbamate groups; aldehyde functional groups such as undecanal and butyraldehyde groups; anhydride functional groups such as 3-propyl succinic anhydride and 3-propyl maleic anhydride groups; and metal salts of carboxylic acids such as the zinc, sodium, or potassium salts of 3-carboxypropyl and 2-carboxyethyl.

The term "substituted" as used herein refers to an organic group as defined herein or molecule in which one or more hydrogen atoms contained therein are replaced by one or more non-hydrogen atoms. The term "functional group" or "substituent" as used herein refers to a group that can be or is substituted onto a molecule, or onto an organic group. Examples of substituents or functional groups include, but are not limited to, a halogen (e.g., F, Cl, Br, and I); an oxygen atom in groups such as hydroxyl groups, alkoxy groups, aryloxy groups, aralkyloxy groups, oxo(carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, hydroxylamines, nitriles, nitro groups, N-oxides, hydrazides, azides, and enamines; and other heteroatoms in various other groups. Non-limiting examples of substituents J that can be bonded to a substituted carbon (or other) atom include F, Cl, Br, I, OR', OC(O)N(R')$_2$, CN, NO, NO$_2$, ONO$_2$, azido, CF$_3$, OCF$_3$, R', O (oxo), S (thiono), C(O), S(O), methylenedioxy, ethylenedioxy, N(R')$_2$, SW, SOW, SO$_2$R', SO$_2$N(R')$_2$, SO$_3$R', C(O)R', C(O)C(O)R', C(O)CH$_2$C(O)R', C(S)R', C(O)OR', OC(O)R', C(O)N(R')$_2$, OC(O)N(R')$_2$, C(S)N(R')$_2$, (CH$_2$)$_{0-2}$N(R')C(O)R', (CH$_2$)$_{0-2}$N(R')N(R')$_2$, N(R')N(R')C(O)R', N(R')N(R')C(O)OR', N(R')N(R')CON(R')$_2$, N(R')SO$_2$R', N(R')SO$_2$N(R')$_2$, N(R')C(O)OR', N(R')C(O)R', N(R')C(S)R', N(R')C(O)N(R')$_2$, N(R')C(S)N(R')$_2$, N(COR')COR', N(OR')R', C(=NH)N(R')$_2$, C(O)N(OR')R', or C(=NOR')R' wherein R' can be hydrogen or a carbon-based moiety, and wherein the carbon-based moiety can itself be further substituted; for example, wherein R' can be hydrogen, alkyl, acyl, cycloalkyl, aryl, aralkyl, heterocyclyl, heteroaryl, or heteroarylalkyl, wherein any alkyl, acyl, cycloalkyl, aryl, aralkyl, heterocyclyl, heteroaryl, or heteroarylalkyl or R' can be independently mono- or multi-substituted with J; or wherein two R' groups bonded to a nitrogen atom or to adjacent nitrogen atoms can together with the nitrogen atom or atoms form a heterocyclyl, which can be mono- or independently multi-substituted with J.

As used herein, the term "hydrocarbyl" refers to a functional group derived from a straight chain, branched, or cyclic hydrocarbon, such as an alkyl, alkenyl, alkynyl, aryl, cycloalkyl, acyl, or a combination thereof.

The term "alkyl" as used herein refers to straight chain and branched alkyl groups and cycloalkyl groups having from 1 to 40 carbon atoms, 1 to about 20 carbon atoms, 1 to 12 carbons or, in some embodiments, from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and anteisoalkyl groups as well as other branched chain forms of alkyl. Representative substituted alkyl groups can be substituted one or more times with any of the groups listed herein, for example, amino, hydroxy, cyano, carboxy, nitro, thio, alkoxy, and halogen groups.

The term "alkenyl" as used herein refers to straight and branched chain and cyclic alkyl groups as defined herein, except that at least one double bond exists between two carbon atoms. Thus, alkenyl groups have from 2 to 40 carbon atoms, or 2 to about 20 carbon atoms, or 2 to 12 carbons or, in some embodiments, from 2 to 8 carbon atoms. Examples include, but are not limited to vinyl, —CH=CH(CH$_3$), —CH=C(CH$_3$)$_2$, —C(CH$_3$)=CH$_2$, —C(CH$_3$)=CH(CH$_3$), —C(CH$_2$CH$_3$)=CH$_2$, cyclohexenyl, cyclopentenyl, cyclohexadienyl, butadienyl, pentadienyl, and hexadienyl among others.

The term "alkynyl" as used herein refers to straight and branched chain alkyl groups, except that at least one triple bond exists between two carbon atoms. Thus, alkynyl groups have from 2 to 40 carbon atoms, 2 to about 20 carbon atoms, or from 2 to 12 carbons or, in some embodiments, from 2 to 8 carbon atoms. Examples include, but are not limited to —C≡CH, —C≡C(CH$_3$), —C≡C(CH$_2$CH$_3$), —CH$_2$C≡CH, —CH$_2$C≡C(CH$_3$), and —CH$_2$C≡C(CH$_2$CH$_3$) among others.

The term "acyl" as used herein refers to a group containing a carbonyl moiety wherein the group is bonded via the carbonyl carbon atom. The carbonyl carbon atom is also bonded to another carbon atom, which can be part of an alkyl, aryl, aralkyl cycloalkyl, cycloalkylalkyl, heterocyclyl, heterocyclylalkyl, heteroaryl, heteroarylalkyl group or the like. In the special case wherein the carbonyl carbon atom is bonded to a hydrogen, the group is a "formyl" group, an acyl group as the term is defined herein. An acyl group can include 0 to about 12-20 or 12-40 additional carbon atoms bonded to the carbonyl group. An acyl group can include double or triple bonds within the meaning herein. An acryloyl group is an example of an acyl group. An acyl group can also include heteroatoms within the meaning here. A nicotinoyl group (pyridyl-3-carbonyl) group is an example of an acyl group within the meaning herein. Other examples include acetyl, benzoyl, phenylacetyl, pyridylacetyl, cinnamoyl, and acryloyl groups and the like. When the group containing the carbon atom that is bonded to the carbonyl carbon atom contains a halogen, the group is termed a "haloacyl" group. An example is a trifluoroacetyl group.

The term "cycloalkyl" as used herein refers to cyclic alkyl groups such as, but not limited to, cyclopropyl, cyclobutyl, cyclopentyl, cyclohexyl, cycloheptyl, and cyclooctyl groups. In some embodiments, the cycloalkyl group can have 3 to about 8-12 ring members, whereas in other embodiments the number of ring carbon atoms range from 3 to 4, 5, 6, or 7. Cycloalkyl groups further include polycyclic cycloalkyl groups such as, but not limited to, norbornyl, adamantyl, bornyl, camphenyl, isocamphenyl, and carenyl groups, and fused rings such as, but not limited to, decalinyl, and the like. Cycloalkyl groups also include rings that are substituted with straight or branched chain alkyl groups as defined herein.

Representative substituted cycloalkyl groups can be mono-substituted or substituted more than once, such as, but not limited to, 2,2-, 2,3-, 2,4- 2,5- or 2,6-disubstituted cyclohexyl groups or mono-, di- or tri-substituted norbornyl or cycloheptyl groups, which can be substituted with, for example, amino, hydroxy, cyano, carboxy, nitro, thio, alkoxy, and halogen groups. The term "cycloalkenyl" alone or in combination denotes a cyclic alkenyl group.

The term "aryl" as used herein refers to cyclic aromatic hydrocarbons that do not contain heteroatoms in the ring. Thus aryl groups include, but are not limited to, phenyl, azulenyl, heptalenyl, biphenyl, indacenyl, fluorenyl, phenanthrenyl, triphenylenyl, pyrenyl, naphthacenyl, chrysenyl, biphenylenyl, anthracenyl, and naphthyl groups. In some embodiments, aryl groups contain about 6 to about 14 carbons in the ring portions of the groups. Aryl groups can be unsubstituted or substituted, as defined herein. Representative substituted aryl groups can be mono-substituted or substituted more than once, such as, but not limited to, 2-, 3-, 4-, 5-, or 6-substituted phenyl or 2-8 substituted naphthyl groups, which can be substituted with carbon or non-carbon groups such as those listed herein.

The term "aralkyl" as used herein refers to alkyl groups as defined herein in which a hydrogen or carbon bond of an alkyl group is replaced with a bond to an aryl group as defined herein. Representative aralkyl groups include benzyl and phenylethyl groups and fused (cycloalkylaryl)alkyl groups such as 4-ethyl-indanyl. Aralkenyl group are alkenyl groups as defined herein in which a hydrogen or carbon bond of an alkyl group is replaced with a bond to an aryl group as defined herein.

The term "heterocyclyl" as used herein refers to aromatic and non-aromatic ring compounds containing 3 or more ring members, of which, one or more is a heteroatom such as, but not limited to, N, O, and S. Thus a heterocyclyl can be a cycloheteroalkyl, or a heteroaryl, or if polycyclic, any combination thereof. In some embodiments, heterocyclyl groups include 3 to about 20 ring members, whereas other such groups have 3 to about 15 ring members. A heterocyclyl group designated as a $C_2$-heterocyclyl can be a 5-ring with two carbon atoms and three heteroatoms, a 6-ring with two carbon atoms and four heteroatoms and so forth. Likewise a $C_4$-heterocyclyl can be a 5-ring with one heteroatom, a 6-ring with two heteroatoms, and so forth. The number of carbon atoms plus the number of heteroatoms sums up to equal the total number of ring atoms. A heterocyclyl ring can also include one or more double bonds. A heteroaryl ring is an embodiment of a heterocyclyl group. The phrase "heterocyclyl group" includes fused ring species including those that include fused aromatic and non-aromatic groups. For example, a dioxolanyl ring and a benzdioxolanyl ring system (methylenedioxyphenyl ring system) are both heterocyclyl groups within the meaning herein. The phrase also includes polycyclic ring systems containing a heteroatom such as, but not limited to, quinuclidyl. Heterocyclyl groups can be unsubstituted, or can be substituted as discussed herein. Heterocyclyl groups include, but are not limited to, pyrrolidinyl, piperidinyl, piperazinyl, morpholinyl, pyrrolyl, pyrazolyl, triazolyl, tetrazolyl, oxazolyl, isoxazolyl, thiazolyl, pyridinyl, thiophenyl, benzothiophenyl, benzofuranyl, dihydrobenzofuranyl, indolyl, dihydroindolyl, azaindolyl, indazolyl, benzimidazolyl, azabenzimidazolyl, benzoxazolyl, benzothiazolyl, benzothiadiazolyl, imidazopyridinyl, isoxazolopyridinyl, thianaphthalenyl, purinyl, xanthinyl, adeninyl, guaninyl, quinolinyl, isoquinolinyl, tetrahydroquinolinyl, quinoxalinyl, and quinazolinyl groups. Representative substituted heterocyclyl groups can be mono-substituted or substituted more than once, such as, but not limited to, piperidinyl or quinolinyl groups, which are 2-, 3-, 4-, 5-, or 6-substituted, or disubstituted with groups such as those listed herein.

The term "heteroaryl" as used herein refers to aromatic ring compounds containing 5 or more ring members, of which, one or more is a heteroatom such as, but not limited to, N, O, and S; for instance, heteroaryl rings can have 5 to about 8-12 ring members. A heteroaryl group is a variety of a heterocyclyl group that possesses an aromatic electronic structure. A heteroaryl group designated as a $C_2$-heteroaryl can be a 5-ring with two carbon atoms and three heteroatoms, a 6-ring with two carbon atoms and four heteroatoms and so forth. Likewise a $C_4$-heteroaryl can be a 5-ring with one heteroatom, a 6-ring with two heteroatoms, and so forth. The number of carbon atoms plus the number of heteroatoms sums up to equal the total number of ring atoms. Heteroaryl groups include, but are not limited to, groups such as pyrrolyl, pyrazolyl, triazolyl, tetrazolyl, oxazolyl, isoxazolyl, thiazolyl, pyridinyl, thiophenyl, benzothiophenyl, benzofuranyl, indolyl, azaindolyl, indazolyl, benzimidazolyl, azabenzimidazolyl, benzoxazolyl, benzothiazolyl, benzothiadiazolyl, imidazopyridinyl, isoxazolopyridinyl, thianaphthalenyl, purinyl, xanthinyl, adeninyl, guaninyl, quinolinyl, isoquinolinyl, tetrahydroquinolinyl, quinoxalinyl, and quinazolinyl groups. Heteroaryl groups can be unsubstituted, or can be substituted with groups as is discussed herein. Representative substituted heteroaryl groups can be substituted one or more times with groups such as those listed herein.

Additional examples of aryl and heteroaryl groups include but are not limited to phenyl, biphenyl, indenyl, naphthyl (1-naphthyl, 2-naphthyl), N-hydroxytetrazolyl, N-hydroxytriazolyl, N-hydroxyimidazolyl, anthracenyl (1-anthracenyl, 2-anthracenyl, 3-anthracenyl), thiophenyl (2-thienyl, 3-thienyl), furyl (2-furyl, 3-furyl), indolyl, oxadiazolyl, isoxazolyl, quinazolinyl, fluorenyl, xanthenyl, isoindanyl, benzhydryl, acridinyl, thiazolyl, pyrrolyl (2-pyrrolyl), pyrazolyl (3-pyrazolyl), imidazolyl (1-imidazolyl, 2-imidazolyl, 4-imidazolyl, 5-imidazolyl), triazolyl (1,2,3-triazol-1-yl, 1,2,3-triazol-2-yl-1,2,3-triazol-4-yl, 1,2,4-triazol-3-yl), oxazolyl (2-oxazolyl, 4-oxazolyl, 5-oxazolyl), thiazolyl (2-thiazolyl, 4-thiazolyl, 5-thiazolyl), pyridyl (2-pyridyl, 3-pyridyl, 4-pyridyl), pyrimidinyl (2-pyrimidinyl, 4-pyrimidinyl, 5-pyrimidinyl, 6-pyrimidinyl), pyrazinyl, pyridazinyl (3-pyridazinyl, 4-pyridazinyl, 5-pyridazinyl), quinolyl (2-quinolyl, 3-quinolyl, 4-quinolyl, 5-quinolyl, 6-quinolyl, 7-quinolyl, 8-quinolyl), isoquinolyl (1-isoquinolyl, 3-isoquinolyl, 4-isoquinolyl, 5-isoquinolyl, 6-isoquinolyl, 7-isoquinolyl, 8-isoquinolyl), benzo[b]furanyl (2-benzo[b]furanyl, 3-benzo[b]furanyl, 4-benzo[b]furanyl, 5-benzo[b]furanyl, 6-benzo[b]furanyl, 7-benzo[b]furanyl), 2,3-dihydro-benzo[b]furanyl (2-(2,3-dihydro-benzo[b]furanyl), 3-(2,3-dihydro-benzo[b]furanyl), 4-(2,3-dihydro-benzo[b]furanyl), 5-(2,3-dihydro-benzo[b]furanyl), 6-(2,3-dihydro-benzo[b]furanyl), 7-(2,3-dihydro-benzo[b]furanyl), benzo[b]thiophenyl (2-benzo[b]thiophenyl, 3-benzo[b]thiophenyl, 4-benzo[b]thiophenyl, 5-benzo[b]thiophenyl, 6-benzo[b]thiophenyl, 7-benzo[b]thiophenyl), 2,3-dihydro-benzo[b]thiophenyl, (2-(2,3-dihydro-benzo[b]thiophenyl), 3-(2,3-dihydro-benzo[b]thiophenyl), 4-(2,3-dihydro-benzo[b]thiophenyl), 5-(2,3-dihydro-benzo[b]thiophenyl), 6-(2,3-dihydro-benzo[b]thiophenyl), 7-(2,3-dihydro-benzo[b]thiophenyl), indolyl (1-indolyl, 2-indolyl, 3-indolyl, 4-indolyl, 5-indolyl, 6-indolyl, 7-indolyl), indazole (1-indazolyl, 3-indazolyl, 4-indazolyl, 5-indazolyl, 6-indazolyl, 7-indazolyl), benzimidazolyl (1-benzimidazolyl, 2-benzimidazolyl, 4-benzimidazolyl, 5-benzimidazolyl, 6-benzimidazolyl, 7-benzimidazolyl, 8-benzimidazolyl), benzoxazolyl (1-benzoxazolyl, 2-benzoxazolyl), benzothiazolyl (1-benzothiazolyl, 2-benzothiazolyl, 4-benzothiazolyl, 5-benzothiazolyl, 6-benzothiazolyl, 7-benzothiazolyl), carbazolyl (1-carbazolyl, 2-carbazolyl, 3-carbazolyl, 4-carbazolyl), 5H-dibenz[b,f]azepine (5H-dibenz[b,f]azepin-1-yl, 5H-dibenz[b,f]azepine-2-yl, 5H-dibenz[b,f]azepine-3-yl, 5H-dibenz[b,f]azepine-4-yl, 5H-dibenz[b,f]azepine-5-yl), 10,11-dihydro-5H-dibenz[b,f] azepine (10,11-dihydro-5H-dibenz[b,f]azepine-1-yl, 10,11-dihydro-5H-dibenz[b,f]azepine-2-yl, 10,11-dihydro-5H-dibenz[b,f]azepine-3-yl, 10,11-dihydro-5H-dibenz[b,f] azepine-4-yl, 10,11-dihydro-5H-dibenz[b,f]azepine-5-yl), and the like.

The term "heterocyclylalkyl" as used herein refers to alkyl groups as defined herein in which a hydrogen or carbon bond of an alkyl group as defined herein is replaced with a bond to a heterocyclyl group as defined herein. Representative heterocyclyl alkyl groups include, but are not limited to, furan-2-yl methyl, furan-3-yl methyl, pyridine-3-yl methyl, tetrahydrofuran-2-yl ethyl, and indol-2-yl propyl.

The term "heteroarylalkyl" as used herein refers to alkyl groups as defined herein in which a hydrogen or carbon bond of an alkyl group is replaced with a bond to a heteroaryl group as defined herein.

The term "alkoxy" as used herein refers to an oxygen atom connected to an alkyl group, including a cycloalkyl group, as are defined herein. Examples of linear alkoxy groups include but are not limited to methoxy, ethoxy, propoxy, butoxy, pentyloxy, hexyloxy, and the like. Examples of branched alkoxy include but are not limited to isopropoxy, sec-butoxy, tert-butoxy, isopentyloxy, isohexyloxy, and the like. Examples of cyclic alkoxy include but are not limited to cyclopropyloxy, cyclobutyloxy, cyclopentyloxy, cyclohexyloxy, and the like. An alkoxy group can include one to about 12-20 or about 12-40 carbon atoms bonded to the oxygen atom, and can further include double or triple bonds, and can also include heteroatoms. For example, an allyloxy group is an alkoxy group within the meaning herein. A methoxyethoxy group is also an alkoxy group within the meaning herein, as is a methylenedioxy group in a context where two adjacent atoms of a structures are substituted therewith.

The term "amine" as used herein refers to primary, secondary, and tertiary amines having, e.g., the formula $N(group)_3$ wherein each group can independently be H or non-H, such as alkyl, aryl, and the like. Amines include but are not limited to $R-NH_2$, for example, alkylamines, arylamines, alkylarylamines; $R_2NH$ wherein each R is independently selected, such as dialkylamines, diarylamines, aralkylamines, heterocyclylamines and the like; and $R_3N$ wherein each R is independently selected, such as trialkylamines, dialkylarylamines, alkyldiarylamines, triarylamines, and the like. The term "amine" also includes ammonium ions as used herein.

The term "amino group" as used herein refers to a substituent of the form $-NH_2$, $-NHR$, $-NR_2$, $-NR_3^+$, wherein each R is independently selected, and protonated forms of each, except for $-NR_3^+$, which cannot be protonated. Accordingly, any compound substituted with an amino group can be viewed as an amine. An "amino group" within the meaning herein can be a primary, secondary, tertiary or quaternary amino group. An "alkylamino" group includes a monoalkylamino, dialkylamino, and trialkylamino group.

The terms "halo" or "halogen" or "halide", as used herein, by themselves or as part of another substituent mean, unless otherwise stated, a fluorine, chlorine, bromine, or iodine atom, preferably, fluorine, chlorine, or bromine.

The term "haloalkyl" group, as used herein, includes mono-halo alkyl groups, poly-halo alkyl groups wherein all halo atoms can be the same or different, and per-halo alkyl groups, wherein all hydrogen atoms are replaced by halogen atoms, such as fluoro. Examples of haloalkyl include trifluoromethyl, 1,1-dichloroethyl, 1,2-dichloroethyl, 1,3-dibromo-3,3-difluoropropyl, perfluorobutyl, and the like.

The term "monovalent" as used herein refers to a substituent connecting via a single bond to a substituted molecule. When a substituent is monovalent, such as, for example, F or Cl, it is bonded to the atom it is substituting by a single bond.

The term "hydrocarbon" as used herein refers to a functional group or molecule that includes carbon and hydrogen atoms. The term can also refer to a functional group or molecule that normally includes both carbon and hydrogen atoms but wherein all the hydrogen atoms are substituted with other functional groups.

The term "resin" as used herein refers to polysiloxane material of any viscosity that includes at least one siloxane monomer that is bonded via a Si—O—Si bond to three or four other siloxane monomers. In one example, the polysiloxane material includes T or Q groups, as defined herein.

The term "number-average molecular weight" as used herein refers to the ordinary arithmetic mean of the molecular weight of individual molecules in a sample. It is defined as the total weight of all molecules in a sample divided by the total number of molecules in the sample. Experimentally, the number average molecular weight ($M_n$) is determined by analyzing a sample divided into molecular weight fractions of species i having $n_i$ molecules of molecular weight $M_i$ through the formula $M_n = \Sigma M_i n_i / \Sigma n_i$. The number average molecular weight can be measured by a variety of well-known methods including gel permeation chromatography, spectroscopic end group analysis and osmometry.

The term "weight-average molecular weight" as used herein refers ($M_w$), which is equal to $\Sigma M_i^2 n_i / \Sigma M_i n_i$, where $n_i$ is the number of molecules of molecular weight $M_i$. In various examples, the weight average molecular weight can be determined using light scattering, small angle neutron scattering, X-ray scattering, and sedimentation velocity.

The term "solvent" as used herein refers to a liquid that can dissolve a solid, liquid, or gas. Nonlimiting examples of solvents are silicones, organic compounds, water, alcohols, ionic liquids, and supercritical fluids.

The term "room temperature" as used herein refers to a temperature of about 15° C. to 28° C.

Herein, when it is designated that a variable in the structure can be "a bond", the variable can represent a direct bond between the two groups shown as linked to that variable, such as a single bond.

The term "polymer" as used herein can include a copolymer.

The term "conjugated polymer" as used herein refers to a polymer that has at least two double or triple bonds along at least some portion of the polymer backbone that are conjugated together.

The term "conjugated system" refers to at least two double or triple bonds and the single bond or the alternating single and multiple bonds that connect and conjugate the one double or triple bond to the other double or triple bond.

The term "conjugated together" as used herein with respect to two double or triple bonds refers to the conjugated bonds having a single bond connecting the two, or refers to the conjugated bonds having alternating single and double or triple bonds connecting the two. In some embodiments, lone pairs, radicals, or carbenium ions can alternate between single bonds to connect and conjugate two double or triple bonds. For example, bonds A and B are conjugated together in each of the following examples:

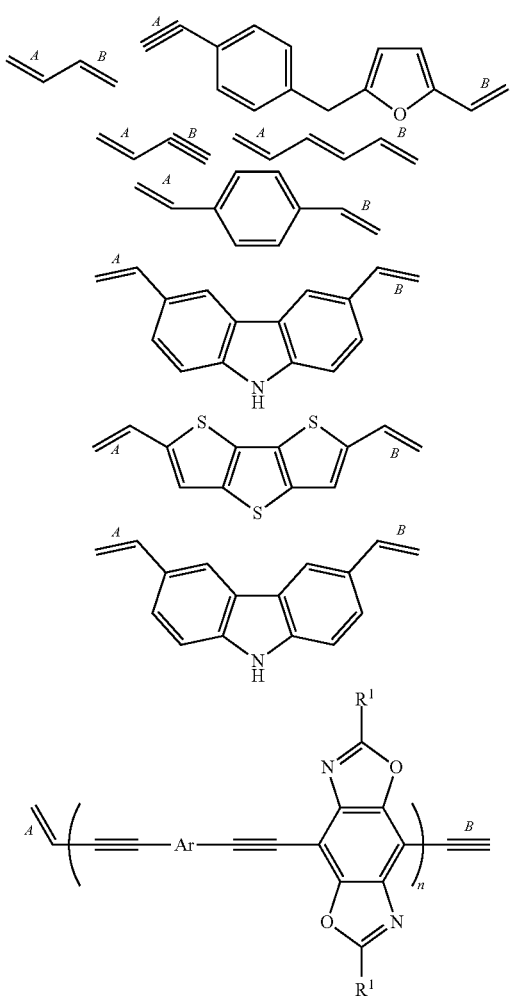

wherein Ar, R$^1$, and n are as defined herein.

Fused Benzene Ring.

In various embodiments, the present invention provides a conjugated polymer. In some embodiments, the conjugated polymer can include conjugated double or triple bonds along the length of the polymer backbone, such that any double or triple bond in the polymer backbone is conjugated to one another through double or triple bonds in the polymer backbone.

The conjugated polymer can include a repeating unit including structure (I)

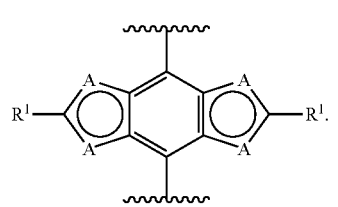

Each R$^1$ at each occurrence can be independently chosen from —R$^2$, —H, —OH, —OR$^2$, —NR$^2{}_2$ and halide. The variable R$^2$ at each occurrence can be independently chosen from —H and substituted or unsubstituted C$_{1-60}$ hydrocarbyl, and each A at each occurrence can be independently chosen from N, S, and O, wherein each 5-membered ring in structure (I) independently at each occurrence can have one A that is N and one A that is S or O. For example, structure (I) can be any one of

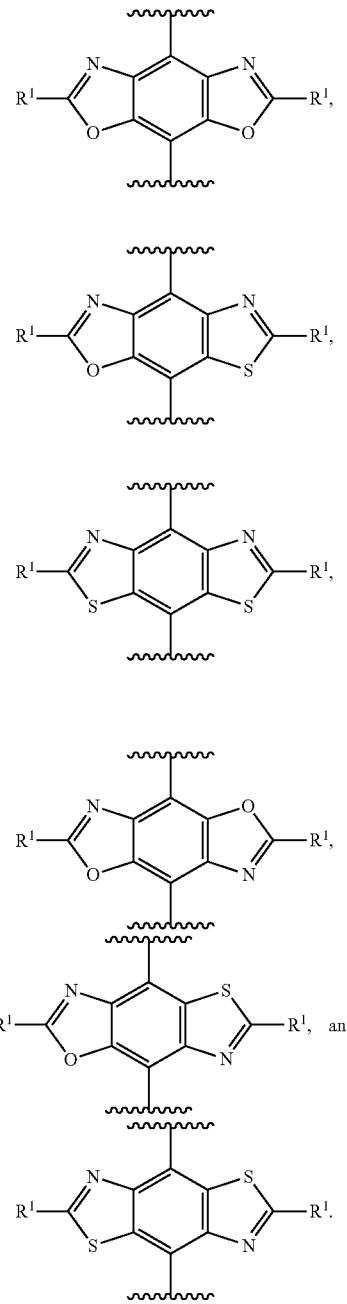

In various embodiments, structure (I) can be

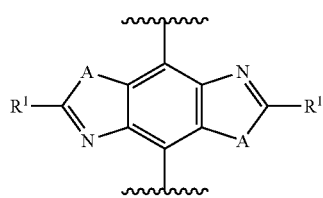

Each A at each occurrence can be independently chosen from O and S. Structure (I) can be

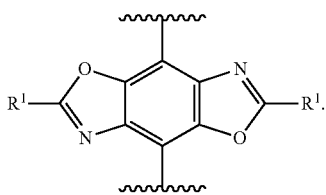

In some embodiments, each $R^1$ at each occurrence can be independently substituted or unsubstituted $C_{1-30}$ alkyl. In some examples, each $R^1$ at each occurrence can be independently $C_{1-15}$ alkyl. In some examples, each $R^1$ at each occurrence can be independently a substituted or unsubstituted $C_{1-15}$ aryl or heteroaryl, such as a $(C_{1-9}$alkyl)phenyl, thiophenyl, or furanyl. The benzene ring of structure (I) in each repetition of the repeating unit in the polymer can be conjugated together. The polymer can include a polymer backbone including a conjugated system including the benzene ring of structure (I). The polymer backbone can include at least one of double and triple bonds, wherein each double or triple bond can be conjugated with the benzene ring of structure (I). The polymer can be a copolymer.

Conjugated Linker.

In various embodiments, the repeating unit of the polymer can include at least one or two conjugated linkers. The conjugated linkers can link together the fused benzene ring systems in the polymer, and can provide conjugation between the benzene rings of the fused benzene ring system.

In some embodiments, the repeating unit includes structure (II)

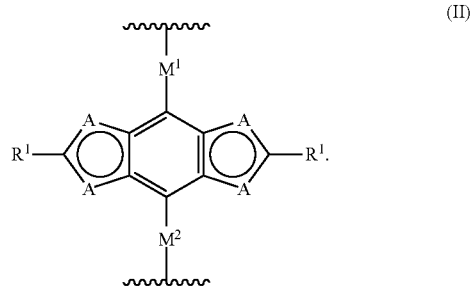

The variables $M^1$ and $M^2$ can be each independently at each occurrence chosen from a bond and conjugated linking group

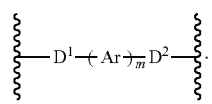

Each of $D^1$ and $D^2$ at each occurrence can be independently chosen from a bond, substituted or unsubstituted ethenylene, and ethynylene. Each Ar at each occurrence can be independently chosen from substituted or unsubstituted aryl and substituted or unsubstituted heteroaryl. Each m at each occurrence can be 0 to 30. At least one of $M^1$ and $M^2$ can be not a bond. In some embodiments, the repeating unit of the polymer can be structure (II).

In some embodiments, the variable $M^2$ can be a bond. In some embodiments, $D^1$ can be ethynylene, $D^2$ can be a bond, and m can be 0. In some examples, $D^1$ and $D^2$ can both be ethynylene. In some examples, the variable m at each occurrence can be independently chosen from 1, 2, and 3. In some embodiments, the variable m can be 1.

Aromatic Group.

The conjugated linking group in the repeating unit of the conjugated polymer can include one or more Ar groups, wherein Ar represents substituted or unsubstituted aryl and substituted or unsubstituted heteroaryl.

In various embodiments, Ar at each occurrence can be independently chosen from

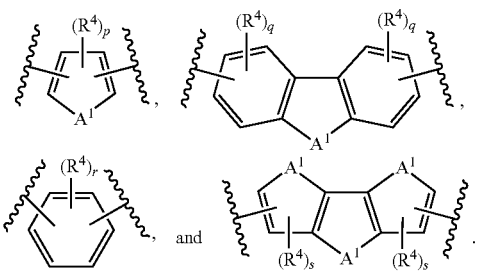

The Ar group can be interconnected with the polymer at any two locations. The Ar group can be unsubstituted, or can have any suitable number of $R^4$ groups substituted at any suitable location on the Ar group. The variable $A^1$ at each occurrence can be independently chosen from N—$R^3$, $CR^3_2$, $SiR^3_2$, S, and O. The variable $R^3$ at each occurrence can be independently chosen from —H and substituted or unsubstituted $C_{1-60}$ hydrocarbyl. Each $R^4$ at each occurrence can be independently chosen from —H, —$R^3$, —$OR^3$, —$NR^3_2$, and halide. The variable p at each occurrence can be independently chosen from 0, 1, and 2. The variable r at each occurrence can be independently chosen from 0, 1, 2, 3, and 4. The variable q at each occurrence can be independently chosen from 0, 1, 2, and 3. The variable s at each occurrence can be independently chosen from 0 and 1. In some embodiments, at least one of p, q, r, and s can be 1.

In various embodiments, Ar at each occurrence can be independently chosen from

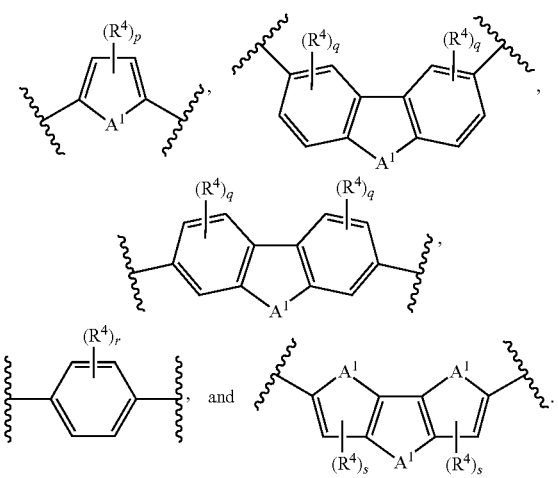

In some embodiments, $R^3$ can be at each occurrence independently $C_{1-15}$ hydrocarbyl. In some examples, $R^3$ can be at each occurrence independently $C_{1-15}$ alkyl.

In various embodiments, the variable Ar at each occurrence can be independently chosen from

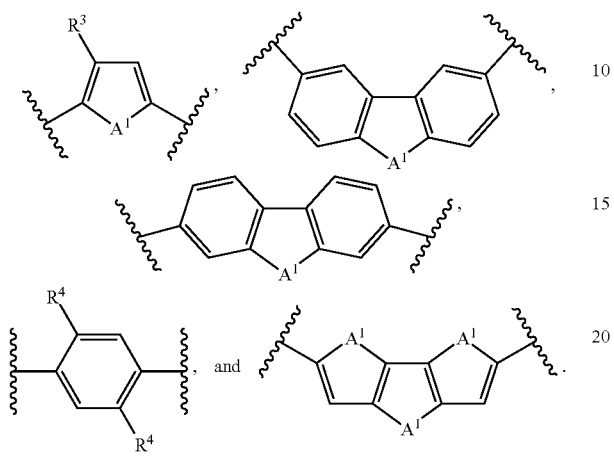

In some embodiments, the variable Ar at each occurrence can be independently chosen from

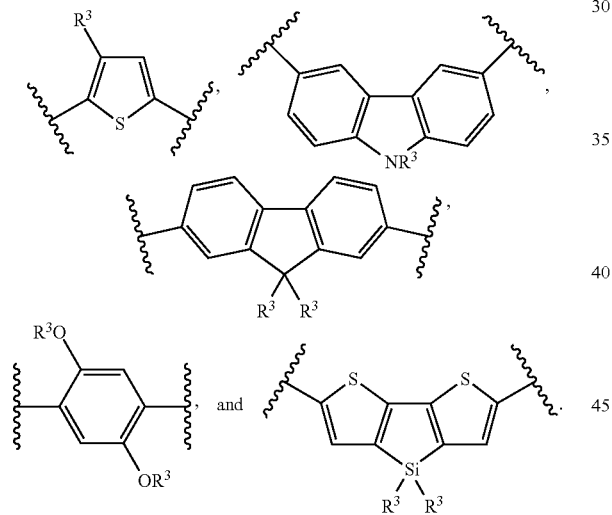

End Group.

The polymer provided by various embodiments can be terminated with any suitable end groups. For example, the polymer can be a linear polymer having each of the two ends terminated with a suitable end group -E. The end groups can be the same or different.

In some embodiments, each -E at each occurrence can be independently chosen from substituted or unsubstituted —$R^5$, —H, —OH, —$OR^5$, —$NR^5{}_2$ and halide. The varaible $R^5$ at each occurrence can be independently chosen from —H and substituted or unsubstituted $C_{1-60}$ hydrocarbyl. In some examples, -E at each occurrence can be independently $C_{1-15}$ aryl or heteroaryl. In some embodiments, -E at each occurrence can be independently substituted or unsubstituted phenyl. In some embodiments, each -E can be an unsubstituted phenyl.

Polymer.

In various embodiments, the present invention provides a conjugated polymer. The conjugated polymer can include conjugated double or triple bonds along the length of the polymer backbone, such that any double or triple bond in the polymer backbone is conjugated to one another through double or triple bonds in the polymer backbone.

In some examples, the polymer can include the structure

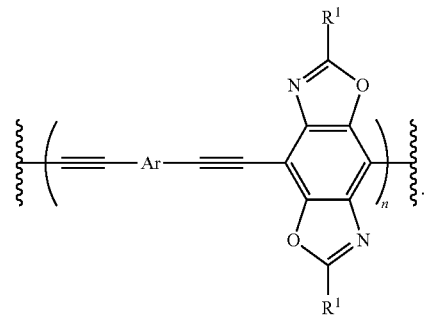

The variable Ar at each occurrence can be independently chosen from

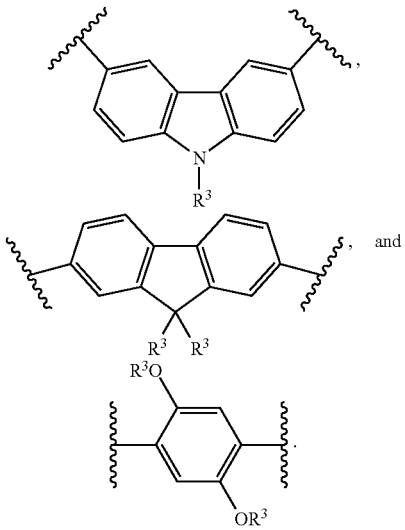

The variable $R^3$ at each occurrence can be independently chosen from octyl, 2-ethylhexyl, 3,7-dimethyloctyl, dodecyl, methyl, and 2-ethylhexyl. The variable $R^1$ can be —$C_6H_{13}$.

In various embodiments, the polymer can have the structure

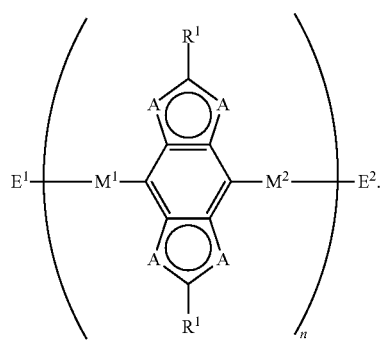

The variable n can be about 2 to 10,000, 2 to 1,000, 2 to 500, 2 to 100, 5 to 75, or about 10 to 50. In some embodiments, n can be about 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 75, 100, 250, 500, 750, or about 1,000. The end groups $E^1$ and $E^2$ can be each independently at each occurrence chosen from substituted or unsubstituted —$R^5$, —H, —OH, —$OR^5$, —$NR^5_2$ and halide. The variable $R^5$ at each occurrence can be independently chosen from —H and substituted or unsubstituted $C_{1-60}$ hydrocarbyl.

In various embodiments, the present invention provides a conjugated polymer having the formula

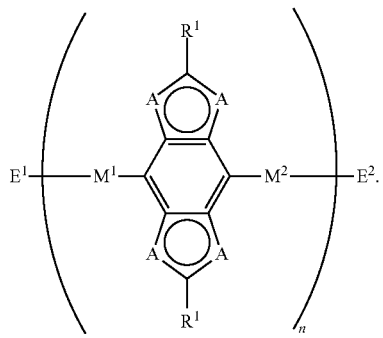

Each A at each occurrence can be independently chosen from N, S, and O. Each 5-membered ring in the fused benzene ring system independently at each occurrence can have one A that is N and one A that is S or O. The variables $M^1$ and $M^2$ can be each independently at each occurrence chosen from a bond and

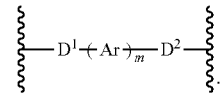

Each of $D^1$ and $D^2$ at each occurrence can be independently chosen from a bond, substituted or unsubstituted ethenylene, and ethynylene. Each m at each occurrence can be 0 to 30. At least one of $M^1$ and $M^2$ can be not a bond. The variable Ar at each occurrence can be independently chosen from

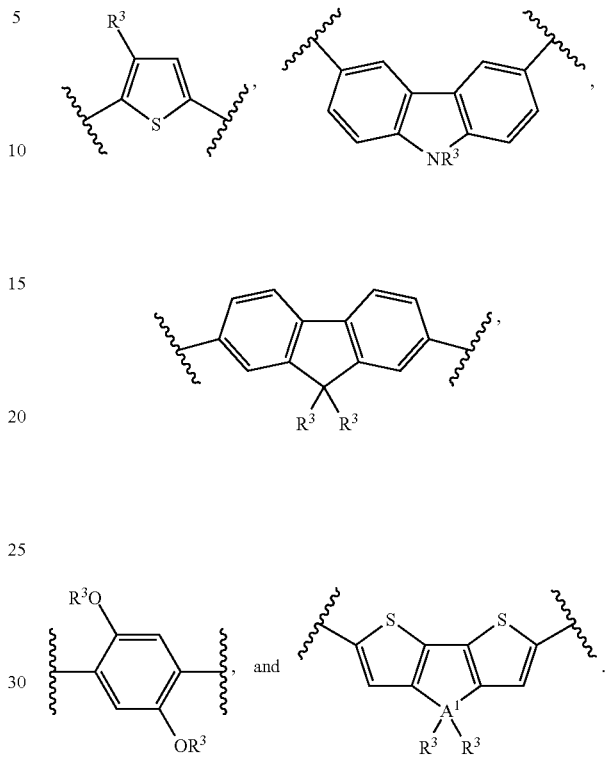

Each $R^3$ at each occurrence can be independently chosen from —H and $C_{1-15}$ hydrocarbyl. The variable n can be about 2 to about 10,000. The variables $E^1$ and $E^2$ can be each independently at each occurrence chosen from substituted or unsubstituted —$R^5$, —H, —OH, —$OR^5$, —$NR^5_2$ and halide. The variable $R^5$ at each occurrence can be independently chosen from —H and substituted or unsubstituted $C_{1-60}$ hydrocarbyl.

In some embodiments, the polymer can have the structure

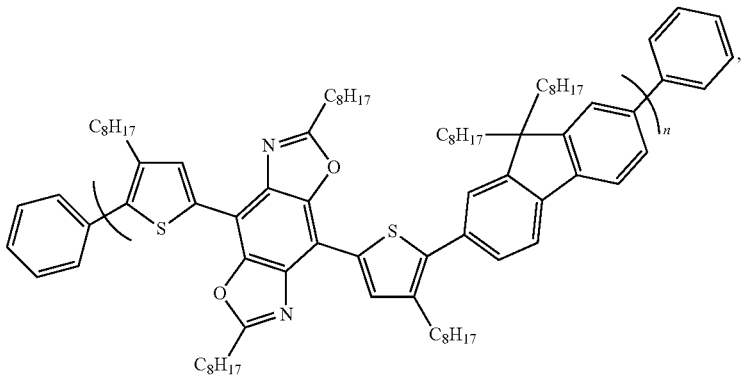

-continued

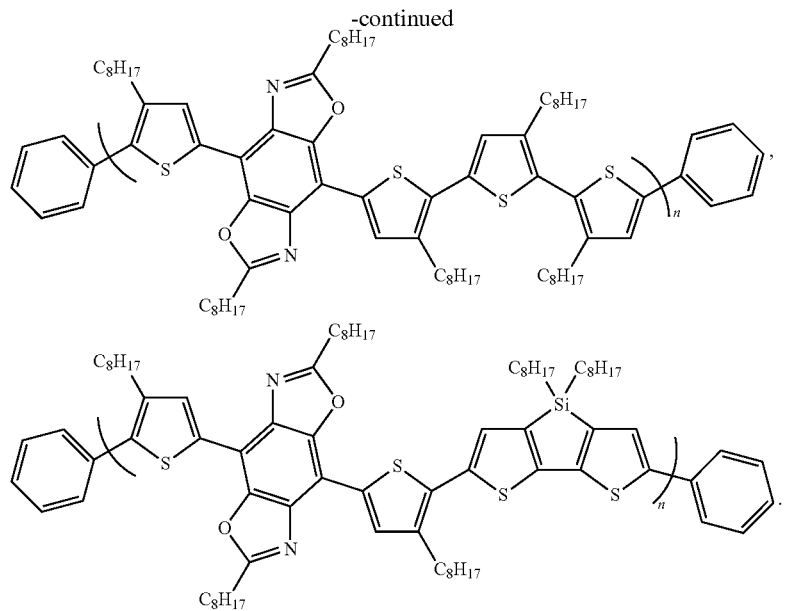

In some embodiments, the polymer can have the structure

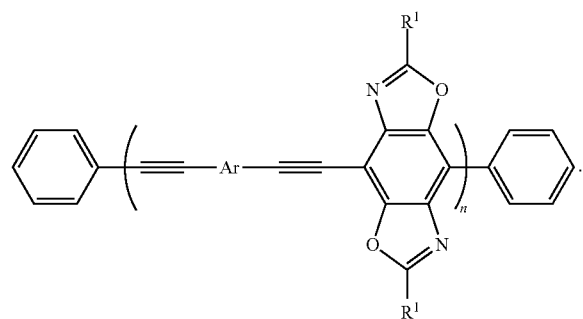

The variable Ar at each occurrence can be independently chosen from

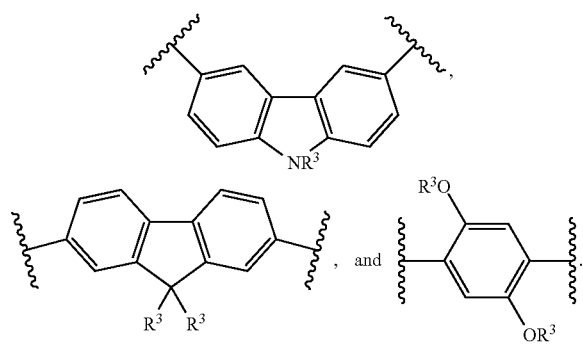

Each $R^3$ at each occurrence can be independently chosen from —H and substituted or unsubstituted $C_{1-60}$ hydrocarbyl. The variable n can be about 2 to about 10,000.

Semiconductor Device.

Various embodiments of the present invention provide a semiconductor device including the polymer of claim 1. The semiconductor device can be any suitable semiconductor device. For example, the semiconductor device can be a transistor (e.g. a field effect transistor), a diode (e.g., a light emitting diode such as an organic light emitting diode), a photovoltaic cell, an integrated circuit, or an optoelectronic device.

In some embodiments, the semiconductor device can be a diode such as a rectifier, a bridge rectifier, a Schottky diode, a hot carrier diode, a Zener diode, a transient voltage suppression diode (TVS), unipolar or bipolar diode, a varactor, a tuning diode, a varicap, a variable capacitance diode, a light-emitting diode (LED), a LASER diode, a photodiode (e.g. an avalanche photodiode, a solar cell, a photovoltaic cell, a photovoltaic array or panel), a DIAC (Diode for Alternating Current), a trigger diode, a constant-current diode, a Peltier cooler.

The transistor can be any suitable transistor. In some embodiments, the semiconductor device can be a transitor such as a bipolar transistor, a field-effect transistor, a thyristor, or a composite transistor. Examples of a bipolar transistor can include a bipolar junction transistor, a Darlington transistor, or a Sziklai pair. Examples of a field-effect transistor can include a JFET (Junction Field-Effect Transistor), a MOSFET (Metal Oxide Semiconductor FET), a MESFET (MEtal Semiconductor FET), and a HEMT (High electron mobility transistor). Examples of a thyristor can include a silicon-controlled rectifier (SCR), a TRIAC (TRIode for Alternating Current), a unijunction transistor (UJT), a programmable unijunction transistor (PUT), a SIT (Static induction transistor), a SITh (Static induction thyristor). Examples of a composite transistor can include an IGBT (insulated-gate bipolar transistor).

The integrated circuit can be any suitable integrated circuit. Examples of integrated circuits can include a digital integrated circuit, or an analog integrated circuit.

The optoelectronic device can be any suitable optoelectronic device. Examples of optoelectronic devices can include an opto-isolator, opto-coupler, or a photo-coupler. For example the optoelectronic device can be a photodiode, BJT, JFET, SCR, TRIAC, zero-crossing TRIAC, open collector IC, CMOS IC, or a solid state relay (SSR). The optoelectronic device can be an optical switch, optical interrupter, photo switch, or photo interrupter. The optoelectronic device can be a LED display, such as a seven-segment display, a sixteen-segment display, or a dot-matrix display.

Method of Making a Conjugated Polymer.

In various embodiments, the present invention provides a method of making a conjugated polymer. The method can be any suitable method that generates at least one polymer described herein.

The method can include obtaining or providing a fused benzene ring system having the structure

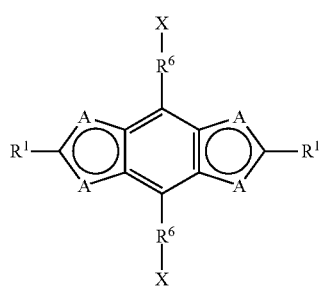

(III)

In structure (III), each A at each occurrence can be independently chosen from N, S, and O. Each 5-membered ring in structure (III) independently at each occurrence can have one A that is N and one A that is S or O. In some examples, the fused benzene ring system can be a benzobisoxazole. Each $R^1$ at each occurrence can be independently chosen from $—R^2$, $—H$, $—OH$, $—OR^2$, $—NR^2_2$ and halide. The variable $R^2$ at each occurrence can be independently chosen from $—H$ and substituted or unsubstituted $C_{1-60}$ hydrocarbyl. The variable X can be a halide, e.g. $—I$, $—Br$, $—Cl$, or $—F$. The variable $R^6$ at each occurrence can be independently a bond or Ar. Each Ar at each occurrence can be independently chosen from substituted or unsubstituted aryl and substituted or unsubstituted heteroaryl.

The method of making a conjugated polymer can also include obtaining or providing a conjugated linker having the structure

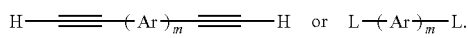

Each L at each occurrence can be $—Sn(R^7)_3$ or $—B(OR^8)_2$. The variable $R^7$ at each occurrence can be independently $C_{1-15}$ hydrocarbyl. The variable $R^8$ can be $C_{1-30}$ hydrocarbyl or together with another $R^8$ can be a $C_{2-30}$ hydrocarbylene that forms a cyclic boronic acid ester structure with the $—B(O—)_2$ (e.g. pinacolboranyl or catecholboranyl). Each m at each occurrence can be 0 to 30.

The method of making a conjugated polymer can also include contacting the fused benzene ring system and the conjugated linker under conditions so as to provide a conjugated polymer having a repeating unit including structure (II)

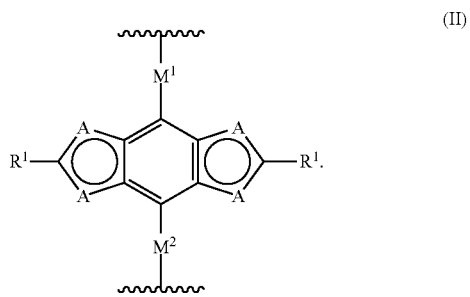

(II)

The conditions can be any suitable conditions, including any suitable concentration of each component of the reaction mixture, any suitable solvent, any suitable heating, stirring, and any suitable additional reagents, so long as the polymer including structure (II) is generated. In some examples, the chemical reaction of the fused benzene ring system and the conjugated linker can be an organometallic-catalyzed coupling reaction, such as a Suzuki reaction, Stille reaction, Sonogashira reaction, or a Heck reaction; in some embodiments, the reaction can be Pd compound-catalyzed.

In structure (II), $M^1$ and $M^2$ can each be independently at each occurrence chosen from a bond and

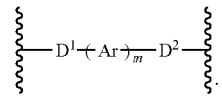

Each of $D^1$ and $D^2$ at each occurrence can be independently chosen from a bond and ethynylene. At least one of $M^1$ and $M^2$ can be not a bond.

In various embodiments, the method can further include contacting the conjugated polymer with E-X or E-Ar-X under conditions so as to provide the conjugated polymer with end groups -E, wherein each end group -E at each occurrence can be substituted or unsubstituted $C_{1-60}$ hydrocarbyl. The conditions can be any suitable conditions, including any suitable concentration of each component of the reaction mixture, any suitable solvent, any suitable heating, stirring, and any suitable additional reagents, so long as the polymer including end groups -E can be generated. The reaction to add the end groups -E can be any suitable reaction. In some embodiments, the reaction can be an organometallic-catalyzed coupling reaction, such as a Suzuki reaction, Stille reaction, Sonogashira reaction, or a Heck reaction; in some embodiments, the reaction can be Pd compound-catalyzed.

EXAMPLES

The present invention can be better understood by reference to the following examples which are offered by way of illustration. The present invention is not limited to the examples given herein.

1. Benzobisoxazole-Based Polymer Guest Emitters in Polymer Light-Emitting Diodes Intemann, J. J. et al., *Macromolecules* 2012 45, 6888-6897 is incorporated herein in its entirety.

Example 1.1

Synthesis and Characterization

The monomer 2,6-dihexyl-4,8-dibromobenzobisoxazole (2) was prepared by the condensation of dibromodiaminohydroquinone (1) with heptanoyl chloride in the presence of poly(trimethylsilylphosphate) (PPSE). The synthetic routes to the monomer (2) and corresponding copolymers are outlined in Scheme 1. The six new copolymers were made via Sonogashira cross-coupling of monomer (2) with the corresponding dialkynyl comonomer using palladium and copper catalysts in a mixture of diisopropylamine and toluene. These conditions yielded polymers in good yields after removal of lower molecular weight material. All of the polymers were soluble in common organic solvents such as chloroform, THF, and chlorobenzene and the $^1$H NMR spectra were in agreement with the proposed structures for each polymer.

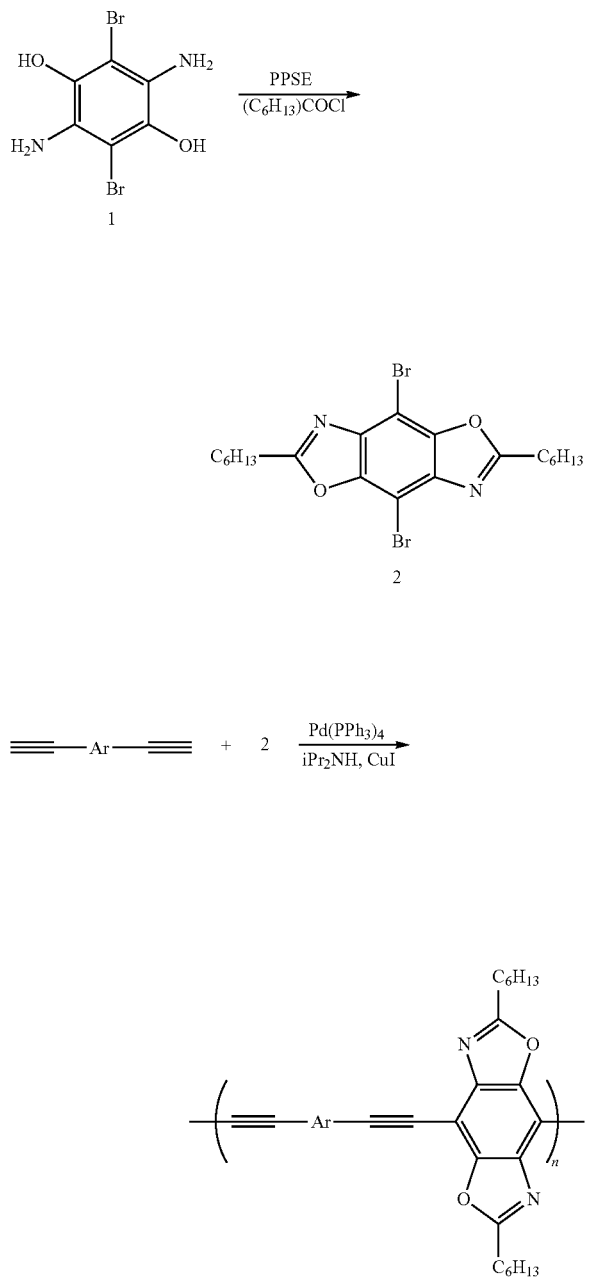

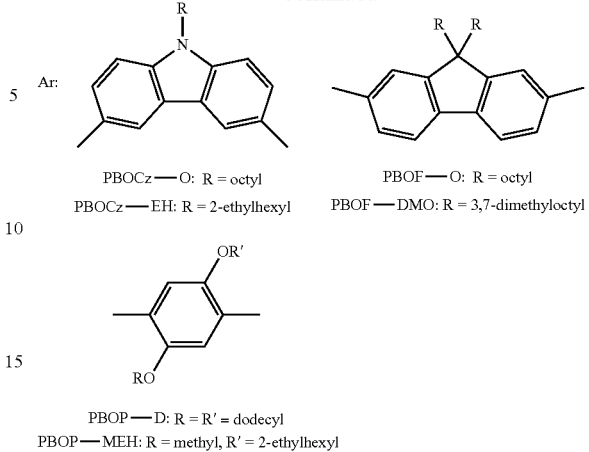

TABLE 1

Physical Properties of Benzobisoxazole Polymers.

| Polymer | Yield [%] | $M_n$ [kDa][a] | $M_w$ [kDa][a] | PDI | $T_d$ [° C.][b] | $T_g$ [° C.][c] |
|---|---|---|---|---|---|---|
| PBOCz-O | 74 | 13.0 | 23.8 | 1.8 | 354 | 139 |
| PBOCz-EH | 95 | 47.9 | 74.9 | 1.6 | 353 | 140 |
| PBOF-O | 73 | 38.2 | 145.0 | 3.8 | 352 | 123 |
| PBOF-DMO | 49 | 51.9 | 188.3 | 3.6 | 298 | 110 |
| PBOP-D | 59 | 33.1 | 45.8 | 1.4 | 320 | n.o. |
| PBOP-MEH | 51 | 26.2 | 87.2 | 3.3 | 310 | n.o. |

[a]Determined by GPC in chloroform using polystyrene standards.
[b]5% weight loss temperature by TGA in air.
[c]Data from second scan reported, heating rate 15° C. min$^{-1}$ under N$_2$.

The molecular weights of the polymers were estimated using gel permeation chromatography measured in chloroform relative to polystyrene standards. The results are summarized in Table 1. Polymers bearing branched side chains were obtained with higher molecular weights than the polymers with linear side chains, reflecting their improved solubilities. The thermal properties of the polymers were evaluated using thermal gravimetric analysis (TGA) and differential scanning calorimetry (DSC). TGA indicates that 5% weight loss onsets occur between 298-354° C. (Table 1), while typical second heating DSC showed glass transition temperatures ($T_g$) for the carbazole and fluorene containing polymers. PBOCz-O and PBOCz-EH displayed endotherms at 139 and 140° C. respectively while PBOF-O and PBOF-DMO had much lower $T_g$s at 123 and 110° C. The lower $T_g$s of the fluorene polymers can be attributed to the sp$^3$ hybridization of the C-9 carbon causing the alkyl chains to point out of the plane of the π-system, further disrupting π-stacking. $T_g$s were not observed for PBOP-D and PBOP-MEH and none of the polymers exhibited endotherms corresponding to melting points. The $T_g$s were all above typical joule heating temperatures seen in electroluminescent devices, which is a necessity in order to obtain stable color emission.

Example 1.2

Optical Properties

Figure 1B:
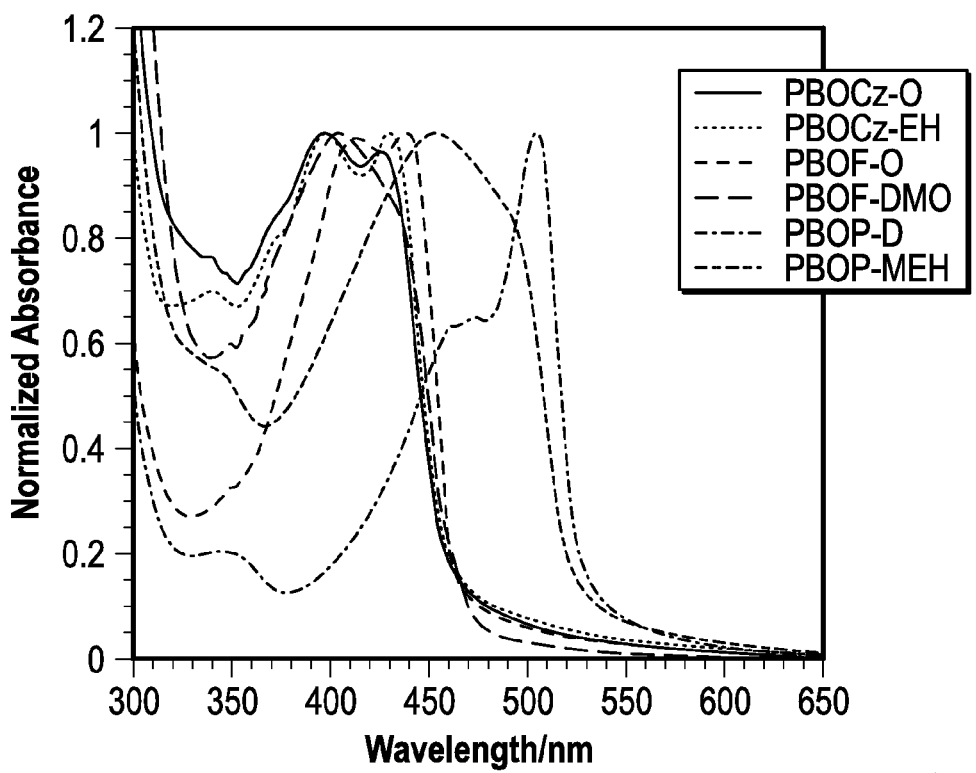

The photophysical characteristics of the polymers both in dilute solutions and thin films were examined using UV-vis absorption and fluorescence spectroscopy. The normalized absorbance spectra of the polymers in solution and films are shown in FIGS. 1a-b and the data is summarized in Table 2.

The absorption profiles of PBOCz-O and PBOCz-EH were virtually identical both in solutions and films, regardless of side chain structure. In solution, these polymers had absorption maxima at 392 and 394 nm respectively, which were the shortest wavelengths of the six polymers. The absorption spectra of the carbazole polymer films showed a bathochromic shift of ~35 nm relative to the solution spectra, which is a consequence of π-stacking between polymers in the solid state. The similarities between the PBOCz-O and PBOCz-EH spectra indicate that the branched side chain does not disrupt π-stacking any more than the linear chain. The carbazole polymers have among the largest optical band gaps among the six polymers, which can be attributed to a decrease in effective conjugation length arising from the 3,6-substitution on the carbazole. This arrangement leads to unfavorable steric interactions by the alkyl chains on flanking BBO units, twisting the polymer backbone.

TABLE 2

Optical and Electronic Properties of Benzobisoxazole Polymers.

| | Solution | | Thin Film | | | | |
|---|---|---|---|---|---|---|---|
| Polymer | $\lambda_{max}^{abs}$ [nm] | $\lambda_{max}^{PL}$ [nm] | $\lambda_{max}^{abs}$ [nm] | $\lambda_{max}^{PL}$ [nm] | $E_g^{opt}$ [eV][a] | EA [eV][b] | IP [eV][c] |
| PBOCz-O | 392 | 440 | 427 | 517 | 2.72 | 2.78 | 5.50 |
| PBOCz-EH | 394 | 439 | 430 | 515 | 2.69 | 2.83 | 5.52 |
| PBOF-O | 433 | 453 | 440 | 495 | 2.72 | 3.19 | 5.91 |
| PBOF-DMO | 399 | 451 | 404 | 466 | 2.76 | 3.12 | 5.88 |
| PBOP-D | 467 | 494 | 505 | 566 | 2.36 | 2.93 | 5.29 |
| PBOP-MEH | 440 | 491 | 454 | 525 | 2.44 | 3.05 | 5.49 |

[a]Optical band gap measured from the onset of absorption in films.
[b]electron affinity calculated from the optical band gap: $EA = IP - E_g^{opt}$.
[c]ionization potential determined by ultraviolet photoelectron spectroscopy.

In contrast to the carbazole polymers, the absorption spectra of the fluorene polymers did vary as a function of alkyl chain substitution. PBOF-O showed absorption maxima of 433 nm in solution and 440 nm as a film, while PBOF-DMO had absorption maxima of 399 nm in solution and 404 nm as a film. The ipsochromic shift seen between the absorptions of PBOF-O and PBOF-DMO in both solution and film may be the result of a larger distribution of highest occupied molecular orbitals (HOMOs) within the PBOF-DMO material. This is further supported be the fact that both PBOF-O and PBOF-DMO have similar band gaps of 2.72 and 2.76 eV. The large bathochromic shift seen between solutions and films of the carbazole polymers are not seen with PBOF-O and PBOF-DMO. Instead they exhibit only a small shift of 7 nm for PBOF-O and 5 nm for PBOF-DMO which may be attributed to decreased excimer formation caused by the sp³ C-9 carbon on the fluorene, which reduces the π-stacking between polymer chains.

The phenylene containing polymers also showed differences in absorption between the straight and branched chain derivatives. PBOP-D absorbed at 467 nm in solution and 505 nm as a film, while PBOP-MEH absorbed at 440 nm in solution and 454 as a film. These are the longest wavelengths of the six polymers, which is a product of the long linear and rigid structure of these polymers combined with the electron donating nature of the comonomer. As with the fluorene polymers, the difference in absorption spectra between PBOP-D and PBOP-MEH is probably the result of a larger HOMO distribution in PBOP-MEH than in PBOP-D. The difference between the absorption maxima in solution and in film is greater in the phenylene polymers than in the fluorene polymers. The larger difference in absorption maxima is a consequence of increased aggregation in PBOP-D. The branched side chain in PBOP-MEH better disrupts aggregation decreasing the red-shift between solution and film. The slight difference in optical band gaps for PBOP-D (2.36 eV) and PBOP-MEH (2.44 eV) may be the result of a slightly shorter effective conjugation length of the branched chain derivative.

Figure 2A:
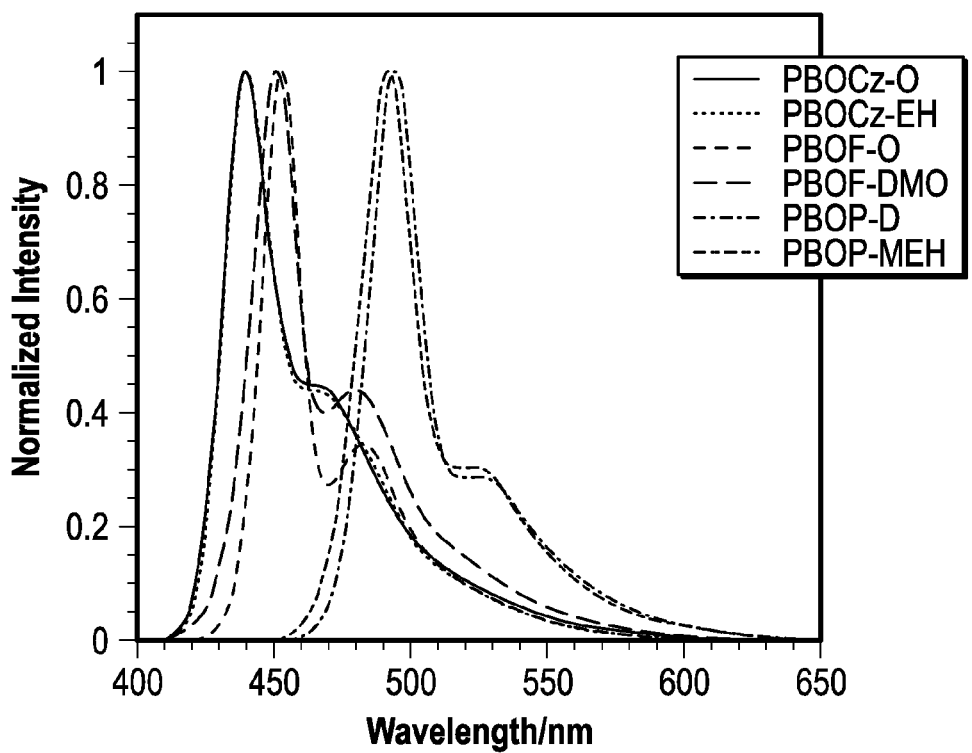
FIGS. 2a-b illustrate photoluminescence spectra of benzobisoxazole polymers a) in chloroform solutions and b) as thin films, in accordance with various embodiments.
Figure 2B:
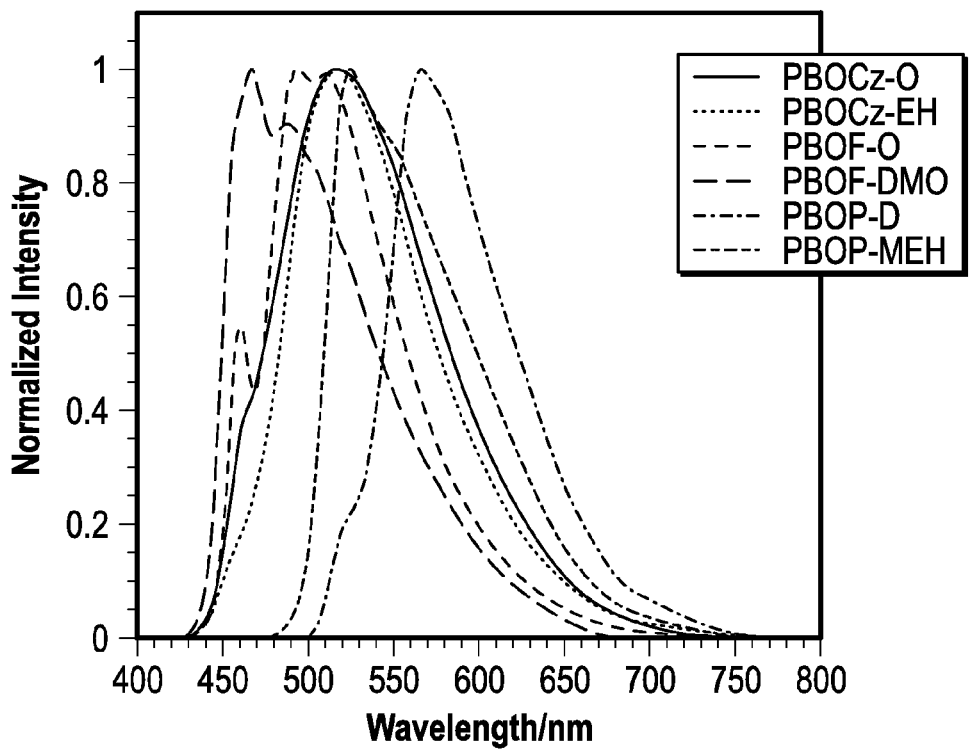

The fluorescence spectra for the polymers in both dilute solutions and as thin films are shown in FIGS. 2a-b. In solution emission is generally independent of side chain substitution. PBOCz-O and PBOCz-EH have the deepest blue emission at 440 and 439 nm while PBOF-O and PBOF-DMO display blue emission at 453 and 451 nm, respectively. PBOP-D and PBOP-MEH fluoresce in the green region of the visible spectrum at 494 and 491 nm in solution.

The PL of the polymers in thin films shows broadening of the emission peaks accompanied by bathochromic shifts of varying degrees. The carbazole polymers both redshift ~76 nm, again indicating that alkyl substitution has little impact on the electronic properties of the carbazole polymers, even in thin films. The fluorene and phenylene polymers exhibit a strong dependence of the emission wavelength on alkyl chain substitution as the polymers with branched side chains are shifted more to the blue end of the spectrum in comparison to polymers with linear side chains. The emission profile of PBOF-DMO peaks at 466 nm. A peak is seen at the same wavelength in the spectrum of PBOF-O, though it is far less intense. Although PBOF-O and PBOF-DMO seem to have similar fluorescent transitions, the relative intensities of the transitions are different, resulting in a deeper blue emission from PBOF-DMO. As a film, PBOP-MEH shows a bathochromic shift of 34 nm between solution and film, giving yellow emission at 525 nm. The film emission of PBOP-D shows an even greater bathochromic shift of 72 nm causing orange emission at 566 nm. The red-shifted emission of PBOP-D relative to PBOP-MEH is the result of increased π-stacking of the polymer.

Example 1.3

Ultraviolet Photoelectron Spectroscopy

The ionization potentials of the polymers were measured using ultraviolet photoelectron spectroscopy. This technique determines the HOMO energy level in organic thin films by bombarding the sample with UV photons and measuring the kinetic energies of the ejected valence electrons. Thus, the HOMO values obtained by this technique are very precise as opposed to the more commonly used technique of cyclic voltammetry, which requires the use of approximations and has a high degree of error associated with the measurements (>0.1 eV). The electron affinities (EAs) were calculated from the measured IPs using the optical band gap. These values are summarized in Table 2.

The fluorene polymers were the most electron deficient with EAs of 3.19 and 3.12 eV for PBOF-O and PBOF-DMO, respectively. The phenylene polymers were slightly more electron rich with EAs of 2.93 and 3.05 eV for PBOP-D and PBOP-MEH, respectively. The carbazoles had the lowest EAs at 2.78 and 2.83 eV for PBOCz-O and PBOCz-EH. The side chain substitution had an impact on the IPs of the phenylene polymers, which may be a consequence of the a-symmetry of the phenylene unit in PBOP-MEH and the regiorandom nature of the polymer. Due to the random position of its side chains, PBOP-MEH cannot pack as efficiently as PBOP-D and is less planar in films resulting in a shorter effective conjugation length and an increased IP.

TABLE 3

Photoluminescence Lifetimes and Quantum Yields.

| Polymer | τ [ns] in CHCl$_3$$^a$ | τ [ns] as Film$^a$ | $\Phi_{re}^b$ |
|---|---|---|---|
| PBOCz-O | 1.00 | 0.46 | 0.33 |
| PBOCz-EH | 1.00 | 0.45 | 0.43 |
| PBOF-O | 0.49 | 0.36 | 0.68 |
| PBOF-DMO | 0.43 | 0.24 | 0.35 |
| PBOP-D | 0.59 | 0.17 | 0.57 |
| PBOP-MEH | 0.63 | 0.32 | 0.47 |

$^a$Average PL lifetime.
$^b$PL Quantum yields measured in dilute chloroform solutions relative to Coumarin 152.

Example 1.4

PL Lifetimes and Quantum Yields

To explore the excited state characteristics of the polymers the PL lifetimes were measured both in dilute chloroform solutions and as neat films, the results of which are summarized in Table 3. Fairly short lifetimes were observed in the range of 0.43 to 1.00 ns in dilute solutions of chloroform. PL lifetimes were considerably shorter (0.17-0.46 ns) in the thin films of the polymers. This is likely the result of exciplex formation in polymer aggregates fostering non-radiative decay pathways for excitons. The solution PL lifetimes for PBOF-O (0.49 ns) and PBOF-DMO (0.43 ns) are virtually identical to the previously reported values for the related poly[(9,9-dioctylfluorene-2,7-vinylene)-alt-benzo[1,2-d;4,5-d']bisoxazole-2,6-diyl](PFVBBO-O) and poly[(9,9-bis(3,7-dimethyloctyl)fluorene-2,7-vinylene)-alt-benzo[1,2-d;4,5-d']bisoxazole-2,6-diyl](PFVBBO-DMO) which are 0.51 and 0.43 ns respectively in solution. The film measurements in PBOF-O and PBOF-DMO do show a small increase in PL lifetimes relative to PFVBBO-O and PFVBBO-DMO that is likely the result of the BBO alkyl chains, which are not present in the previously reported PBOs, disrupting π-stacking and decreasing non-radiative decay pathways. Though it is a small sample size to draw from and the structures are not completely analogous (vinylene instead of ethynylene), the similar solution PL lifetimes suggest that changing the polymerization substitution on the BBO from the 2,6-position to the 4,8-position does not have an appreciable impact on PL lifetime.

The quantum yields of the polymers in dilute solutions of chloroform were taken relative to Coumarin 152, the results of which are listed in Table 3. PBOF-O and PBOP-D had the highest quantum yields at 0.68 and 0.57, respectively. The branched alkyl derivatives PBOF-DMO and PBOP-MEH had lower quantum yields (0.35 and 0.47 respectively) than their linear chain counterparts despite having similar PL lifetimes. A drop off in quantum yield, however, is expected to a certain degree as the branching of the side chains introduces additional degrees of freedom resulting in added non-radiative decay pathways. Overall, the carbazole polymers PBOCz-O and PBOCz-EH have lower quantum yields than the fluorene and phenylene polymers. This can be attributed to the twisted backbone of the carbazole polymers resulting in a less rigid polymer that can vibrationally relax more effectively.

Example 1.5

Electroluminescent Devices

Figure 3:
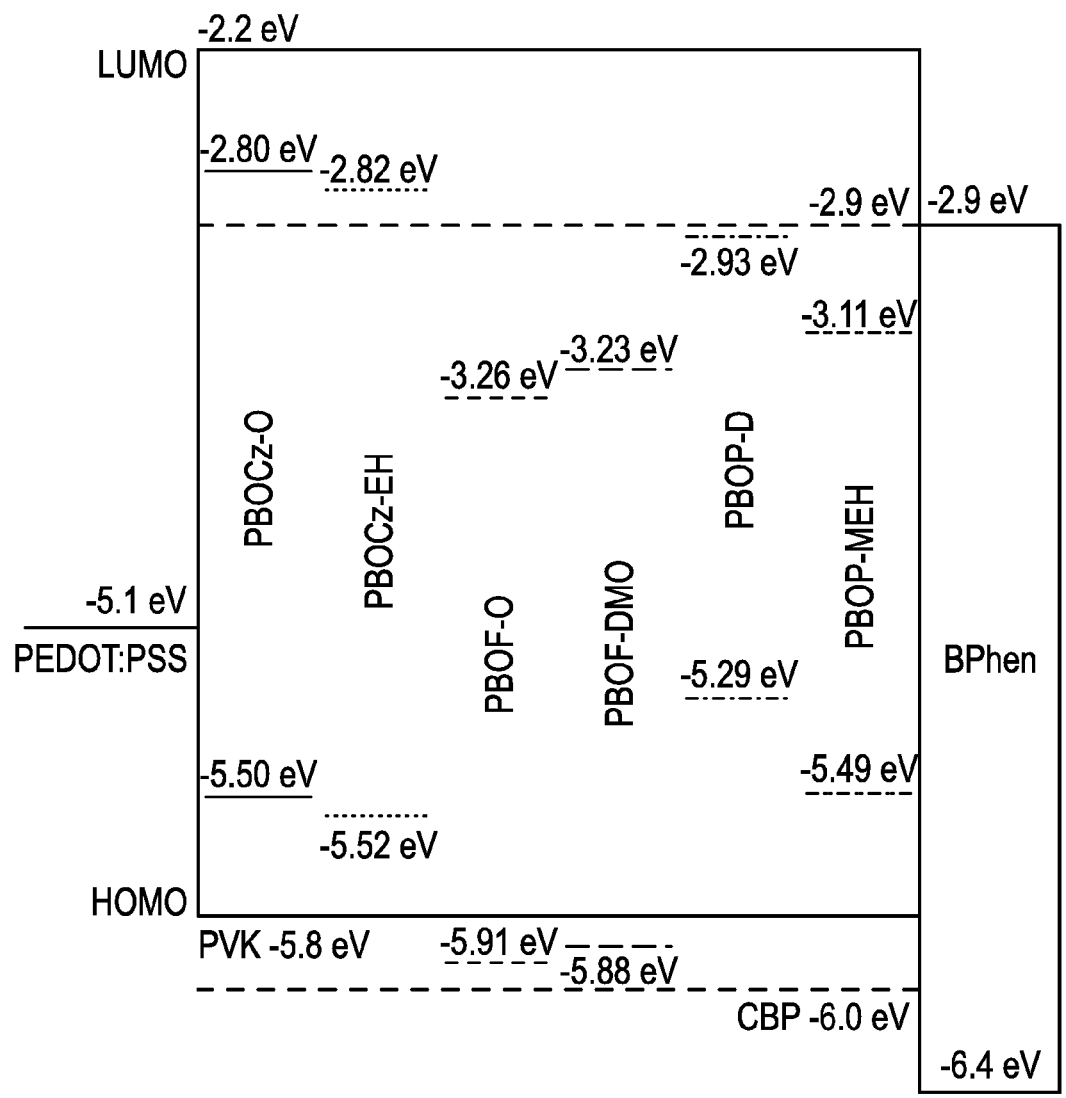
FIG. 3 illustrates energy level diagram of the materials used in the guest-host OLEDs, in accordance with various embodiments.

The polymers were first evaluated as neat emissive layers in PLEDs, however, these devices either did not emit light or failed to provide a useful brightness (<100 Cd m$^{-2}$) due to strong concentration quenching in the neat film. Guest-host PLEDs were then fabricated using the polymers as low level dopants in PVK. A device architecture of ITO/PEDOT:PSS/Host:Guest/BPhen/LiF/Al was adopted where PEDOT:PSS (poly(3,4-ethylenedioxy thiophene):poly(4-styrenesulfonate)) is a hole transporting layer and BPhen (4,7-diphenyl-1,10-phenanthroline) is a hole blocking/electron transporting layer, which also prevents exciton quenching at the metal cathode. There was concern that the low lying HOMOs of PBOF-O and PBOF-DMO relative to the HOMO of PVK, would prevent hole trapping on the guest while allowing efficient electron trapping on the it. This would inhibit FRET between the host and guest and could lead to lower energy exciplex formation between the host and guest, decreasing device performance. To improve hole trapping on the guest, OLEDs using PBOF-O and PBOF-DMO were also made using a 4,4'-bis(N-carbazolyl)-1,1'-biphenyl (CBP) host, which has a lower lying HOMO than PVK and has recently been shown to produce spin-coated devices with high efficiencies. To evaluate whether any improvements in PBOF-O or PBOF-DMO device performance were the result of improved hole trapping on the guest, PBOP-D was also made into a device with a CBP host in addition to a PVK based device. The energy level diagram in FIG. 3 illustrates the various energy levels of the different devices materials. All the devices were optimized by varying the weight percent of the guest in the host material using 0.5, 1.0, 2.0, and 4.0 weight percent (wt %) of guest polymer in the PVK or CBP hosts. The device characteristics are summarized in Table 4.

Figure 4:
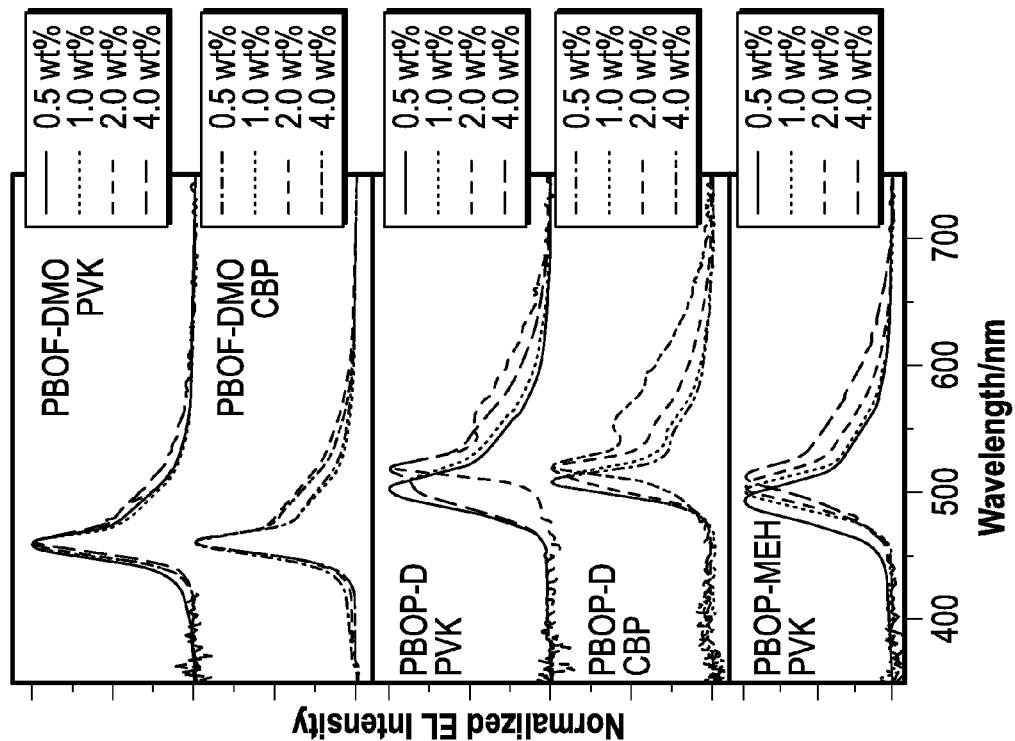
FIG. 4 illustrates normalized electroluminescent spectra of devices with different weight % concentrations of the benzobisoxazole polymers in CBP or PVK, in accordance with various embodiments.
Figure 4:
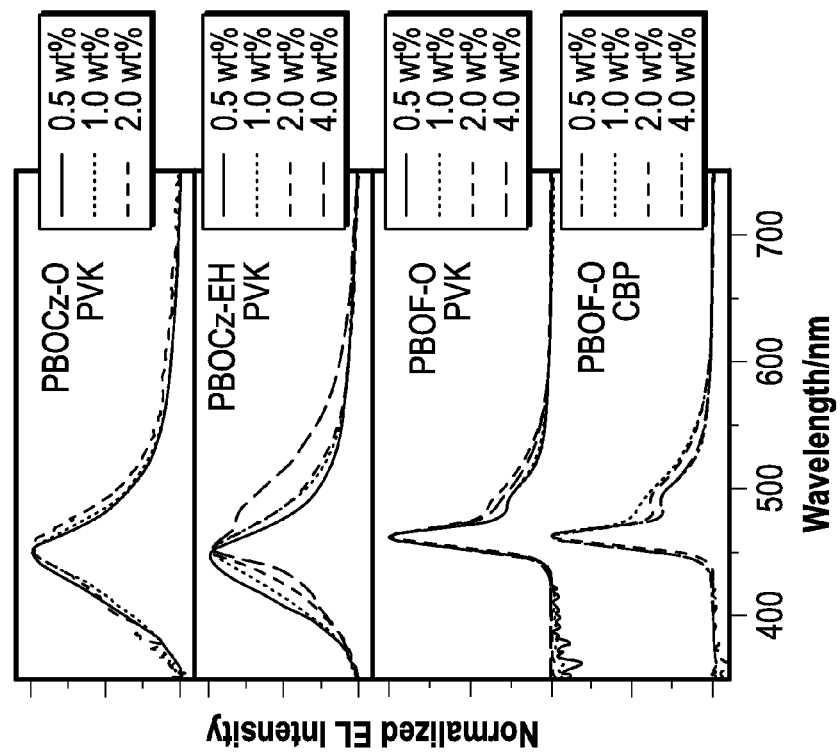

The carbazole polymers provided the deepest blue OLEDs but gave the poorest overall performance. Of the PBOCz-O-based devices, 1 wt % PBOCz-O in PVK gave the best performance but with a maximum brightness of only 210 Cd m$^{-2}$ and a maximum luminous efficiency of 0.72 Cd A$^{-1}$. The PBOCz-EH devices were slightly brighter but had worse efficiencies with the best results obtained from 1 wt % PBOCz-EH in PVK, giving a maximum brightness of 330 Cd m$^{-2}$ and a maximum luminous efficiency of 0.59 Cd A$^{-1}$. The poor efficiencies of the carbazole polymer-containing devices is a consequence of the low quantum yields in the polymers which results in energy loss to heat. As seen from the EL spectra (FIG. 4, Devices using a CBP host are off-set vertically from the devices using a PVK host), devices based on the carbazole polymers display a broad emission between ~400-500 nm with EL maxima in the range of 452-462 nm. The PBOCz-O devices also show little variation in their emission profile as the concentration of the guest is increased.

TABLE 4

Device Characteristics of OLEDs Based on Benzobisoxazole Polymers.

| Device[a] | | | Drive | Current | | Efficiency[f] [Cd A$^{-1}$, | $\lambda_{max}$ | |
|---|---|---|---|---|---|---|---|---|
| Polymer/ Host | Wt [%] | $V_{on}$[b] [V] | voltage[c] [V] | Density[d] [mA cm$^{-2}$] | Brightness[e] [Cd m$^{-2}$] | % EQE [g], lm W$^{-1}$] | EL [nm] | CIE 1931 (x, y) |
| PBOCz-O PVK | 0.5 | 5.2 | 9.4 | 250 | 210 | 0.50, 0.48, | 449 | (0.17, 0.11) |
| | 1.0 | 5.2 | 9.8 | 260 | 210 | 0.72, 0.68, | 451 | (0.17, 0.12) |
| | 2.0 | 6.6 | 10.8 | 100 | 190 | 0.50, 0.57, | 449 | (0.18, 0.14) |
| | 4.0 | 5.8 | 8.8 | 50 | 44 | 0.18, —, | — | — |
| PBOCz-EH PVK | 0.5 | 6.0 | 10.8 | 380 | 310 | 0.53, 0.58, | 446 | (0.17, 0.10) |
| | 1.0 | 5.2 | 9.2 | 340 | 330 | 0.59, 0.51, | 451 | (0.17, 0.12) |
| | 2.0 | 5.0 | 9.6 | 300 | 330 | 0.53, 0.46, | 452 | (0.17, 0.12) |
| | 4.0 | 6.0 | 10.8 | 230 | 310 | 0.63, 0.40, | 452 | (0.18, 0.21) |
| PBOF-O PVK | 0.5 | 5.0 | 10.8 | 370 | 840 | 1.7, 1.10, 0.86 | 462 | (0.14, 0.12) |
| | 1.0 | 5.4 | 11.6 | 430 | 1250 | 1.7, 1.20, 0.72 | 462 | (0.14, 0.13) |
| | 2.0 | 5.2 | 11.4 | 510 | 960 | 1.1, 0.92, 0.47 | 462 | (0.15, 0.17) |
| | 4.0 | 6.0 | 10.8 | 850 | 510 | 0.07, 0.05, | 462 | (0.15, 0.15) |
| PBOF-O CBP | 0.5 | 5.4 | 10.2 | 500 | 2010 | 2.5, 1.9, 1.1 | 462 | (0.14, 0.14) |
| | 1.0 | 4.4 | 10.2 | 570 | 1720 | 3.4, 2.4, 1.7 | 463 | (0.14, 0.16) |
| | 2.0 | 4.4 | 10.2 | 760 | 1300 | 1.5, 0.80, 0.76 | 463 | (0.16, 0.21) |
| | 4.0 | 3.6 | 10.4 | 610 | 2020 | 0.86, 0.53, | 463 | (0.15, 0.19) |
| PBOF-DMO PVK | 0.5 | 5.6 | 8.8 | 150 | 570 | 1.2, 1.2, 0.57 | 458 | (0.15, 0.11) |
| | 1.0 | 6.0 | 9.2 | 150 | 660 | 1.2, 1.1, 0.49 | 458 | (0.15, 0.11) |
| | 2.0 | 6.5 | 9.6 | 74 | 230 | 0.56, 0.59, | 459 | (0.15, 0.09) |
| | 4.0 | 8.0 | 11.0 | 30 | 58 | 0.22, 0.14, | 460 | (0.16, 0.16) |
| PBOF-DMO CBP | 0.5 | 4.9 | 8.2 | 320 | 1860 | 1.6, 1.5, 0.77 | 458 | (0.15, 0.12) |
| | 1.0 | 5.4 | 9.0 | 440 | 2020 | 1.2, 1.1, 0.51 | 459 | (0.15, 0.11) |
| | 2.0 | 4.8 | 8.8 | 470 | 670 | 0.35, 0.24, | 459 | (0.17, 0.19) |
| | 4.0 | 4.8 | 10.2 | 390 | 750 | 0.19, 0.12, | 460 | (0.16, 0.17) |
| PBOP-D PVK | 0.5 | 4.0 | 10.0 | 280 | 1150 | 3.1, 1.1, 1.6 | 501 | (0.18, 0.50) |
| | 1.0 | 4.4 | 10.6 | 300 | 890 | 2.4, 0.88, 1.2 | 500 | (0.21, 0.51) |
| | 2.0 | 4.7 | 10.0 | 540 | 710 | 0.25, 0.07, | 519 | (0.35, 0.61) |
| | 4.0 | 4.3 | 10.4 | 560 | 860 | 0.81, 0.28, | 517 | (0.25, 0.54) |
| PBOP-D CBP | 0.5 | 5.2 | 9.0 | 230 | 1620 | 5.7, 2.1, 2.8 | 506 | (0.20, 0.55) |
| | 1.0 | 5.3 | 10.2 | 630 | 3380 | 4.3, 1.3, 1.8 | 507 | (0.22, 0.62) |
| | 2.0 | 4.6 | 10.2 | 660 | 2360 | 1.5, 0.49, 0.63 | 517 | (0.26, 0.60) |
| | 4.0 | 3.1 | 6.8 | 470 | 1460 | 0.51, 0.16, | 519 | (0.35, 0.56) |
| PBOP-MEH PVK | 0.5 | 5.4 | 8.6 | 240 | 1380 | 2.3, 1.1, 1.1 | 491 | (0.16, 0.36) |
| | 1.0 | 5.5 | 9.6 | 280 | 1300 | 1.9, 0.73, 0.86 | 500 | (0.17, 0.49) |
| | 2.0 | 6.0 | 9.4 | 500 | 1340 | 0.40, 0.14, | 502 | (0.21, 0.53) |
| | 4.0 | 6.0 | 9.6 | 480 | 910 | 0.28, 0.09, | 511 | (0.27, 0.54) |

[a]Device architecture: ITO/PEDOT:PSS/Host:Polymer/BPhen/LiF/Al. Wt % is the weight percent of the polymer in the host.
[b]Turn-on voltage, voltage applied to produce 1 Cd m$^{-2}$ brightness.
[c]Voltage at peak brightness.
[d]Current density at peak brightness.
[e]Peak brightness.
[f]Peak efficiencies.
[g]EQE = external quantum efficiency.

The EL maximum for PBOCz-EH does not change noticeably as the guest concentration increases but the band narrows and a shoulder at ~480 nm appears for 4 wt % of the guest. This narrowing of the EL emission is the result of a decreased emission in the ~400-430 nm range and while this may be a decrease in the host emission (PVK emits at ~410 nm) as the guest concentration increases, the change in the emission is small and is not seen in the PBOCz-O containing devices. This suggests the change in emission is due to aggregation of the polymers in the host with the increased aggregation caused by the much higher molecular weight of PBOCz-EH relative to PBOCz-O.

Figure 5:
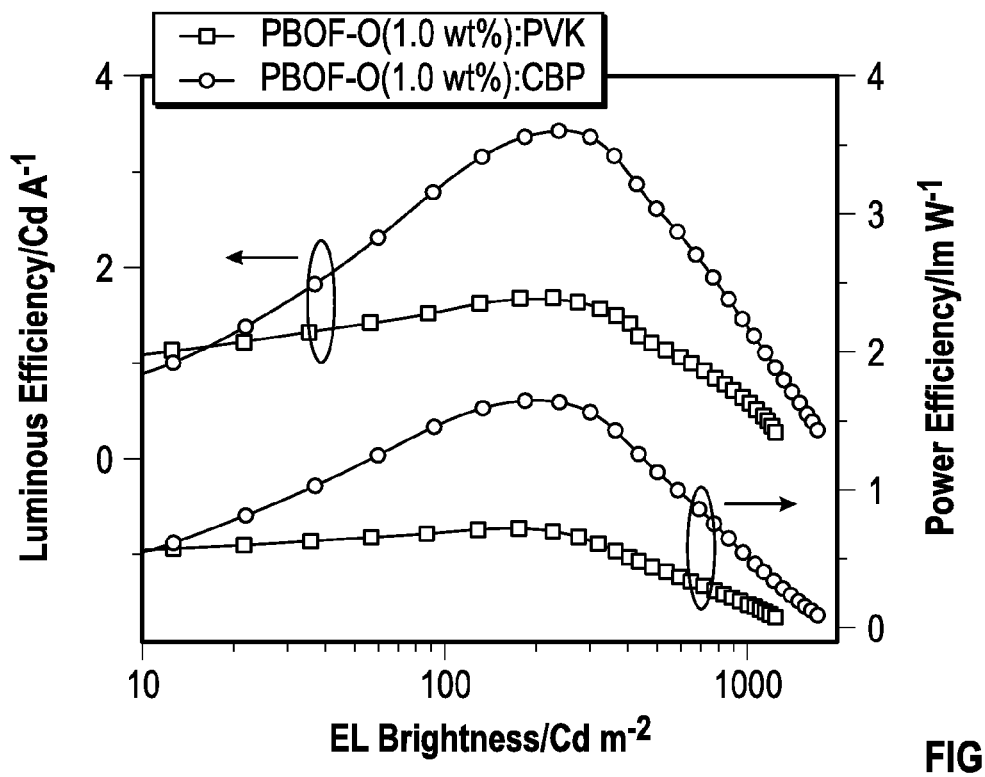
FIG. 5 illustrates luminous and power efficiency as a function of OLED brightness for devices using PBOF-O in a PVK or CBP host, in accordance with various embodiments.

Devices based on the fluorene polymers also gave stable blue emission with the best device performance resulting from 1 wt % of PBOF-O in the CBP host. This gave a maximum brightness of 1720 Cd m$^{-2}$ with a maximum luminous efficiency of 3.4 Cd A$^{-1}$ at an emission wavelength of 463 nm. The efficiency for both this device and the identical PVK based device as a function of brightness is shown in FIG. 5. There is a large improvement in device efficiency when CBP is used as the host instead of PVK. PVK may decrease hole trapping in the guest resulting from the fluorene polymer's lower HOMO relative to PVK. The large increase in efficiency in CBP based devices may be indicative of improved hole trapping on the guest, though the increased efficiencies may also be attributed to the higher EA and extended conjugation of CBP compared to PVK, which yields a lower electron injection barrier and increased charge carrier mobilities. This is reflected in the generally lower turn on voltages of the CBP-based devices. Additionally, it has been shown that replacing PVK with CBP in spin-coated small molecule guest-host OLEDs results in smoother films with less phase separation, therefore CBP may be providing better film morphologies, resulting in higher efficiencies. The values from the PBOF-O/CBP containing devices in fact, represent the highest efficiencies for a blue emitting benzobisoxazole-based OLED to date.

The PBOF-DMO devices did not perform as well with the best device made with 0.5 wt % polymer in CBP. This device displayed a brightness of 1860 Cd m$^{-2}$ with a luminous efficiency of 1.6 Cd A$^{-1}$. The improvement in efficiency between PVK and CBP is also seen in the devices containing PBOF-DMO, though the improvement is not as substantial. OLEDs made with PBOF-O generally had higher efficiencies and brightness than PBOF-DMO-containing devices, a consequence of PBOF-DMO's reduced quantum yield relative to PBOF-O. The EL spectra for the fluorene polymer based devices showed only guest emission with no contribution from the host. Both PBOF-O and PBOF-DMO displayed emission bands at 463 and 459 nm, respectively. These bands were extremely narrow with full widths at half maxima (FWHM) of ~22 nm. A weak peak at ~490 nm is also seen making the EL spectra virtually identical to the solution PL spectra of the polymers. This suggests that the fluorene polymers are not aggregating, even at higher concentrations, within the host matrix.

Figure 6:
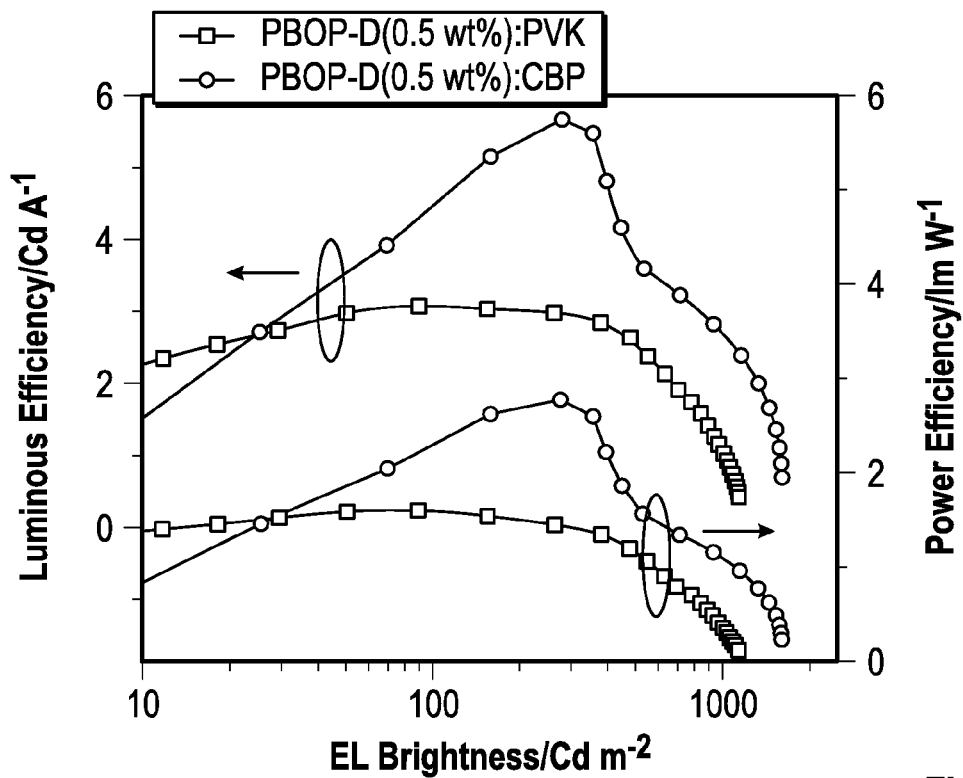
FIG. 6 illustrates luminous and power efficiency as a function of OLED brightness for devices using PBOP-D in a PVK or CBP host, in accordance with various embodiments.

Devices made from the phenylene polymers gave green emission with the best PBOP-D device made from 0.5 wt % in CBP displaying a maximum brightness of 1620 Cd m$^{-2}$ and a maximum efficiency of 5.7 Cd A$^{-1}$. This represents the highest efficiency to date for any OLED using a PBO irrespective of the BBO isomer or emission color. The efficiency as a function of brightness is plotted for both this device and the identical PVK device in FIG. 6. It shows that just as with the PBOF-O and PBOF-DMO devices, there is a large increase in efficiency for the CBP based devices compared to the PVK based devices. Because PBOP-D should efficiently trap holes and electrons in PVK, these results show that the improvement in device efficiencies is not simply related the guest's ability to trap charge carriers but also the result of differences in the electronic characteristics of PVK and CBP. Devices made from PBOP-MEH did not perform quite as well as PBOP-D, though the difference in efficiencies between them was not as extreme as the difference in the fluorene polymer based devices. The best PBOP-MEH containing OLED was made with 0.5 wt % guest in PVK and exhibited a maximum brightness of 1380 Cd m$^{-2}$ with a maximum luminous efficiency of 2.3 Cd A$^{-1}$. The lower efficiencies of the PBOP-MEH devices relative to the PBOP-D devices are likely the consequence of PBOP-MEH's lower quantum yield. The EL spectra for the phenylene polymers are much broader than the fluorene polymer's with emission coming exclusively from the guest. The EL emission maxima are also heavily dependent on guest concentration, with an increasing red-shift seen as the guest concentration is increased. This EL dependence on concentration is the result of efficient π-stacking by the guest in the host material likely leading to excimer formation, which is not surprising given the flat rigid nature of the phenylene polymer's structure.

The most surprising aspect of these devices is the efficient FRET from host to guest, which resulted in no observable host emission. PBOs used as guests in PVK have shown poor guest emission with host emission dominating the EL spectrum. In a device made with 1 wt % PFVBBO-O, emission from the PVK was four times more intense than emission from the guest. PFTBBO has showed an intensity ratio of host emission to guest emission of 4:3 for 1 wt % guest in a PVK host with similar device architecture. The rate of energy transfer is generally dependent on the overlap of the host emission spectrum and the guest absorption spectrum. The carbazole and fluorene polymers do have slightly better spectral overlap with PVK than the previously reported materials, which would lead to the conclusion that the wider bandgap of these materials lead to the improved energy transfer. But the phenylene polymers have worse spectral overlap than PFVBBO and PFTBBO yet do not show any of the problems with FRET between host and guest and in fact have improved efficiencies in PVK-based devices despite this disadvantage in overlap. This suggests that the improved FRET is not from increased spectral overlap, but is the result of other factors. By changing the orientation of the BBO moiety within the conjugated structure of the polymer, so that the electron withdrawing oxazole rings are now perpendicular to the backbone, a change in the excited state dipole of the polymer may occur. This change in the dipole leads to increased coupling between the host and guest excited state dipoles, improving the FRET between host and guest.

Example 1.6

Summary

Six new PBOs containing N-alkylcarbazole, 9,9-dialkylfluorene, and 2,5-dialkoxybenzene were synthesized with high molecular weights, high electron affinities, and in good yields. These polymers differed from previously reported PBOs in that the conjugation pathway was directly through the central benzene ring instead of through the oxazole rings. The electroluminescent properties of OLEDs with these materials as guests in PVK or CBP were studied in guest-host structures and the devices exhibited substantially higher brightness and efficiencies than any previously reported PBO-containing OLED. The higher efficiencies may be due to improved FRET between the host and guest, which may be a result of changing the orientation of the BBO moiety within the polymer backbone so that the oxazole rings are perpendicular to the conjugated backbone.

2. Experimental Methods for Example 1

Materials. 3,6-diethynyl-N-octylcarbazole, 3,6-diethynyl-N-(2-ethylhexyl)carbazole, 2,7-diethynyl-9,9-dioctylfluorene, 1,4-diethynyl-2,5-dodecyloxybenzne, 1,4-diethynyl-2-(2-ethylhexyloxy)-5-methoxybenzne, 3,6-diamino-2,5-dibromo-1,4-hydroquinone, and 2,7-dibromo-9,9-bis(3,7-dimethyloctyl)fluorene were prepared according to literature procedures. Tetrahydrofuran and toluene were dried using an Innovative Technologies solvent purification system. Tetrakis (triphenylphosphine)palladium(0) was purchased from Strem Chemicals, Inc. Trimethylactylene was purchased from GFS Chemicals. Spectral grade coumrain-152 was purchased from Exciton. Poly(3,4-ethylenedioxy thiophene): poly(4-styrenesulfonate) (PEDOT:PSS) was purchased from H. C. Starck. All other chemicals were purchased from Sigma-Aldrich and used without further purification.

Example 2.1

Monomer Synthesis 4,8-Dibromo-2,6-dihexylbenzo[1,2-d;4,5-d']bisoxazole (2): A dry 250 mL flask was placed under an argon atmosphere and charged with poly(trimethylsilylphosphate) (16.0 g, 118 mmol) dissolved in dry/degassed o-dichlorobenzene (60 mL). To the solution was added 3,6-diamino-2,5-dibromo-1,4-hydroquinone (1) (5.87 g, 19.7 mmol) and heptanoyl chloride (7.32 g, 49.3 mmol). The mixture was heated to 90° C. and stirred for 96 hours under argon. It was then cooled to room temperature and poured into 300 mL of methanol and cooled to −40° C. The precipitated product is filtered and washed with methanol. The crude product was then recrystallized from hexanes by dissolving the solid in boiling hexanes and hot filtering the solution before allowing it to recrystallize to afford an off-white solid (6.03 g, 63% yield). mp 108-110° C.; $^1$H NMR (400 MHz, CDCl$_3$, δ): 0.89 (t, J=8 Hz, 6H), 1.31-1.39 (m, 8H), 1.45 (m, 4H), 1.93 (quintet, J=8 Hz, 4H), 3.01 (t, J=8 Hz, 4H); $^{13}$C NMR (400 MHz, CDCl$_3$, δ): 22.7, 27.1, 29.1, 29.2, 31.5, 91.4, 138.5, 146.6, 169.4; HRMS (ESI, m/z): [M+H]$^+$ Calcd for $C_{20}H_{27}Br_2N_2O_2$, 485.0434. found, 485.0445.

2,7-bis(trimethylsilylethynyl)-9,9-bis(3,7-dimethyloctyl) fluorine A flame-dried 250 mL flask was charged with 2,7-dibromo-9,9-bis(3,7-dimethyloctyl)fluorene (6.05 g, 10 mmol), N,N-diisopropylamine (14.2 mL, 100 mmol), and triphenylphosphine (131.5 mg, 0.5 mmol) dissolved in THF (75 mL). The mixture was then degassed by bubbling argon through it for 30 minutes followed by addition of trimethylsilylacetylene (2.95 g, 30 mmol) and an additional 5 minutes of degassing. Tetrakis(triphenylphosphine)palladium(0) (351 mg, 5 mol %) and copper iodide (95.2 mg, 5 mol %) was then added and the reaction was refluxed under argon for 2 days. The mixture was then cooled to room temperature and filtered. The filtrate was diluted with saturated aqueous ammonium chloride solution (100 mL) and extracted with ether (3×75 mL). The organic extracts were combined and washed with water and brine before drying it over magnesium sulfate and then concentrated under reduced pressure. The crude residue was then purified using silica gel column chromatography with a eluent gradient starting with hexane and going to 5:1 hexane:chloroform. Evaporation of the solvent gave a yellow oil (5.56 g, 87% yield). $^1$H NMR (400 MHz, CDCl$_3$, δ): 0.28 (s, 18H), 0.40 (m, J=6 Hz, 2H), 0.50 (m, J=6 Hz, 2H), 0.68 (d, J=6 Hz, 6H), 0.82 (d, J=7 Hz, 12H), 0.89 (m, 2H), 0.95-1.16 (m, 12H), 1.44 (m, J=6 Hz, 2H), 1.94 (m, 4H), 7.40 (s, 2H), 7.45 (d of d, $^3$J=8 Hz, $^4$J=1 Hz, 2H), 7.59 (d, J=8 Hz, 2H); $^{13}$C NMR (400 MHz, CDCl$_3$, δ): 0.3, 19.7, 22.8, 22.9, 24.7, 28.1, 30.5, 33.1, 36.7, 37.8, 39.4, 55.3, 94.4, 106.3, 120.0, 122.0, 126.3, 131.5, 141.1, 151.1; HRMS (ESI, m/z): [M+H]$^+$ Calcd for $C_{43}H_{67}Si_2$, 639.4776. found, 639.4772.

2,7-diethyny)-9,9-(3,7-dimethyloctyl)fluorine: A 250 mL flask was charged with 2,7-bis(trimethylsilylethynyl)-9,9-(3,7-dimethyloctyl)fluorene (5.21 g, 8.15 mmol) and potassium carbonate (1.69 g, 12 mmol) dissolved in methanol (57 mL) and THF (11 mL). The mixture was then stirred overnight and then poured into water and extracted with ether (3×75 mL). The organic extracts were combined, washed with brine, dried over magnesium sulfate, and solvent evaporated under reduced pressure. The crude residue was purified using silica gel column chromatography with 10:1 hexane:dichloromethane as eluent. Evaporation of the solvent under reduced pressure yielded a yellow oil (3.45 g, 86% yield). $^1$H NMR (400 MHz, CDCl$_3$, δ): 0.42 (m, J=6 Hz, 2H), 0.54 (m, J=6 Hz, 2H), 0.68 (d, J=6 Hz, 6H), 0.81 (d, J=7 Hz, 12H), 0.88 (m, 2H), 1.02 (m, 12H), 1.44 (m, 2H), 1.95 (m, 4H), 7.45 (s, 2H), 7.48 (d of d, $^3$J=8 Hz, $^4$J=2 Hz, 2H); $^{13}$C NMR (400 MHz, CDCl$_3$, δ): 19.4, 22.6, 22.7, 24.5, 27.9, 30.3, 32.8, 36.0, 37.5, 39.2, 55.0, 77.3, 84.5, 119.9, 120.9, 126.5, 131.2, 141.0, 151.0; HRMS (ESI, m/z): [M+H]$^+$ Calcd for $C_{37}H_{51}$, 495.3985. found, 495.3992.

Example 2.2

General Procedure for Polymer Synthesis

A flame dried 50 mL Schlenk flask was charged with 4,8-Dibromo-2,6-dihexylbenzo[1,2-d;4,5-d']bisoxazole (2) (243.1 mg, 0.5 mmol) and diethynyl-comonomer (0.5 mmol) dissolved in N,N-diisopropylamine (6 mL) and toluene (12 mL). The mixture was degassed by bubbling argon through it for 30 minutes followed by addition of tetrakis(triphenylphosphine)palladium(0) (11.6 mg, 2 mol %) and copper iodide (4.8 mg, 5 mol %). The reaction was heated to 70° C. and stirred under argon for 24 hours. The polymer was then precipitated out in methanol and the solid was filtered and washed in a Soxhlet with methanol followed by acetone and then extracted with THF. Evaporation of the THF yielded the polymers as solids of varying color.

PBOCz-O: Yield was 74% as a yellow solid. $^1$H NMR (400 MHz, CDCl$_3$, δ): 0.91 (9H), 1.27-1.49 (22H), 1.92-2.05 (6H), 3.10 (4H), 4.34 (2H), 7.42 (2H), 7.85 (2H), 8.49 (2H); UV/Vis (CHCl$_3$): $\lambda_{max}$=392 nm; UV/Vis (film): $\lambda_{max}$=427 nm; GPC(CHCl$_3$): $M_n$=13,000, $M_w$=23,800, PDI=1.8.

PBOCz-EH: Yield was 95% as a yellow solid. $^1$H NMR (400 MHz, CDCl$_3$, δ): 0.86-0.92 (12H), 1.27-1.54 (20H), 2.00-2.11 (5H), 3.10 (4H), 4.21 (2H), 7.42 (2H), 7.85 (2H), 8.49 (2H); UV/Vis (CHCl$_3$): $\lambda_{max}$=394 nm; UV/Vis (film): $\lambda_{max}$=430 nm; GPC(CHCl$_3$): $M_n$=47,900, $M_w$=74,900, PDI=1.6.

PBOF-O: Yield was 73% as a yellow solid. $^1$H NMR (400 MHz, CDCl$_3$, δ): 0.68 (4H), 0.84 (6H), 0.95 (6H), 1.11-1.27 (20H), 1.41 (8H), 1.53 (4H), 2.01 (8H), 3.09 (4H), 7.68-7.78 (6H); UV/Vis (CHCl$_3$): $\lambda_{max}$=433 nm; UV/Vis (film): $\lambda_{max}$=440 nm; GPC(CHCl$_3$): $M_n$=38,200, $M_w$=145,000, PDI=3.8.

PBOF-DMO: Yield was 49% as a yellow solid. $^1$H NMR (400 MHz, CDCl$_3$, δ): 0.51-1.44 (56H), 1.92 (8H), 3.00 (4H), 7.62-7.66 (6H); UV/Vis (CHCl$_3$): $\lambda_{max}$=399 nm; UV/Vis (film): $\lambda_{max}$=404 nm; GPC(CHCl$_3$): $M_n$=51,900, $M_w$=188,300, PDI=3.6.

PBOP-D: Yield was 59% as an orange solid. $^1$H NMR (400 MHz, CDCl$_3$, δ): 0.86-0.95 (12H), 1.23-1.28 (32H), 1.39 (8H), 1.48-1.59 (8H), 1.98 (8H), 3.05 (4H), 4.16 (4H), 7.24 (2H). UV/Vis (CHCl$_3$): $\lambda_{max}$=467 nm; UV/Vis (film): $\lambda_{max}$=505 nm; GPC(CHCl$_3$): $M_n$=33,100, $M_w$=45,800, PDI=1.4.

PBOP-MEH: Yield was 51% as an orange solid. $^1$H NMR (400 MHz, CDCl$_3$, δ): 0.81-0.98 (12H), 1.27-1.52 (20H), 1.99 (5H), 3.04 (4H), 4.02 (5H), 7.25 (2H). UV/Vis (CHCl$_3$): $\lambda_{max}$=440 nm; UV/Vis (film): $\lambda_{max}$=454 nm; GPC(CHCl$_3$): $M_n$=26,200, $M_w$=87,200, PDI=3.3.

Example 2.3

Characterization

NMR spectra were obtained on a Varian MR-400 at 400 MHz using CDCl$_3$ as the solvent and all samples were referenced to their internal protonated solvent. Gel permeation chromatography (GPC) measurements were performed on a GPC separation module equipped with four columns connected in a series (guard, 10,000 Å, 1,000 Å, and 100 Å from American Polymer Services Corporation), a refractive index detector and a UV-Vis detector. Analysis was performed at 35° C. using chloroform as the eluent with a flow rate of 1.0 mL min$^{-1}$. Calibration was based on polystyrene standards. Fluorescence spectroscopy and UV-Visible spectroscopy were performed using polymer solution in chloroform and as thin films spun from 10 mg mL$^{-1}$ solutions on to glass slides with a spin rate of 2,000 rpm. Photoluminescence spectra were obtained using an excitation wavelength equal to the wavelength of maximum absorption for the UV spectra. Thermal gravimetric analysis was taken in the temperature range of 30-850° C. using a heating rate of 20° C. min$^{-1}$ under ambient atmosphere. Differential scanning calorimetry was performed with a first scan heating rate of 15° C. min$^{-1}$ to erase thermal history and a second scan to measure transitions between 0-250° C. under nitrogen. Transitions were also measured with cooling at 15° C. min$^{-1}$. Ultraviolet photoelectron spectroscopy measurements were performed on polymer films using a RKI Instruments Model AC-2 instrument. Quantum yield measurements were taken of the polymers in dilute solutions of chloroform relative to Coumarin-152 in acetonitrile. Fluorescence lifetime measurements were performed using the time-correlated single-photon counting (TCSPC) method. Pulses tunable from ~780-880 nm were produced from a homebuilt 82-MHz mode-locked Ti: sapphire oscillator pumped by a 5-W Nd:VO4 laser (Millennia, Spectra Physics). The resulting fundamental wavelength at ~814 nm was modulated by a Pockels cell (Model 350-160, Conoptics Inc.) to reduce the repetition rate to ~8.8 MHz. The frequency-doubling of this laser source by a harmonic generator (Model TP-2000B, U-Oplaz Technologies) provided the excitation wavelength at ~407 nm. A half wave plate and polarizer before the sample chamber ensured vertically polarized excitation. Emission (≥500 nm) was collected in a perpendicular geometry and passed through a polarizer set at the magic angle (54.70) for solutions and 900 for solid films, with respect to the excitation polarization. Notably, a front faced geometry was also used for solid films. The placement of appropriate filters before the microchannel plate, MCP (Hamamatsu, R3809U-50) eliminated the excitation light and allowed selection of emission from the sample. The full width at half-maximum (FWHM) of the instrument response function was ~37-40 ps. All measurements were made in a 5 ns time window with a total of 4096 channels. A total of 65530 counts were collected at the peak channel for all lifetime measurements.

Example 2.4

OLED Fabrication and Characterization

OLEDs were fabricated on nominally 20 Ω/square, 140 nm-thick ITO-coated glass substrates (Colorado Concept Coatings). The substrates were first cleaned with a detergent and organic solvents and then treated in a UV/ozone oven to increase the work function of the ITO and hence facilitate hole injection, as described elsewhere. A 60 nm PEDOT:PSS layer was spin-coated onto the ITO and then baked in air at 120° C. for 1 hour and then in an argon filled glovebox at 120° C. for another 30 minutes. Blends of PVK or CBP and PBO copolymers in chlorobenzene solutions were spin-coated on top of the PEDOT:PSS layer in an argon filled glovebox. The combined concentration of host and guest material was kept constant at 9 mg mL$^{-1}$. The solution was spin-coated at 4,000 rpm for 60 seconds. The fabricated structure was then annealed at 60° C. for 30 minutes. Following this annealing step, the samples were transfered to a thermal evaporator within the glovebox and the Bphen, LiF, and Al layers were deposited sequentially by thermal evaporation at a base pressure of ~1×10$^{-6}$ Torr. The OLEDs were characterized by monitoring their EL spectra, brightness as a function of the applied voltage, and luminous efficiency.

Example 2.5

Additional Data for Example 2

Figure 7:
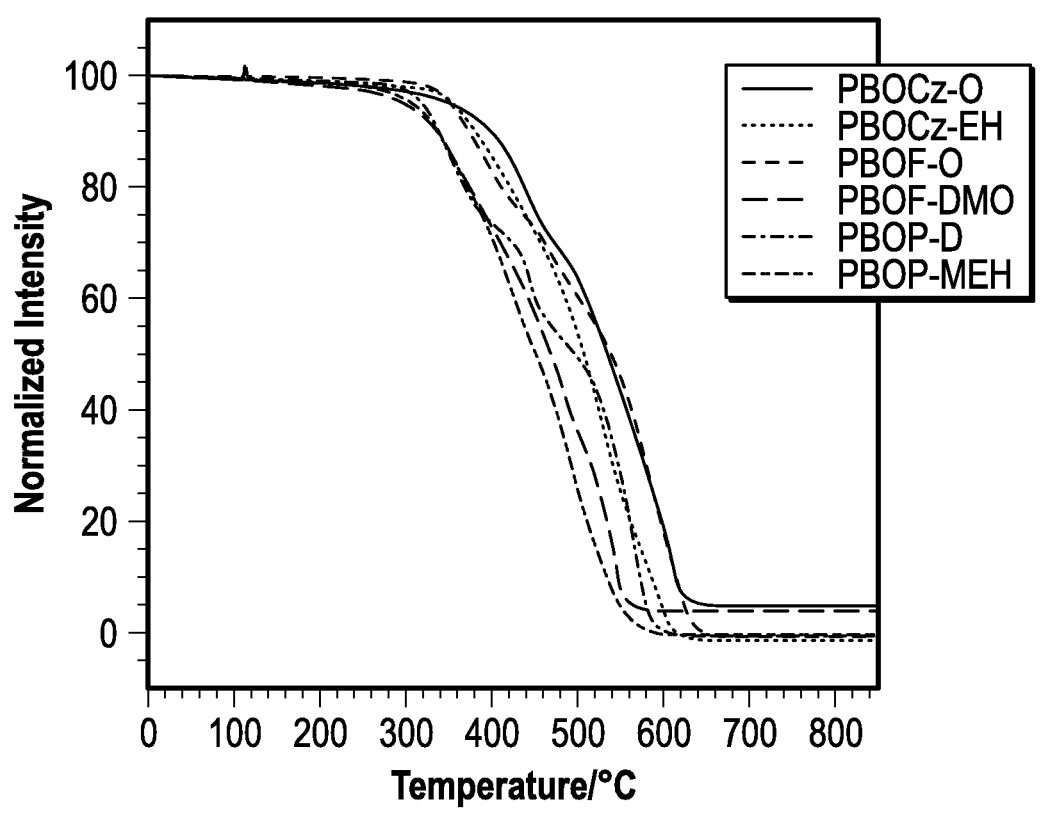
FIG. 7 illustrates thermal gravimetric analysis of benzobisoxazole polymers, in accordance with various embodiments.
Figure 8A:
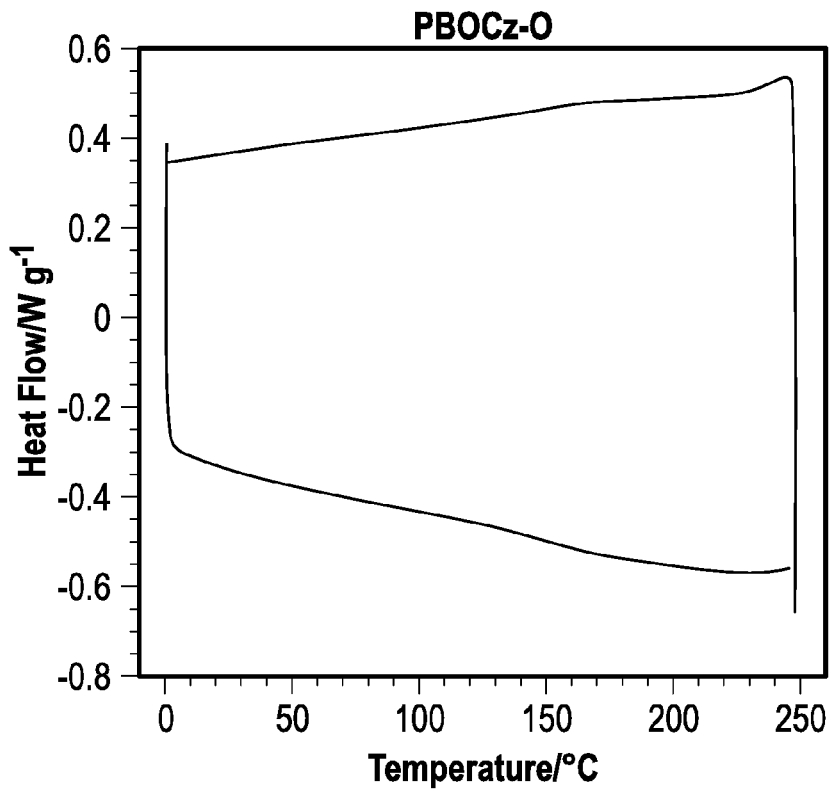
FIGS. 8a-f illustrate differential scanning calorimetry plots of benzobisoxazole polymers, in accordance with various embodiments.
Figure 8B:
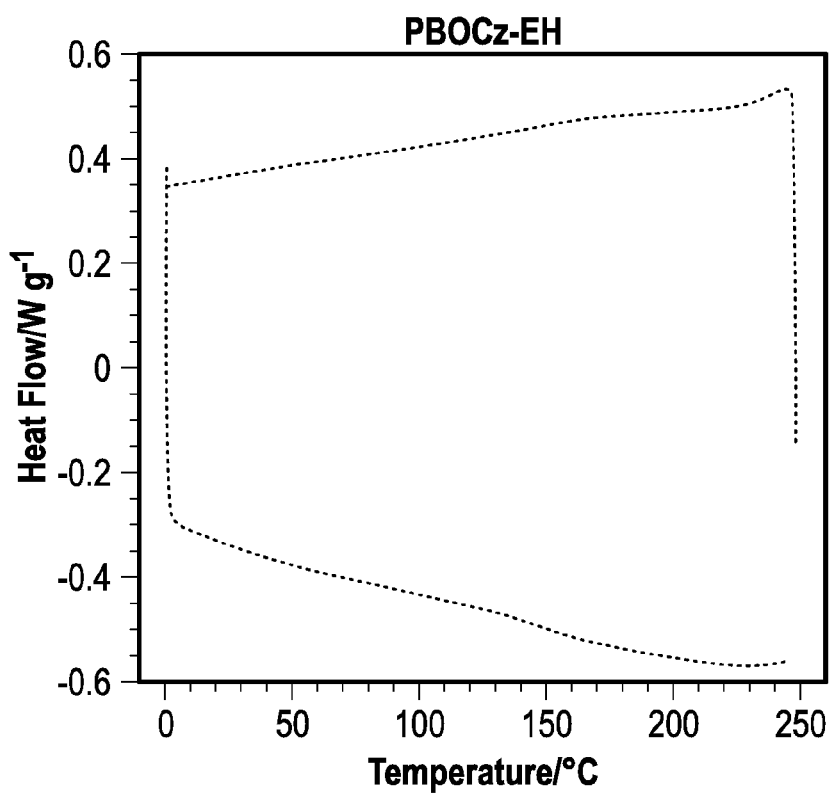
Figure 8C:
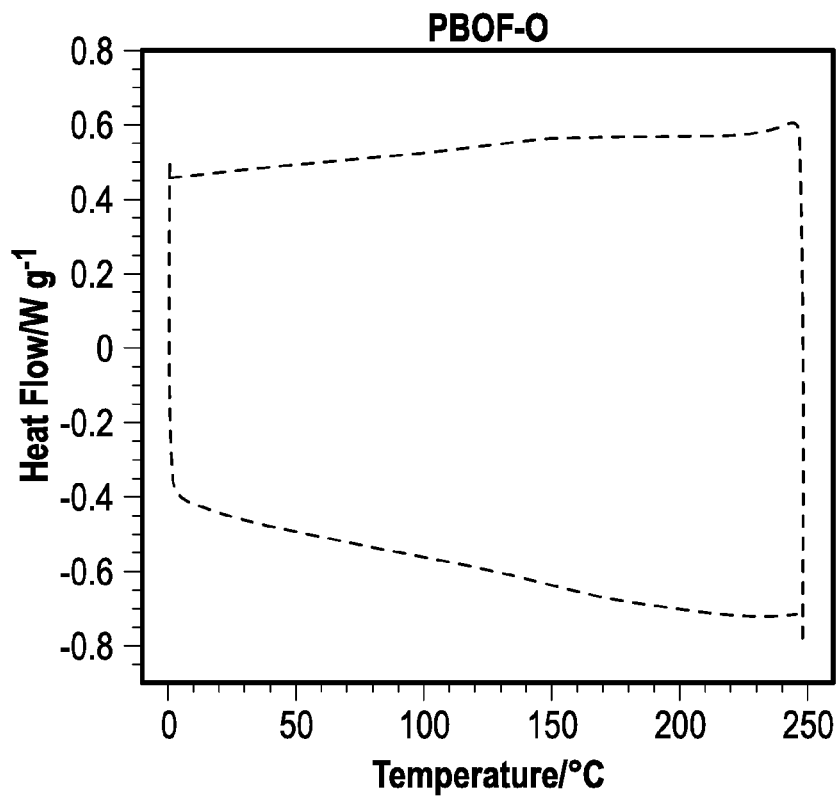
Figure 8D:
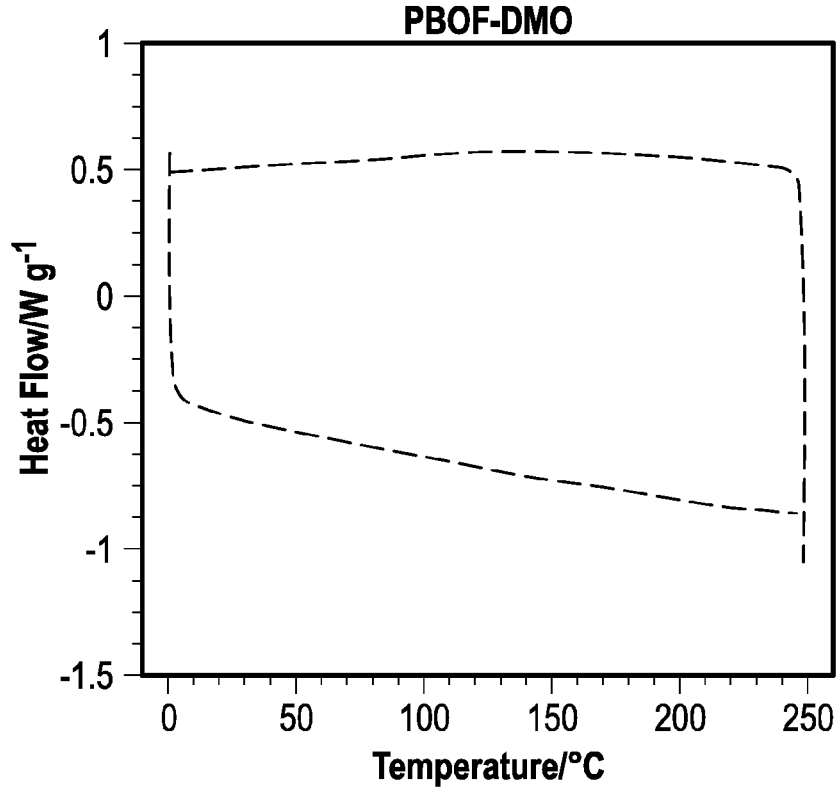
Figure 8E:
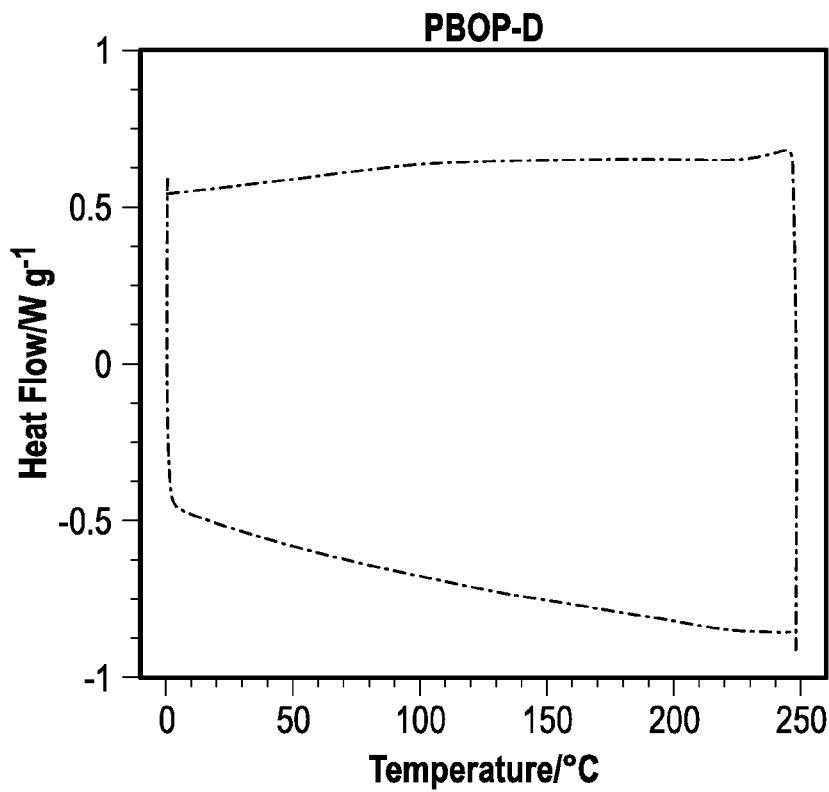
Figure 8F:
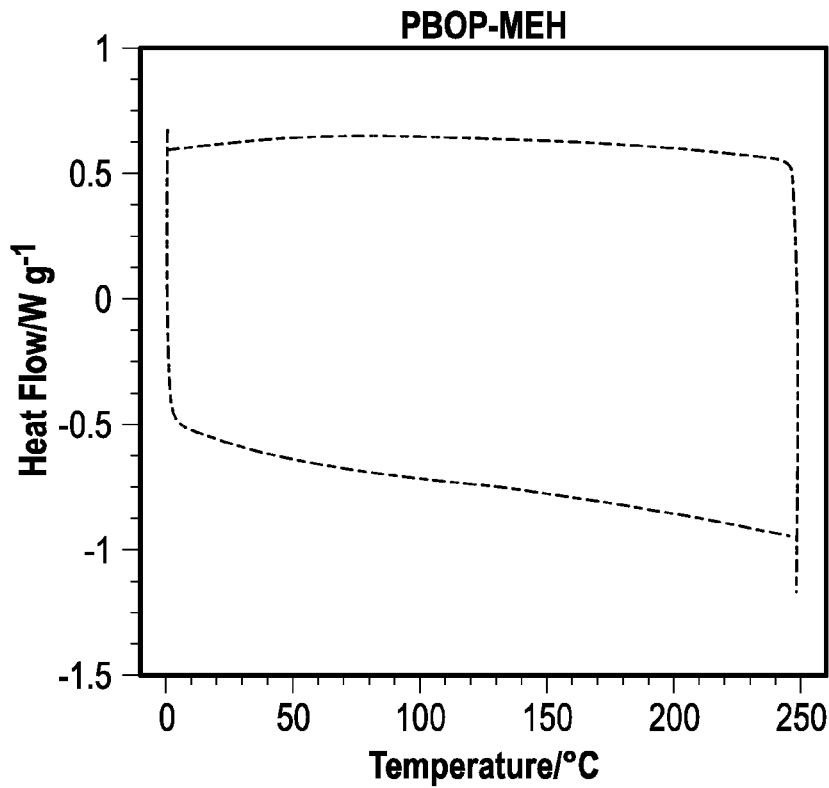
Figure 9A:
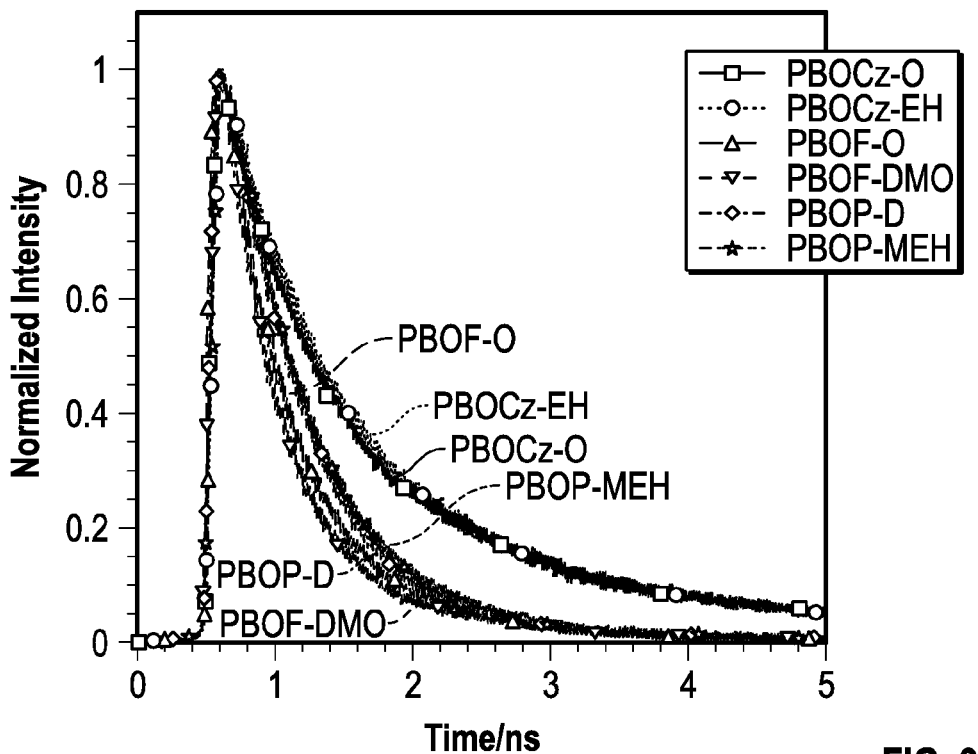
FIGS. 9a-b illustrate photoluminescence lifetime plots of polymers a) in dilute chloroform solutions and b) as thin films, in accordance with various embodiments.
Figure 9B:
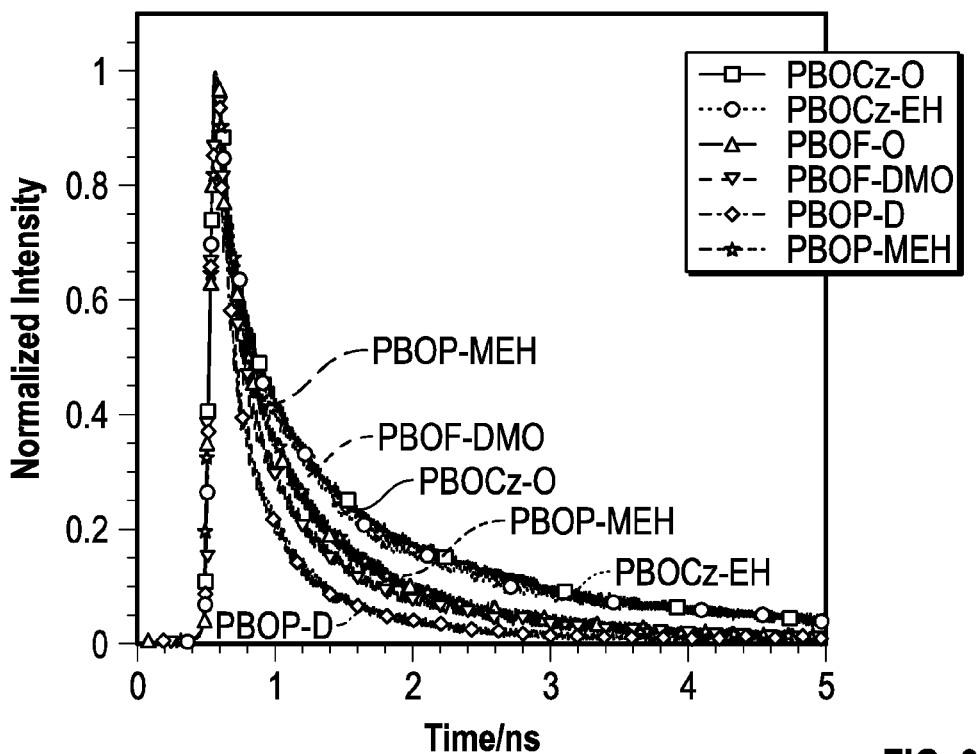
Figure 10:
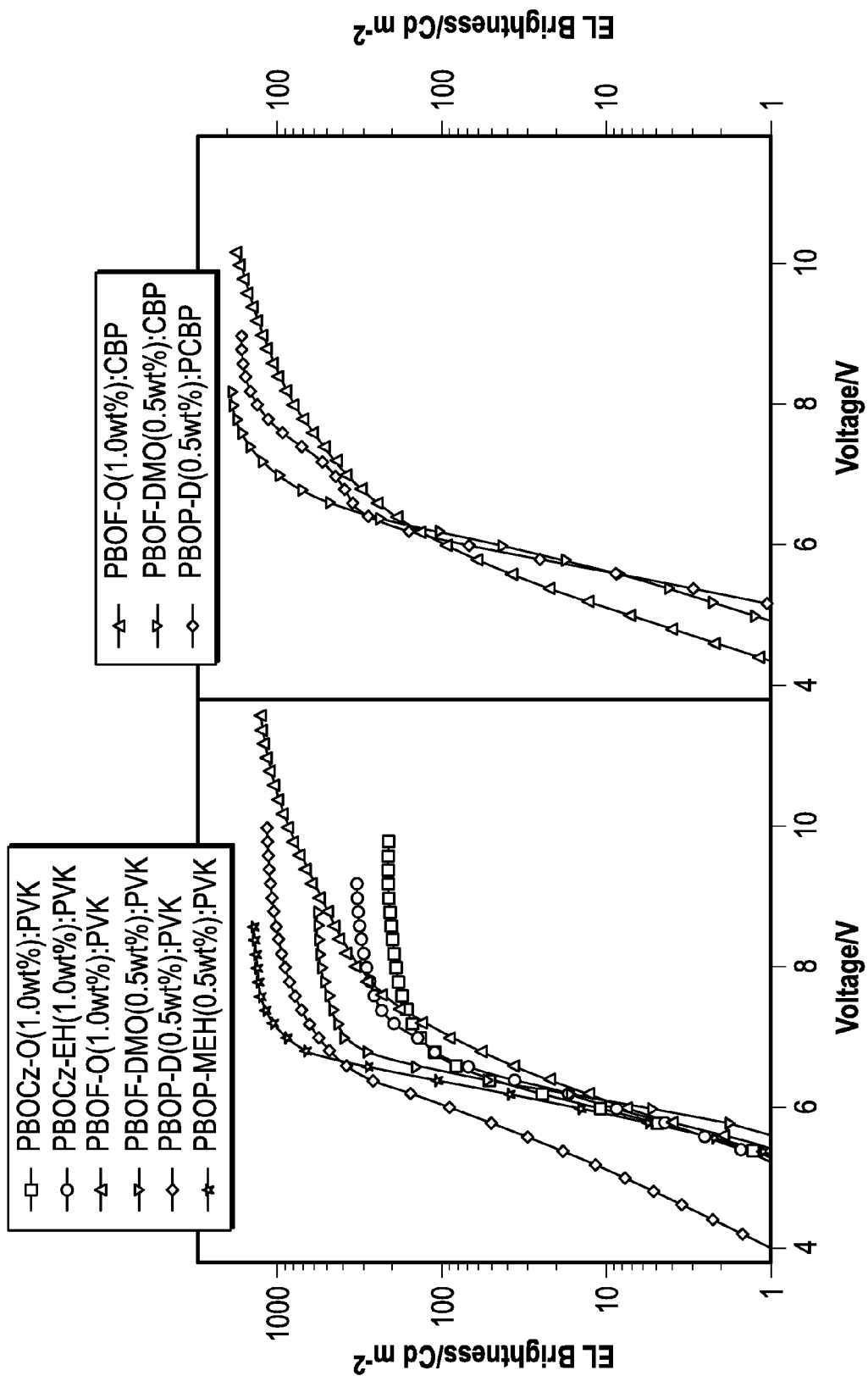
FIG. 10 illustrates brightness as a function of applied voltage for the best performing devices with a PVK host (left) or CBP host (right), in accordance with various embodiments.
Figure 11A:
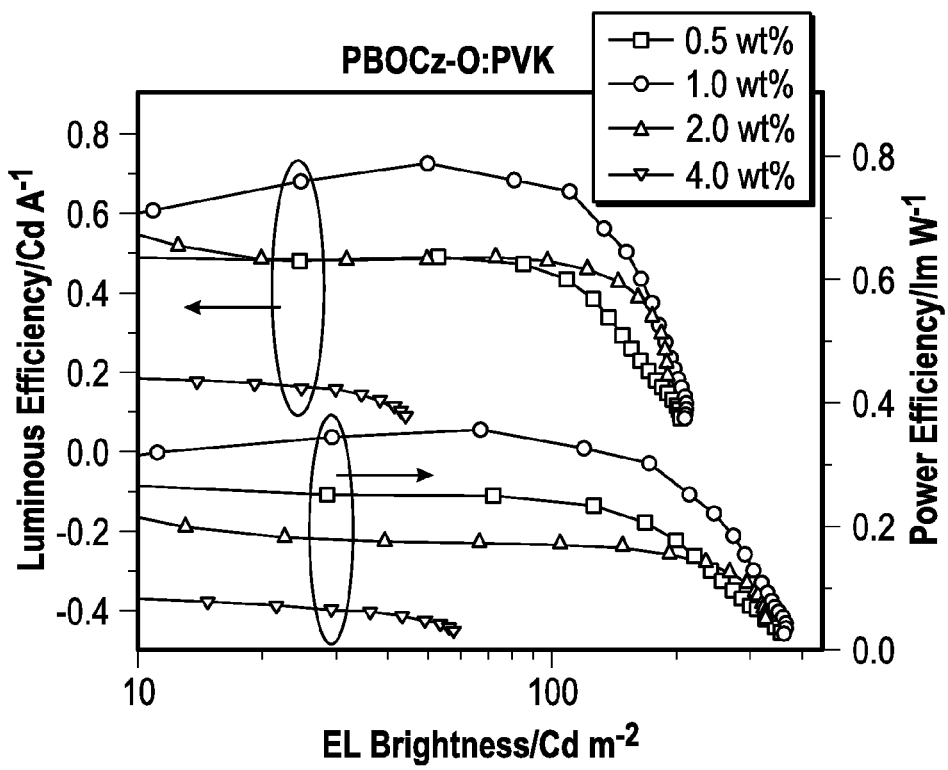
FIGS. 11a-b illustrate efficiency as a function of brightness for all PBOCz-O devices (a) and PBOCz-EH devices (b), in accordance with various embodiments.
Figure 11B:
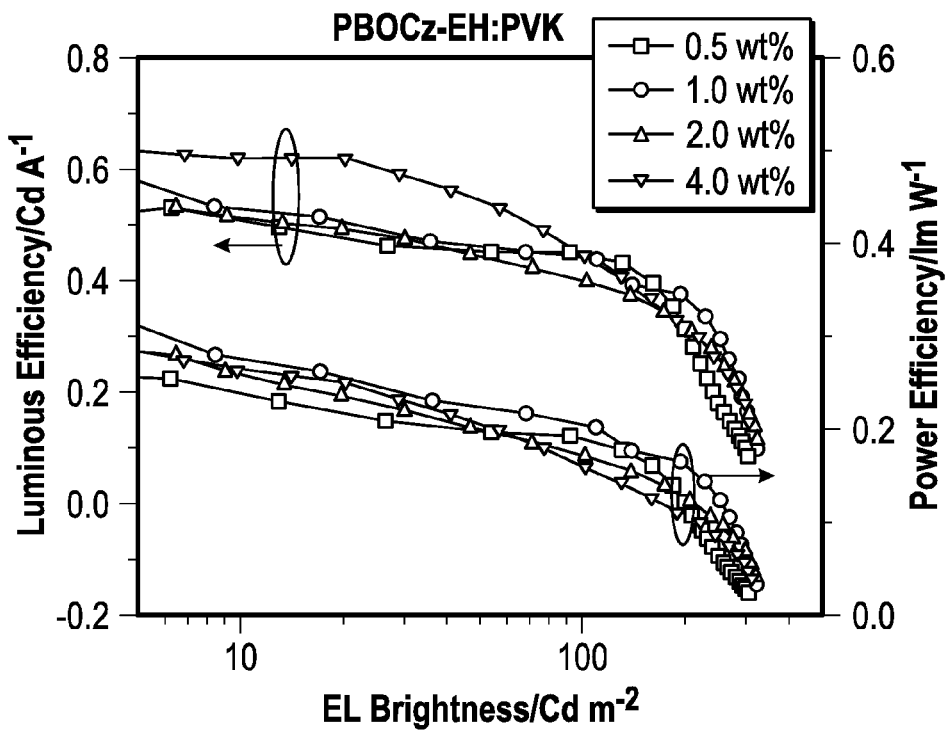
Figure 12A:
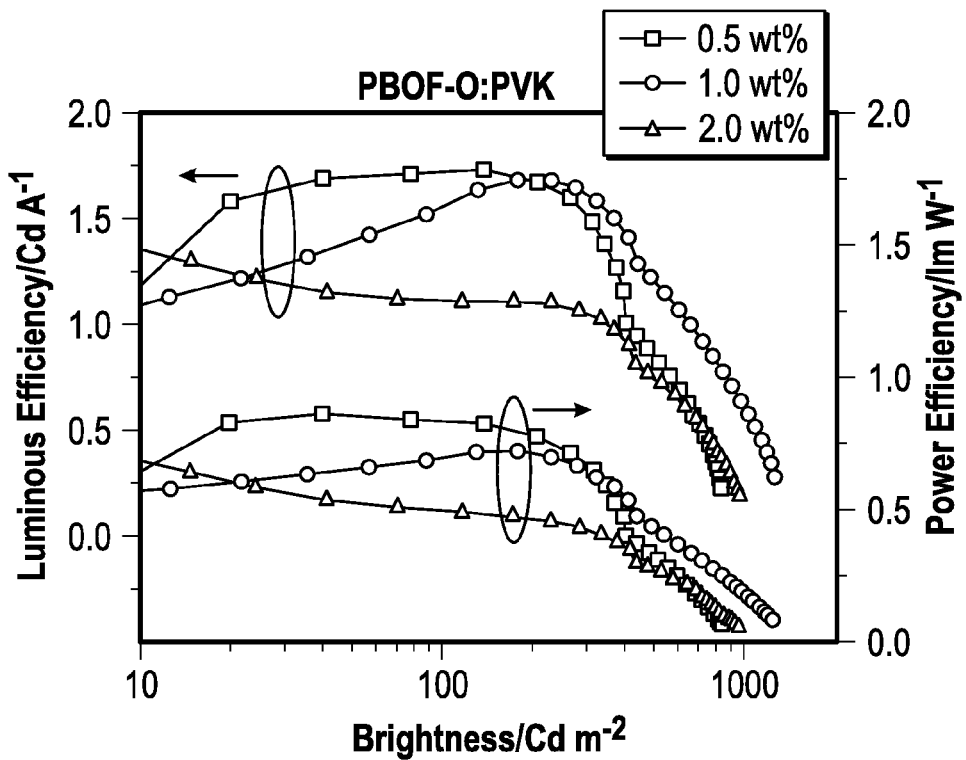
FIGS. 12a-b illustrate efficiency as a function of brightness for all PBOF-O devices using a PVK host (a) or CBP host (b), in accordance with various embodiments.
Figure 12B:
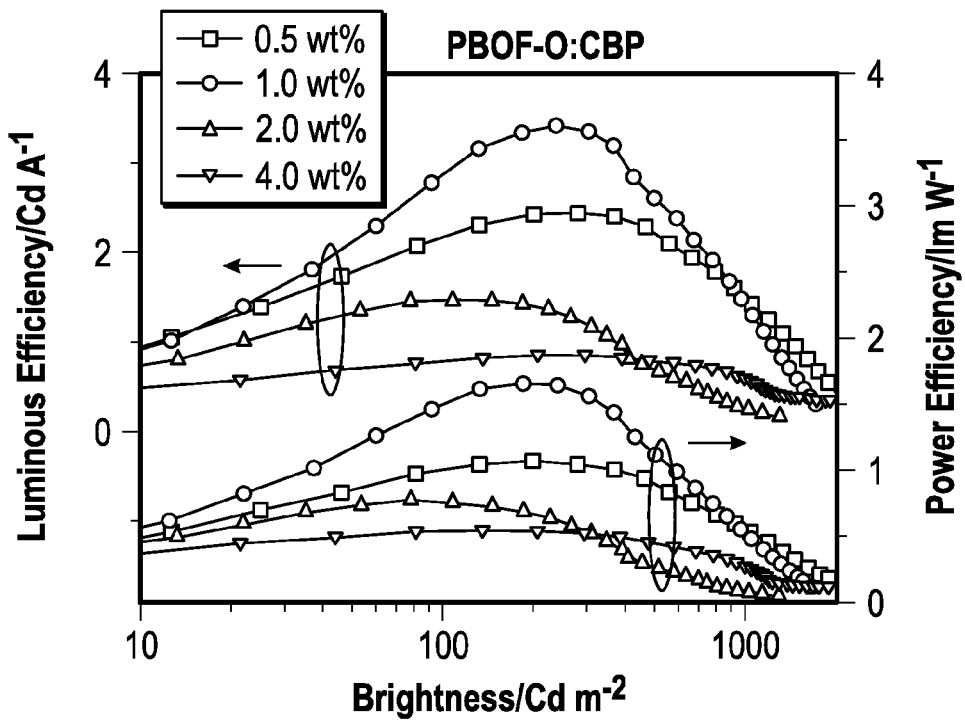
Figure 13A:
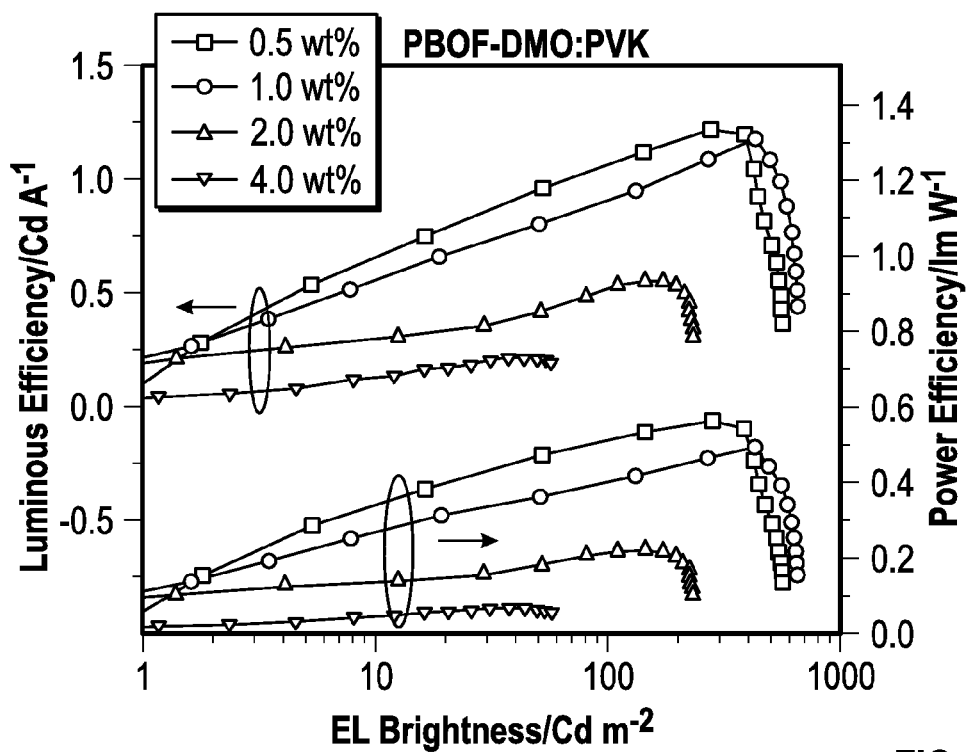
FIGS. 13a-b illustrate efficiency as a function of brightness for all PBOF-DMO devices using a PVK host (a) or a CBP host (b), in accordance with various embodiments.
Figure 13B:
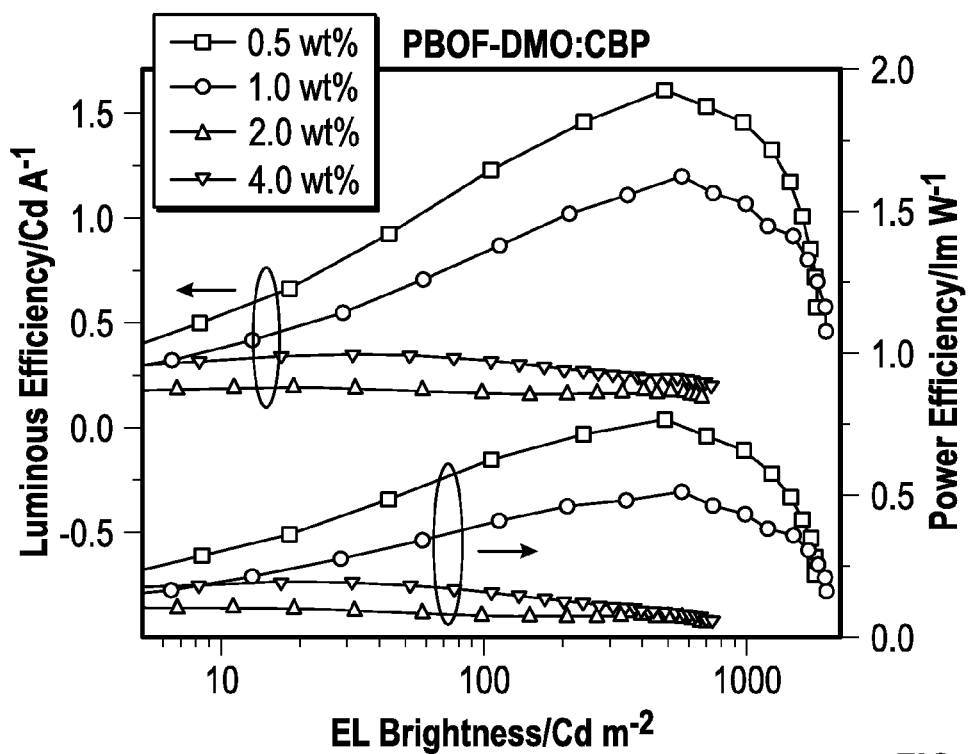
Figure 14A:
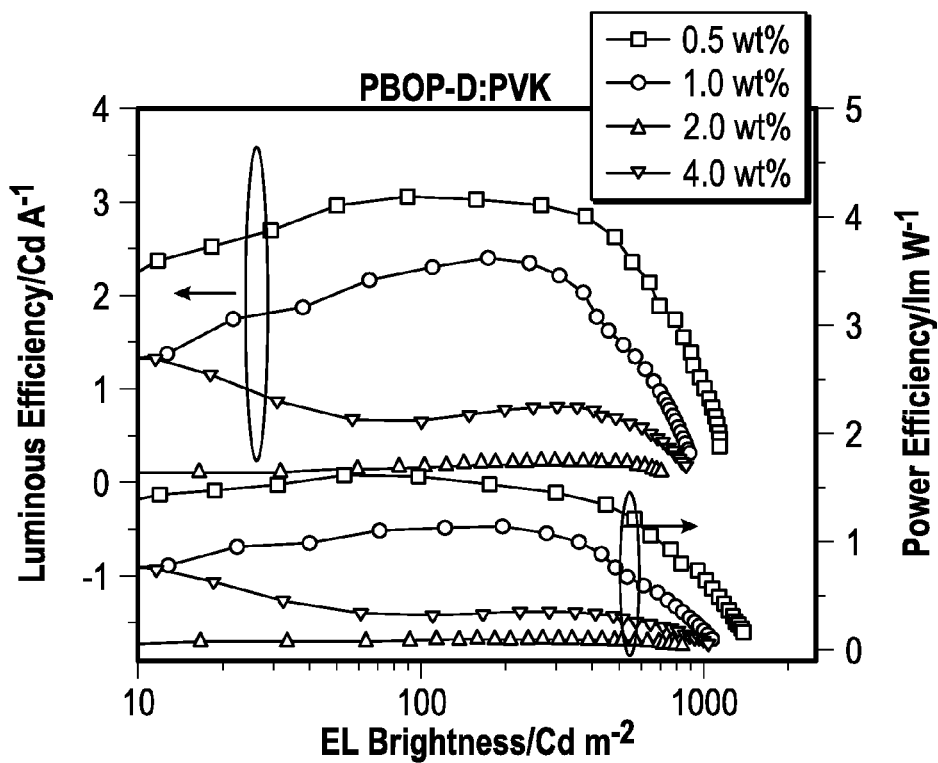
FIGS. 14a-b illustrate efficiency as a function of brightness for all PBOP-D devices using a PVK host (left) or CBP host (right), in accordance with various embodiments.
Figure 14B:
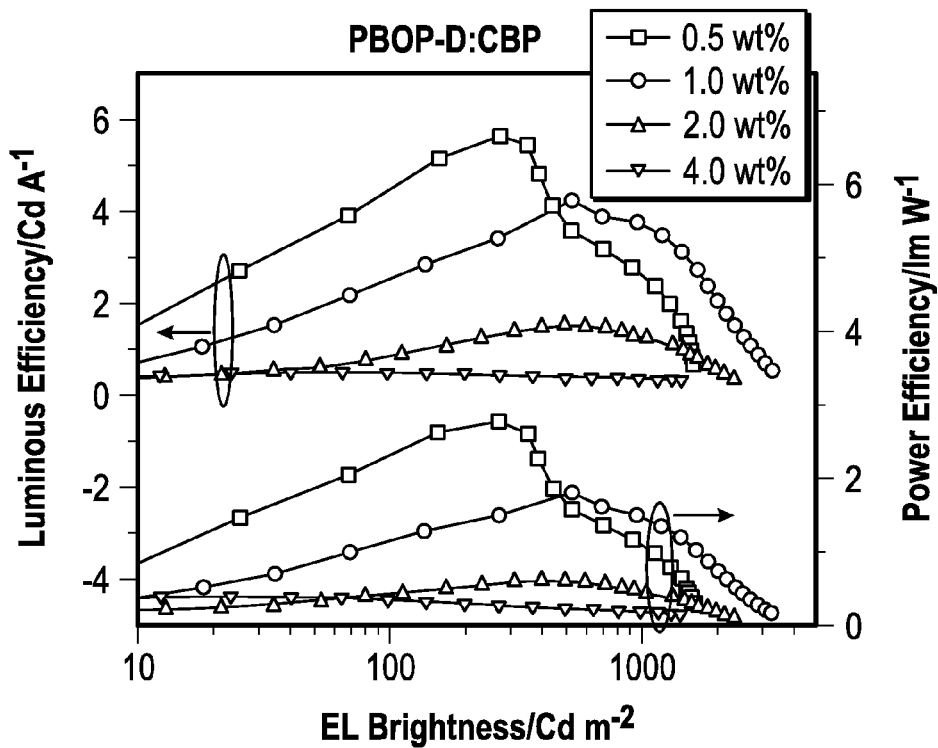
Figure 15:
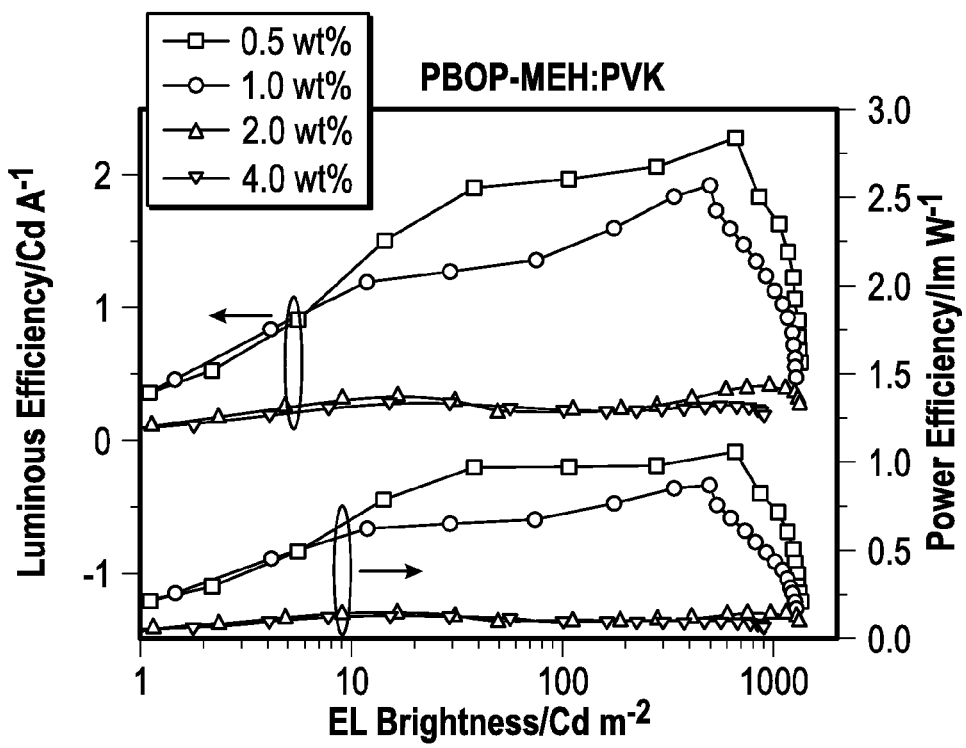
FIG. 15 illustrates efficiency as a function of brightness for all PBOP-MEH devices, in accordance with various embodiments.

FIG. 7 illustrates thermal gravimetric analysis of benzobisoxazole polymers. FIGS. 8a-f illustrate differential scanning calorimetry plots of benzobisoxazole polymers. FIGS. 9a-b illustrates photoluminescence lifetime plots of polymers a) in dilute chloroform solutions and b) as thin films. FIG. 10 illustrates brightness as a function of applied voltage for the best performing devices with a PVK host (left) or CBP host (right). FIGS. 11a-b illustrate efficiency as a function of brightness for all PBOCz-O devices (a) and PBOCz-EH devices (b). FIGS. 12a-b illustrate efficiency as a function of brightness for all PBOF-O devices using a PVK host (left) or CBP host (right). FIGS. 13a-b illustrate efficiency as a function of brightness for all PBOF-DMO devices using a PVK host (a) or a CBP host (b). FIGS. 14a-b illustrate efficiency as a function of brightness for all PBOP-D devices using a PVK host (left) or CBP host (right). FIG. 15 illustrates efficiency as a function of brightness for all PBOP-MEH devices.

TABLE 5

Photoluminescence Lifetimes of the Polymers.

| Polymer | $\tau_1$ [n s], (A$_1$) [%] [a] | $\tau_2$ [n s], (A$_2$) [%] [a] | $\tau_3$ [n s], (A$_3$) [%] [a] | $\tau$ [ns] [b] |
|---|---|---|---|---|
| Solution | | | | |
| PBOCz-O | 0.33 (26) | 0.77 (48) | 2.10 (26) | 1.00 |
| PBOCz-EH | 0.32 (30) | 0.86 (45) | 2.10 (25) | 1.00 |
| PBOF-O | 0.25 (31) | 0.75 (28) | 0.50 (41) | 0.49 |
| PBOF-DMO | 0.27 (71) | 0.71 (24) | 1.40 (5) | 0.43 |
| PBOP-D | 0.53 (88) | 0.75 (10) | 2.20 (2) | 0.59 |
| PBOP-MEH | 0.49 (51) | 0.71 (47) | 2.20 (2) | 0.63 |
| Thin Film | | | | |
| PBOCz-O | 0.05 (57) | 0.41 (26) | 2.00 (16) | 0.46 |
| PBOCz-EH | 0.06 (58) | 0.42 (27) | 2.00 (15) | 0.45 |
| PBOF-O | 0.08 (59) | 0.46 (30) | 1.60 (11) | 0.36 |
| PBOF-DMO | 0.05 (64) | 0.35 (28) | 1.40 (8) | 0.24 |
| PBOP-D | 0.05 (69) | 0.29 (25) | 1.10 (6) | 0.17 |
| PBOP-MEH | 0.06 (60) | 0.43 (29) | 1.50 (11) | 0.32 |

[a] A1, A2, and A3 represent the preexponentials of the three difference decay terms.
[b] Average PL lifetime determined by full width at half max.

Example 2.6

Spectra for Example 2

Figure 25:
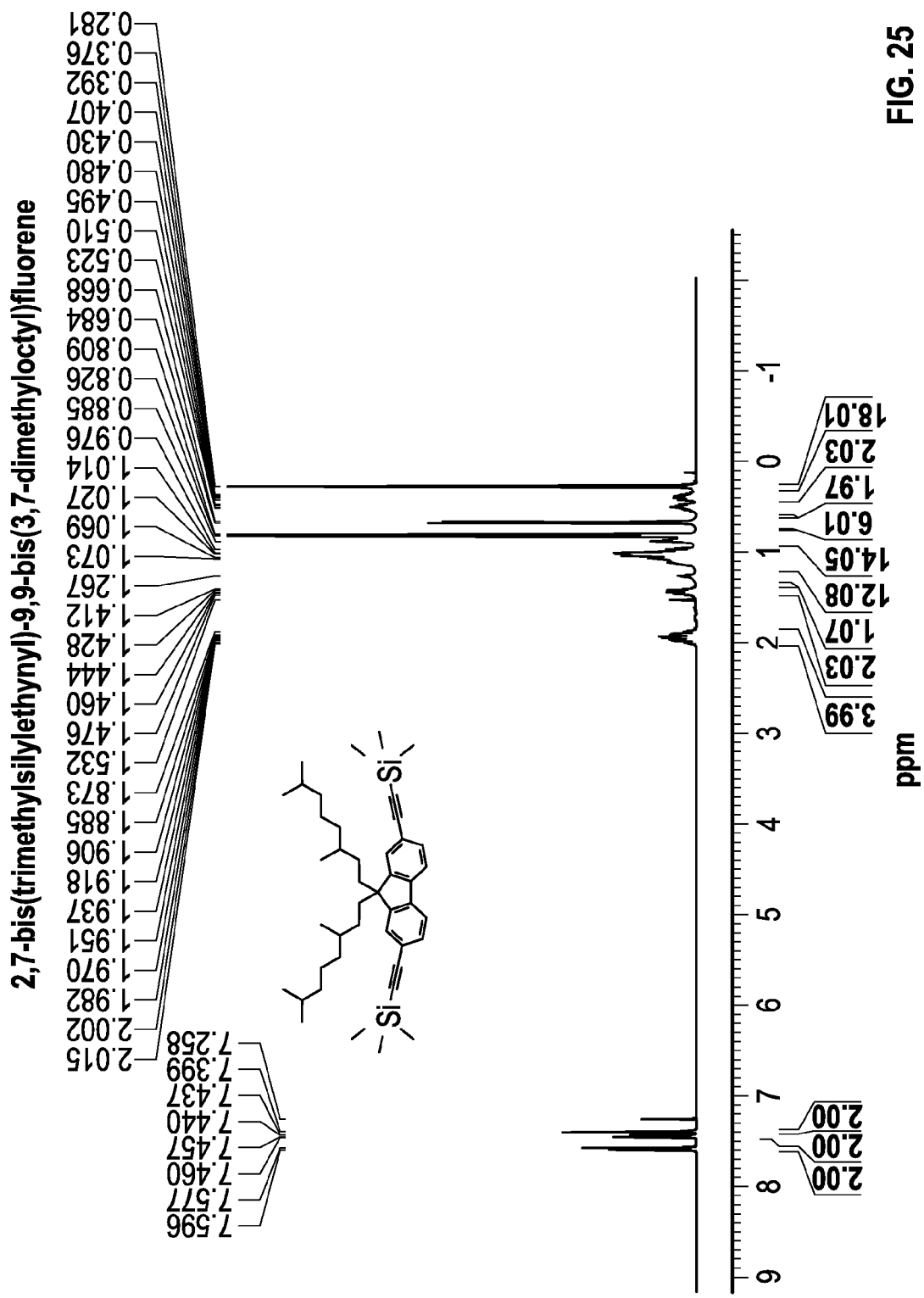
FIG. 25 illustrates a $^1$H NMR of 2,7-bis(trimethylsilylethynyl)-9,9-bis(3,7-dimethyloctyl)fluorene, in accordance with various embodiments.
Figure 26:
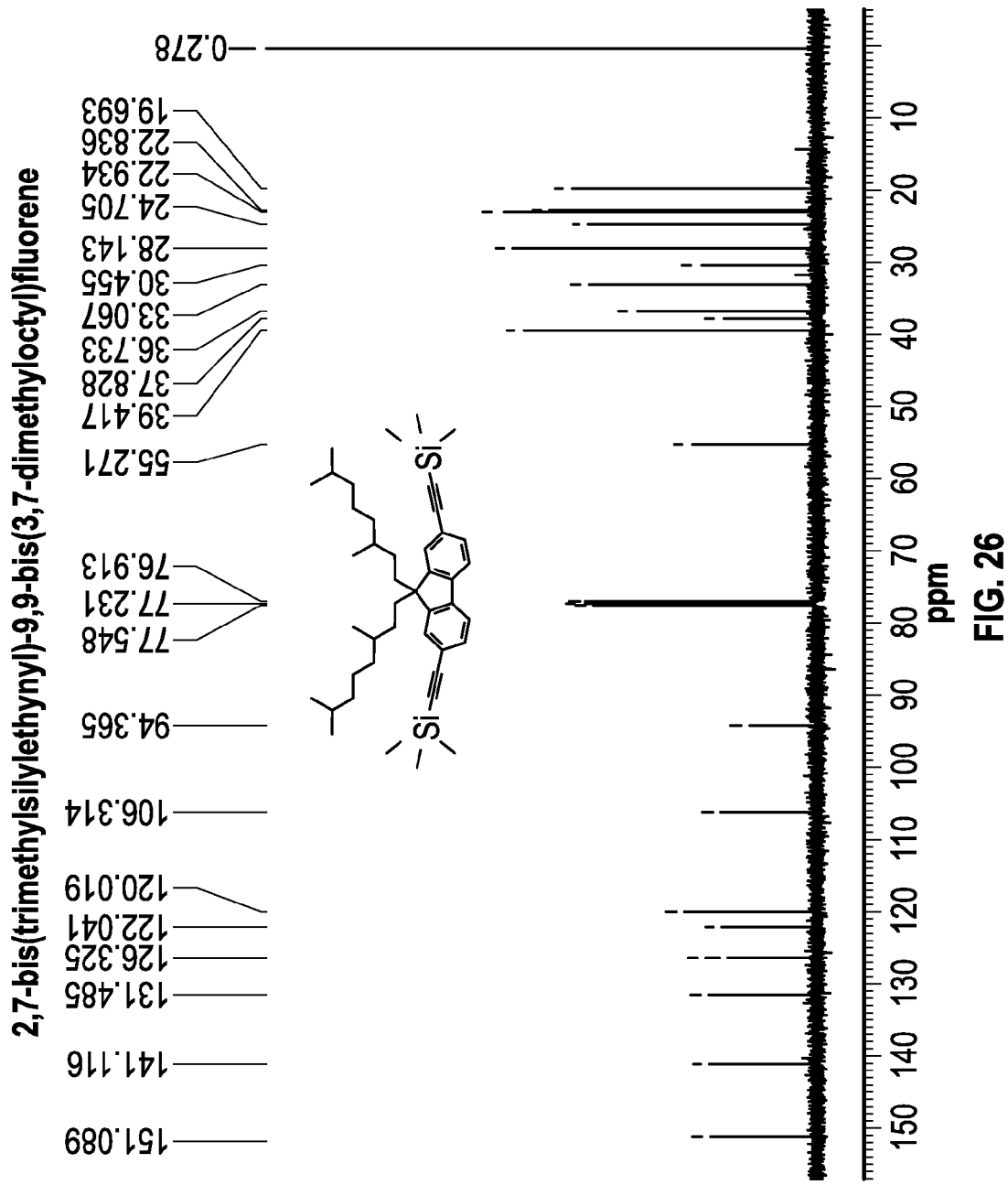
FIG. 26 illustrates a $^{13}$C NMR of 2,7-bis(trimethylsilylethynyl)-9,9-bis(3,7-dimethyloctyl)fluorene, in accordance with various embodiments.
Figure 27:
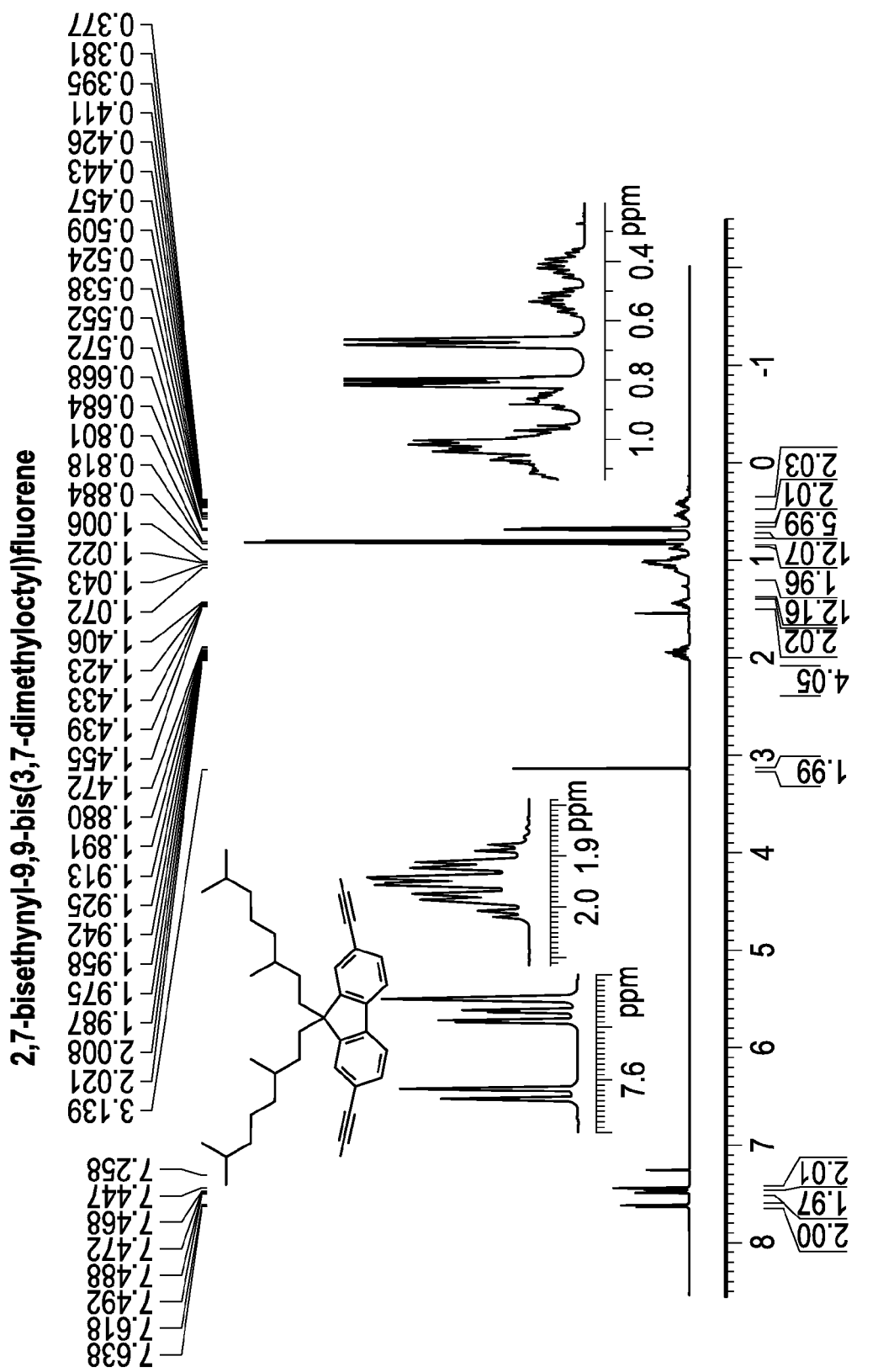
FIG. 27 illustrates a $^1$H NMR of 2,7-diethynyl-9,9-bis(3,7-dimethyloctyl)fluorene, in accordance with various embodiments.
Figure 28:
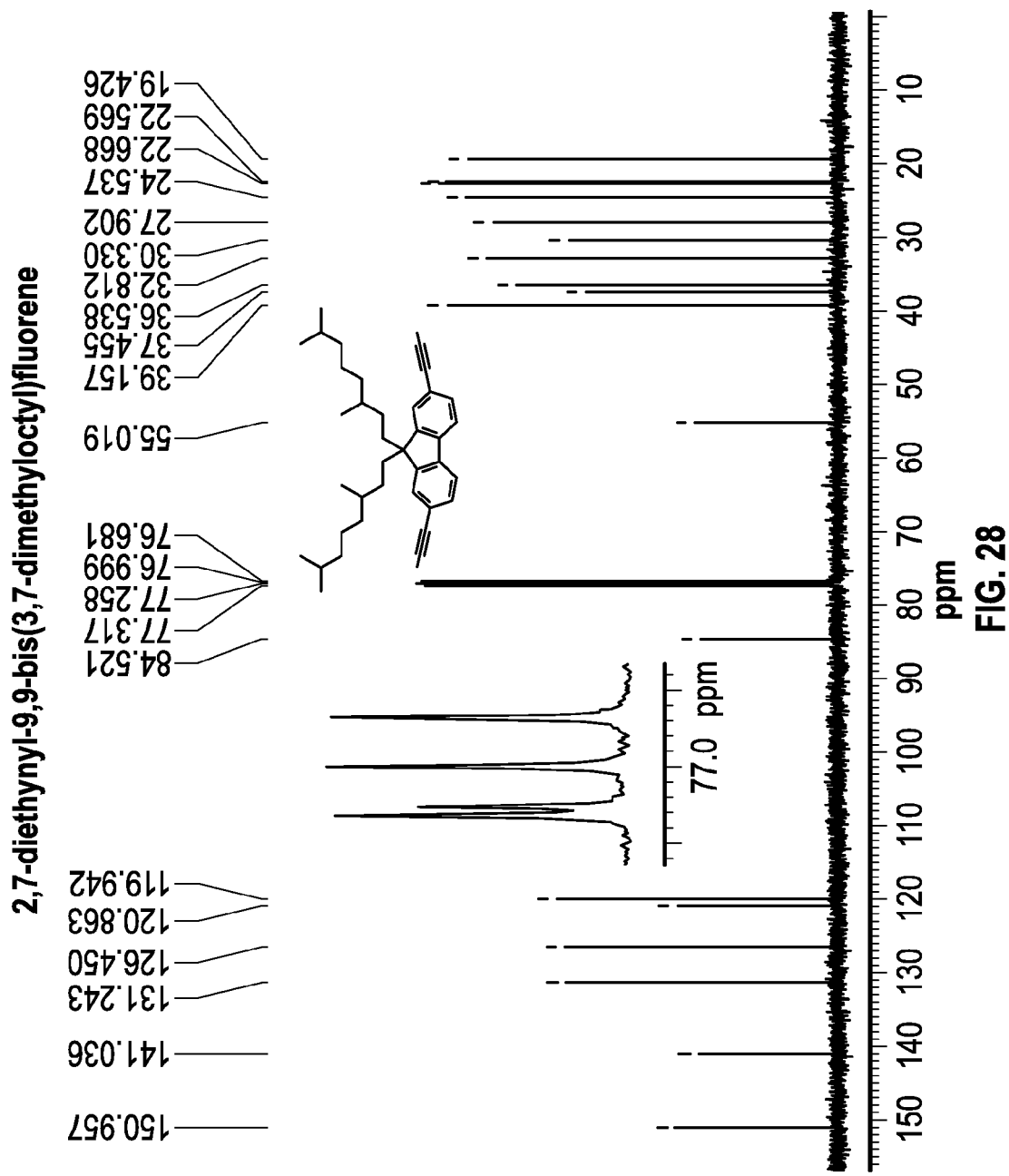
FIG. 28 illustrates a $^{13}$C NMR of 2,7-diethynyl-9,9-bis(3,7-dimethyloctyl)fluorene, in accordance with various embodiments.
Figure 29:
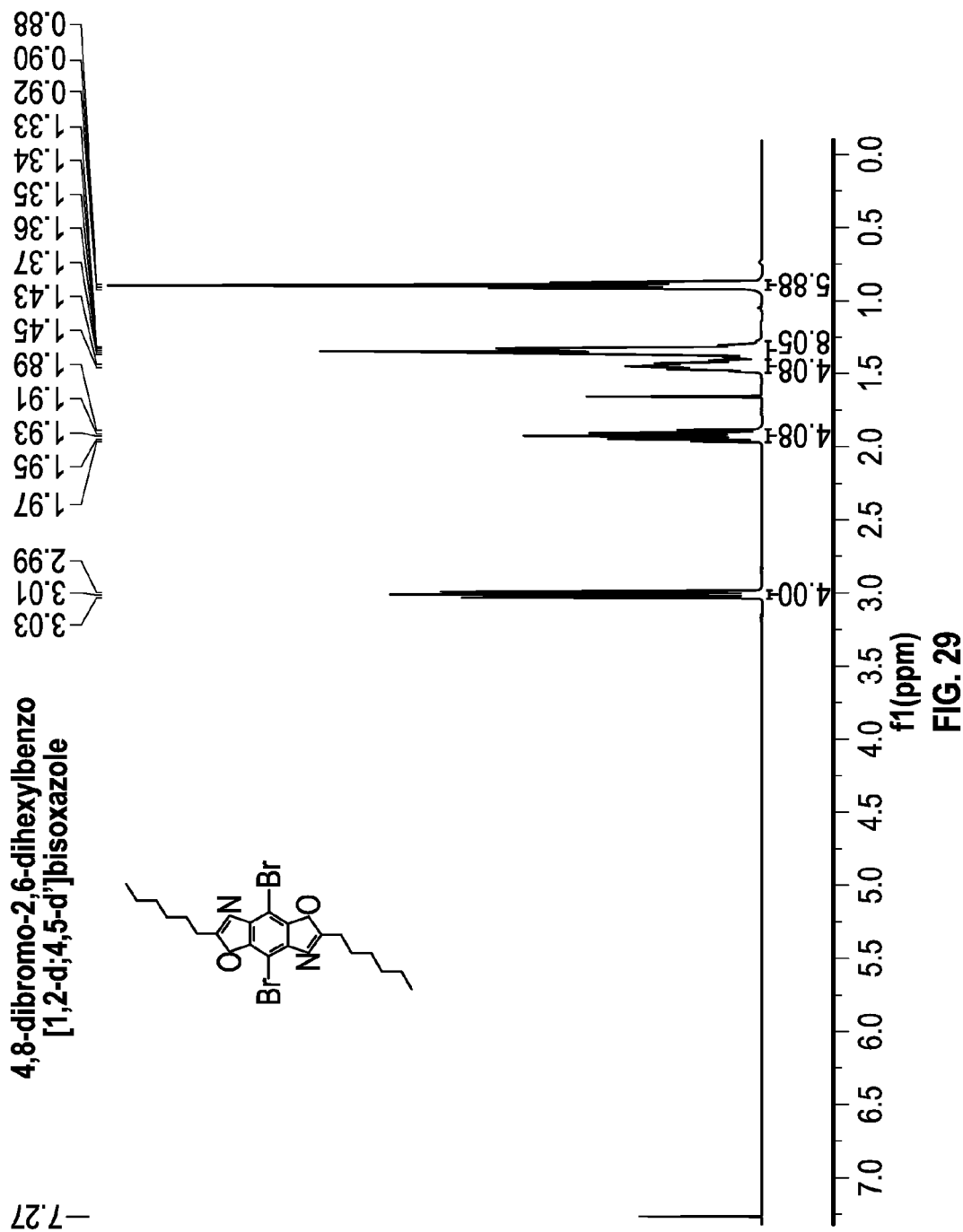
FIG. 29 illustrates a $^1$H NMR of 4,8-dibromo-2,6-dihexylbenzo[1,2-d;4,5-d']bisoxazole, in accordance with various embodiments.
Figure 30:
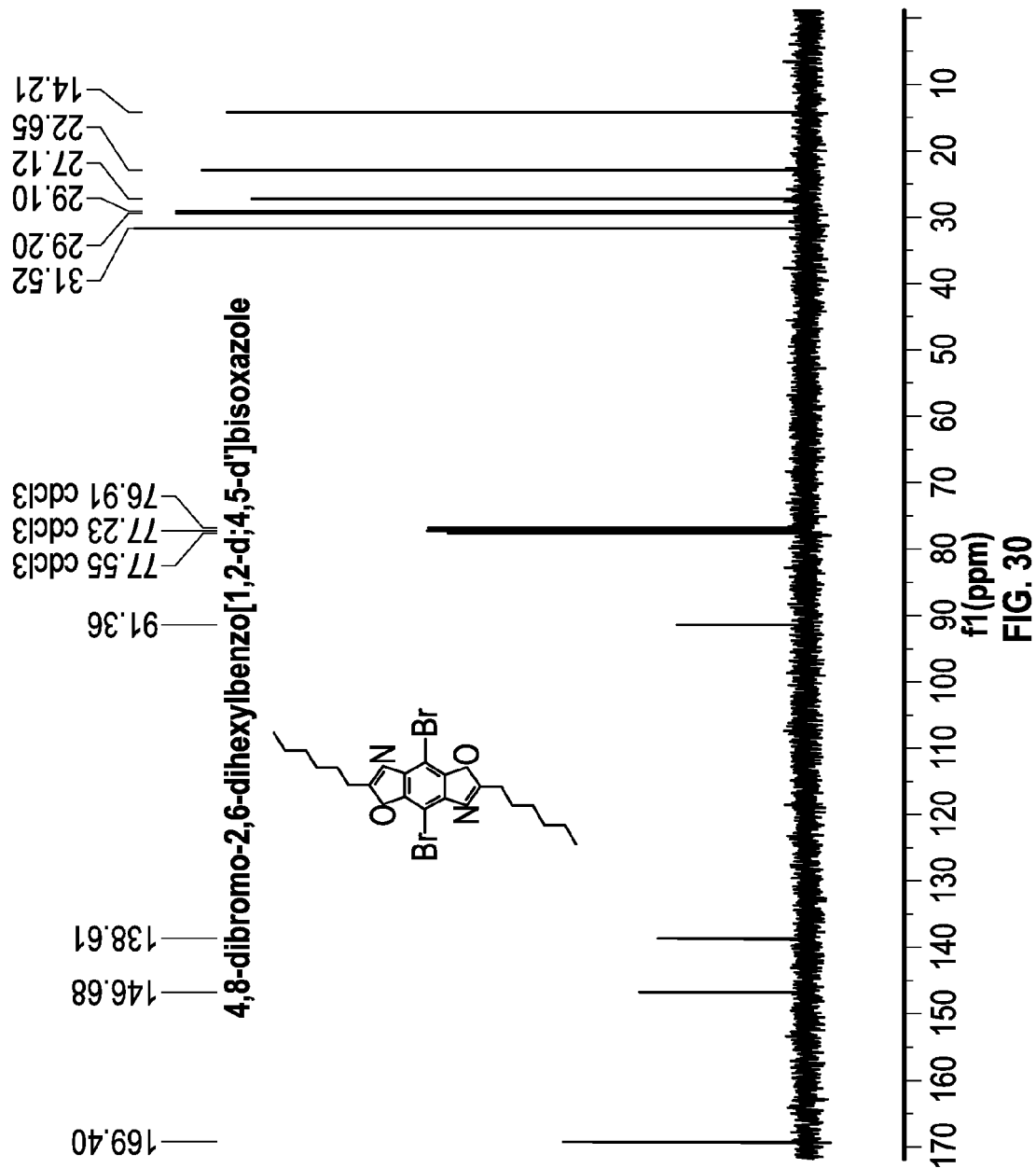
FIG. 30 illustrates a $^{13}$C NMR of 4,8-dibromo-2,6-dihexylbenzo[1,2-d;4,5-d']bisoxazole, in accordance with various embodiments.
Figure 31:
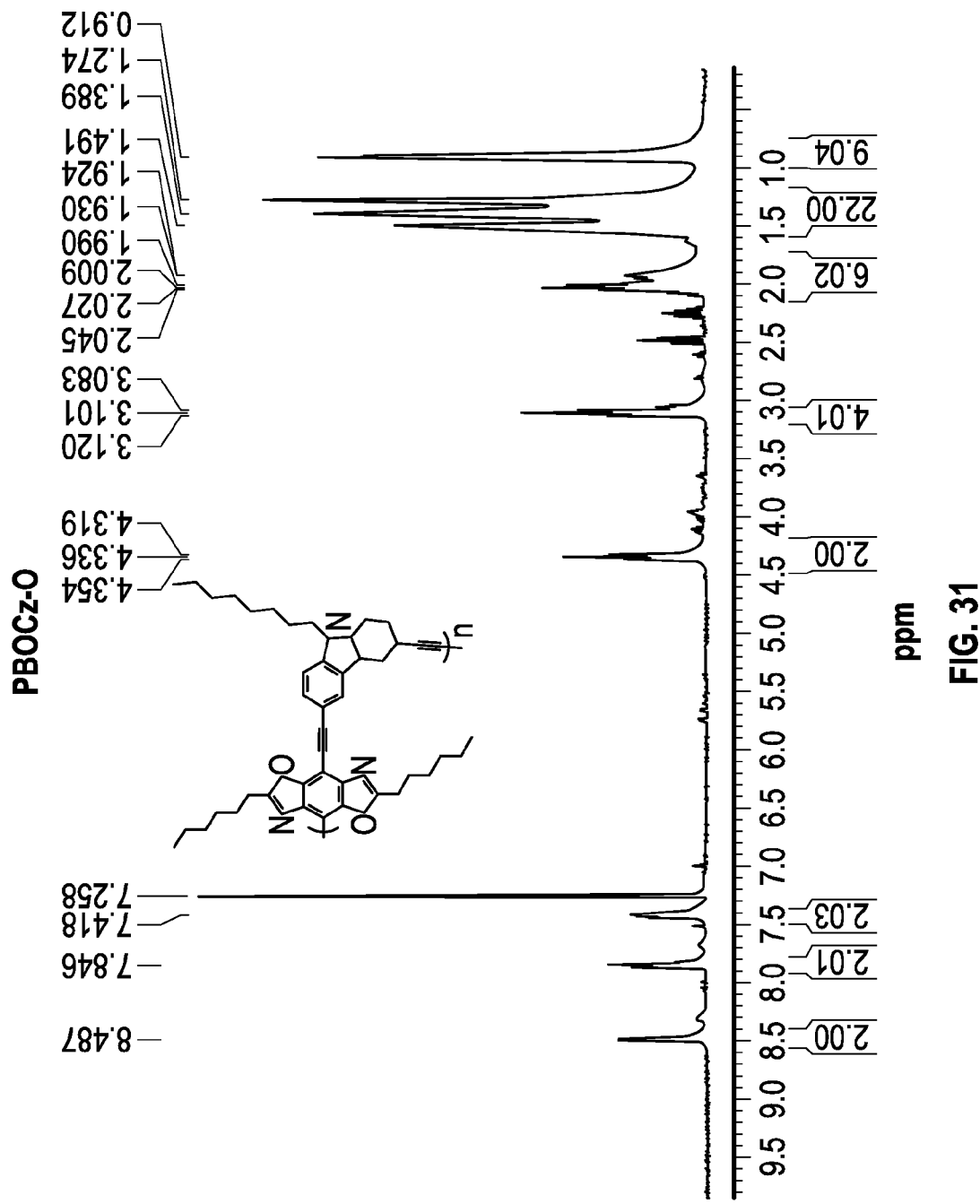
FIG. 31 illustrates a $^1$H NMR of PBOCz-O, in accordance with various embodiments.
Figure 32:
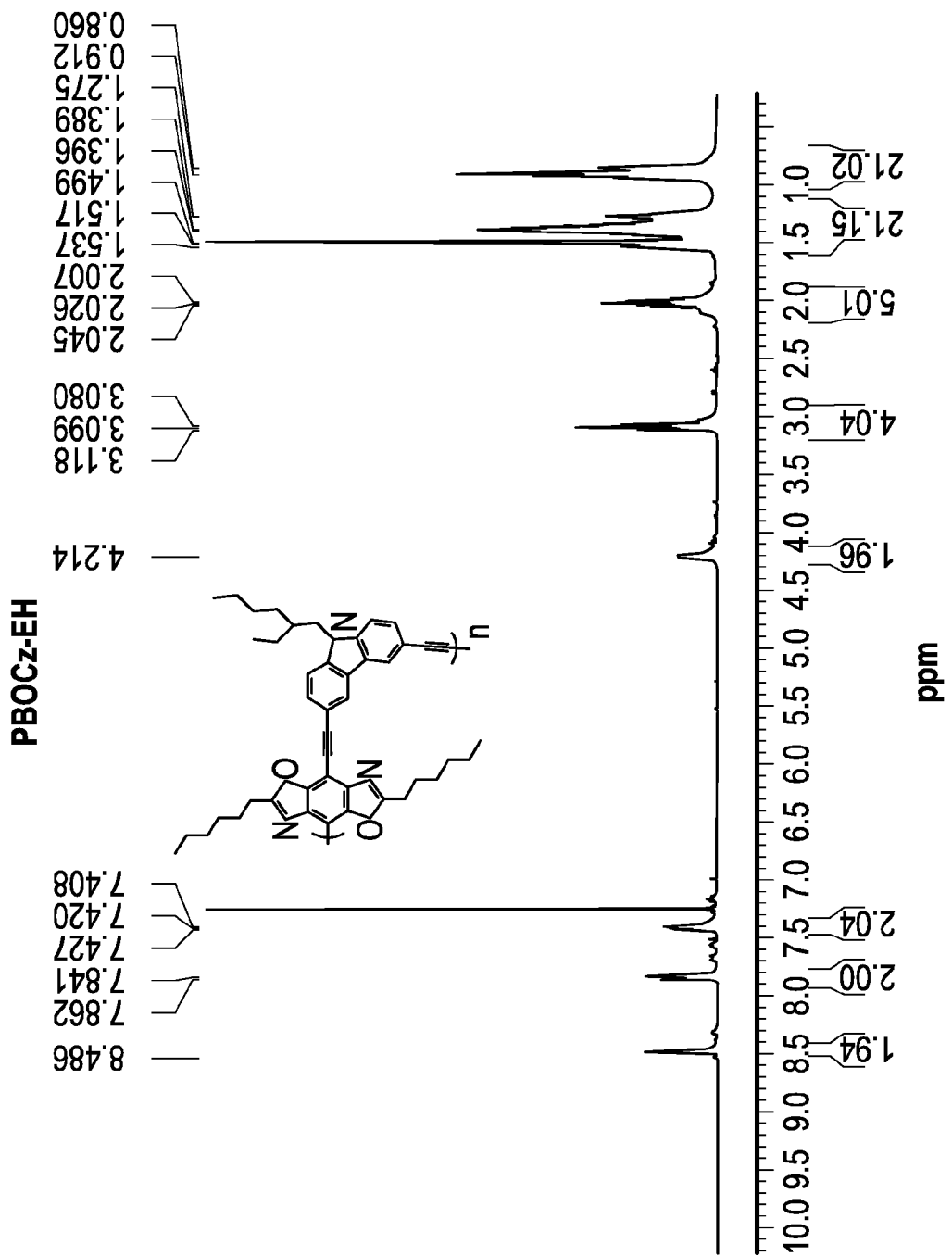
FIG. 32 illustrates a $^1$H NMR of PBOCz-EH, in accordance with various embodiments.
Figure 33:
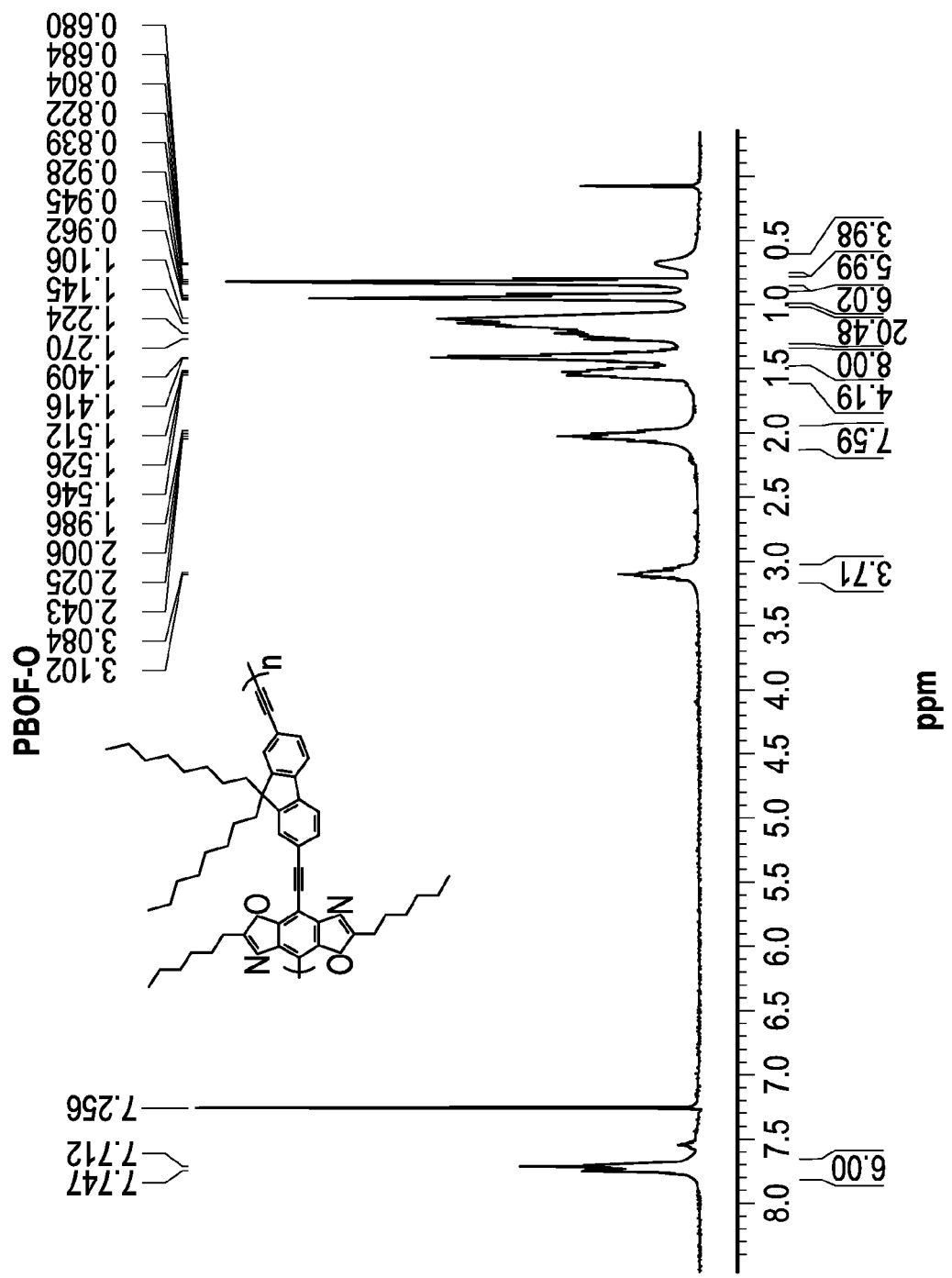
FIG. 33 illustrates a $^1$H NMR of PBOF-O, in accordance with various embodiments.
Figure 34:
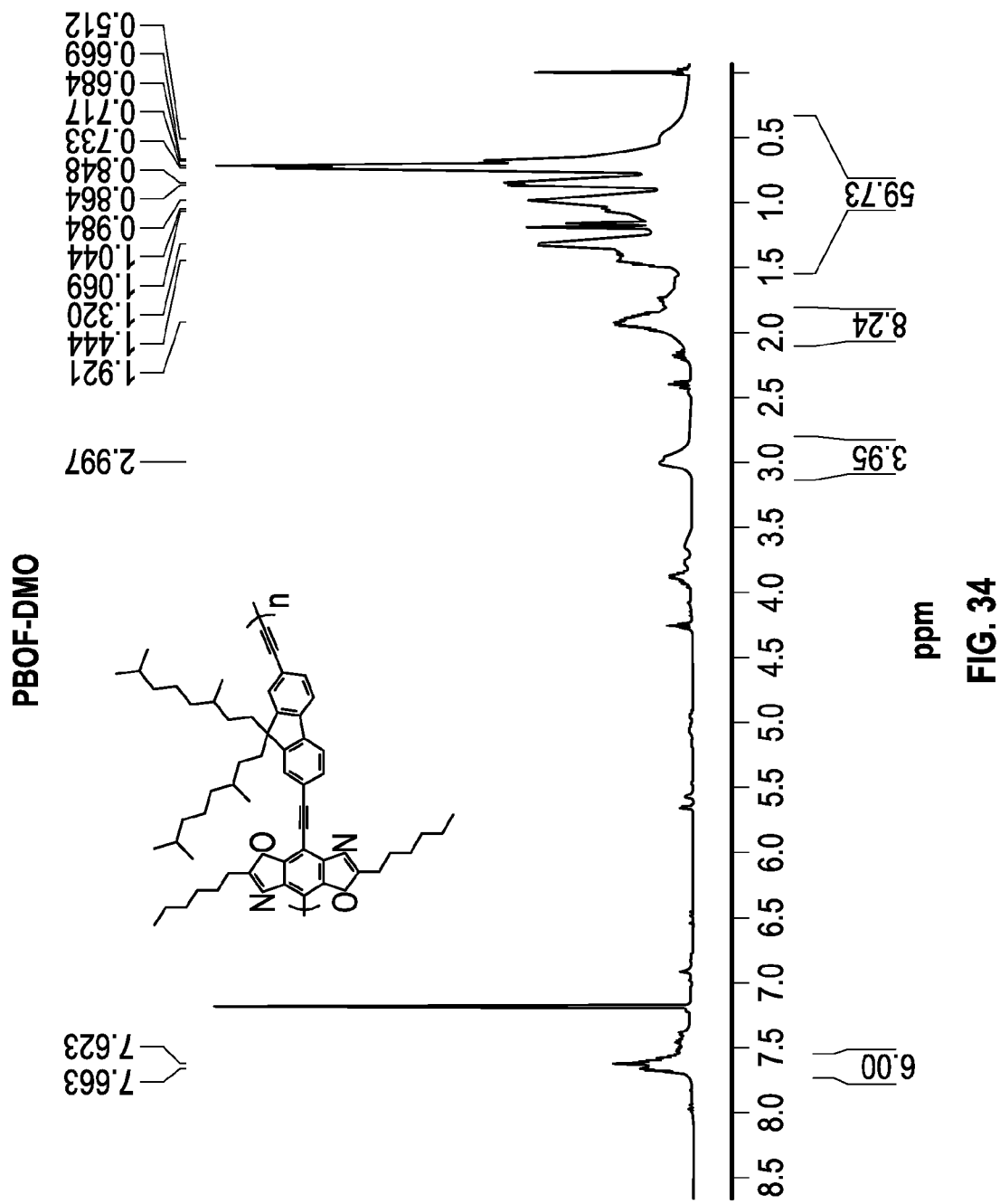
FIG. 34 illustrates a $^1$H NMR of PBOF-DMO, in accordance with various embodiments.
Figure 35:
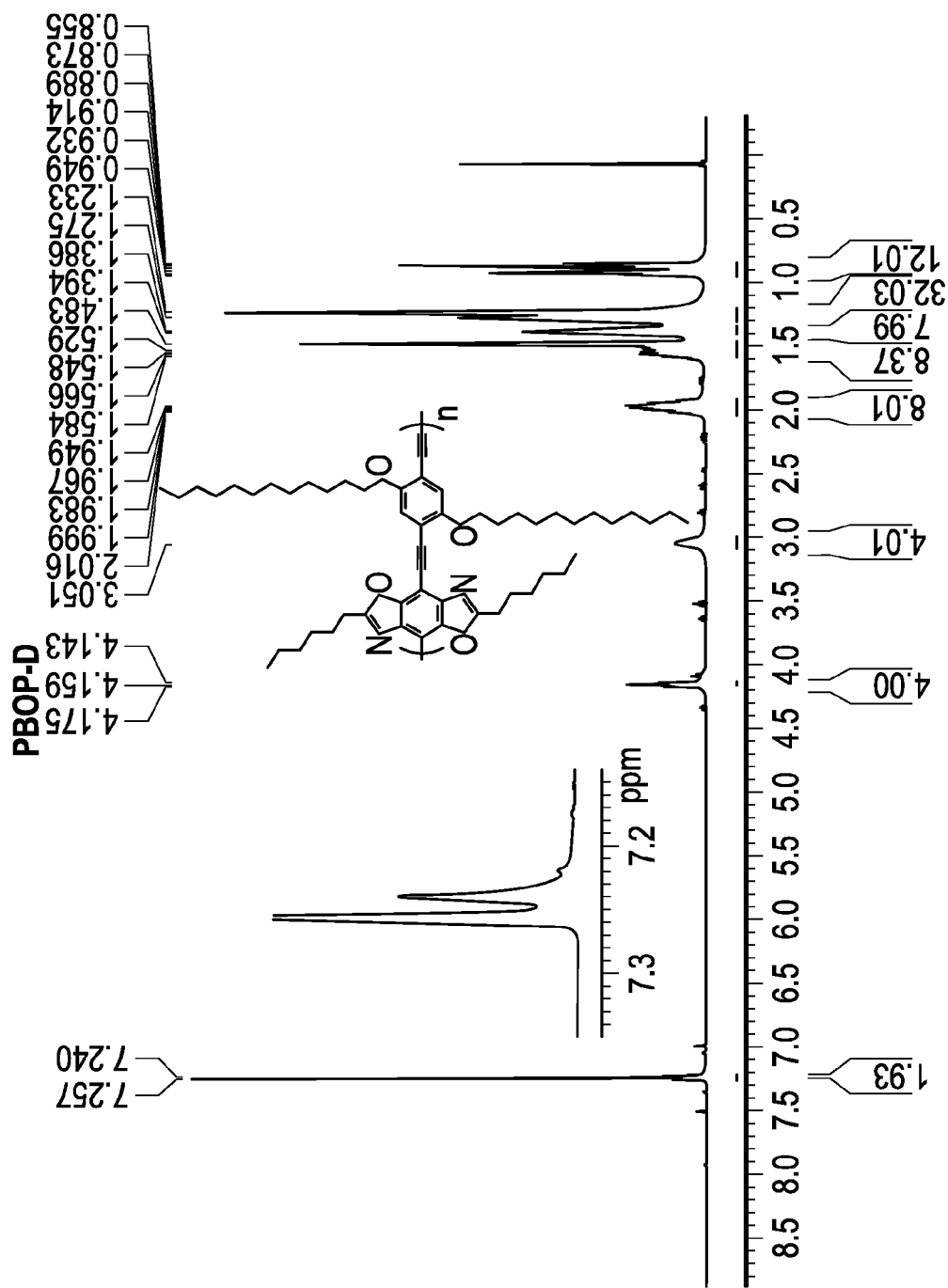
FIG. 35 illustrates a $^1$H NMR of PBOP-D, in accordance with various embodiments.
Figure 36:
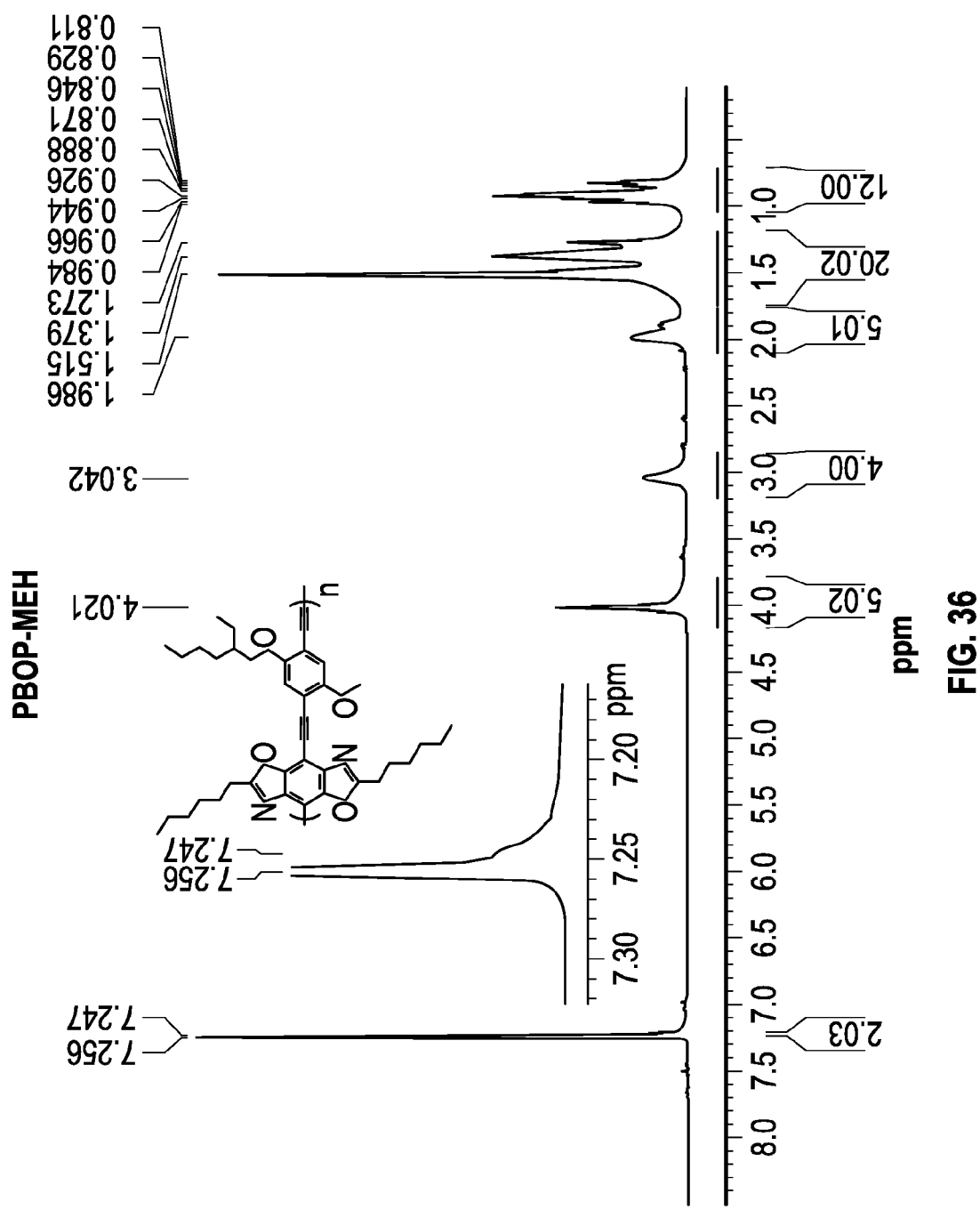
FIG. 36 illustrates a $^1$H NMR of PBOP-MEH, in accordance with various embodiments.

FIG. 25 illustrates a $^1$H NMR of 2,7-bis(trimethylsilylethynyl)-9,9-bis(3,7-dimethyloctyl)fluorene. FIG. 26 illustrates a $^{13}$C NMR of 2,7-bis(trimethylsilylethynyl)-9,9-bis(3,7-dimethyloctyl)fluorene. FIG. 27 illustrates a $^1$H NMR of 2,7-diethynyl-9,9-bis(3,7-dimethyloctyl)fluorene. FIG. 28 $^{13}$C NMR of 2,7-diethynyl-9,9-bis(3,7-dimethyloctyl)fluorene. FIG. 29 illustrates a $^1$H NMR of 4,8-dibromo-2,6-dihexylbenzo[1,2-d;4,5-d']bisoxazole. FIG. 30 illustrates a $^{13}$C NMR of 4,8-dibromo-2,6-dihexylbenzo[1,2-d;4,5-d']bisoxazole. FIG. 31 illustrates a $^1$H NMR of PBOCz-O. FIG. 32 illustrates a $^1$H NMR of PBOCz-EH. FIG. 33 illustrates a $^1$H NMR of PBOF-O. FIG. 34 illustrates a $^1$H NMR of PBOF-DMO. FIG. 35 illustrates a $^1$H NMR of PBOP-D. FIG. 36 illustrates a $^1$H NMR of PBOP-MEH.

Example 3

Conjugation Pathway in Benzobisoxazole-Containing Polymers: Effect on Physical and Electronic Properties Example 3.1

Synthesis

Monomers M-A, M-1, M-2, and M-3 were synthesized according to literature procedures. The synthetic route to monomer M-B is outlined in Scheme 2. 4,8-dibromo-2,6-dioctylbenzobisoxazole (2) was made via condensation of 1 with nonanoyl chloride in the presence of poly(trimethylsilyl phosphate) (PPSE). This was then used in a Stille cross-coupling with 2-(trimethylstannyl)-4-octylthiophene using catalytic Pd$_2$(dba)$_3$ and P(o-tolyl)$_3$ to produce 3. Bromination of 3 with NBS in acetic acid and chloroform yielded monomer M-B in good yields.
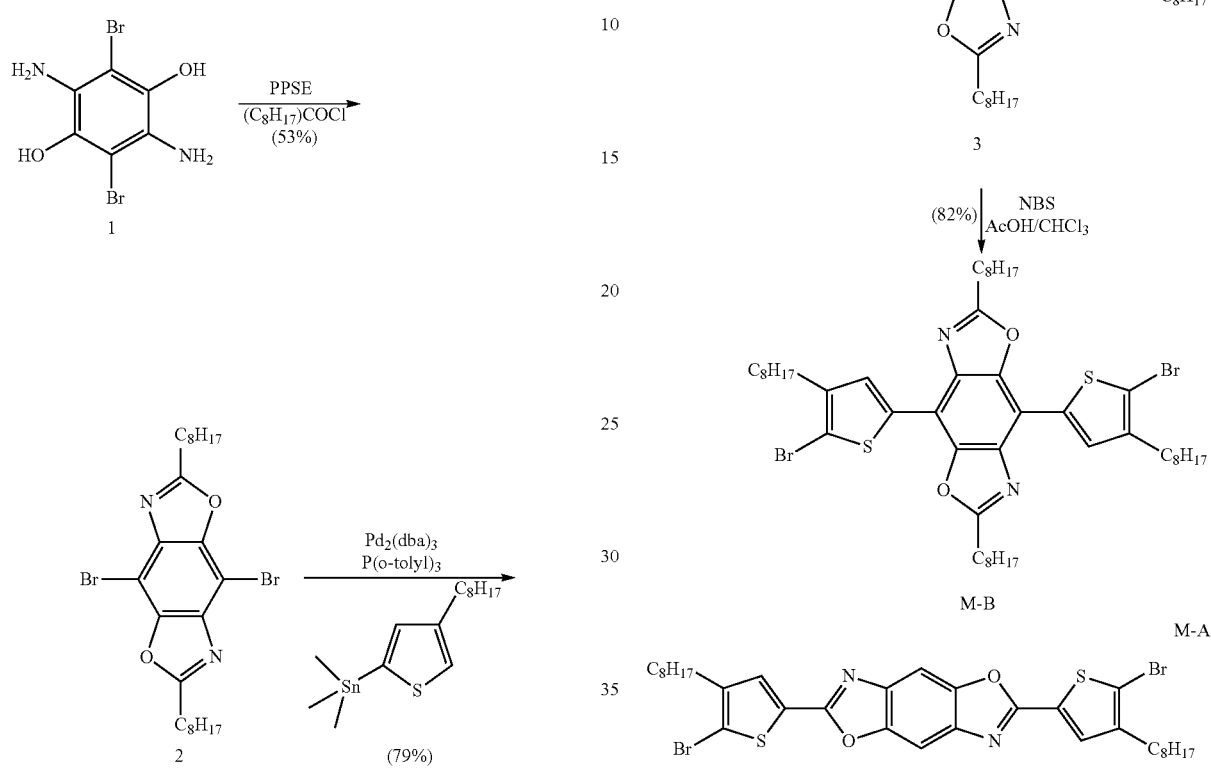
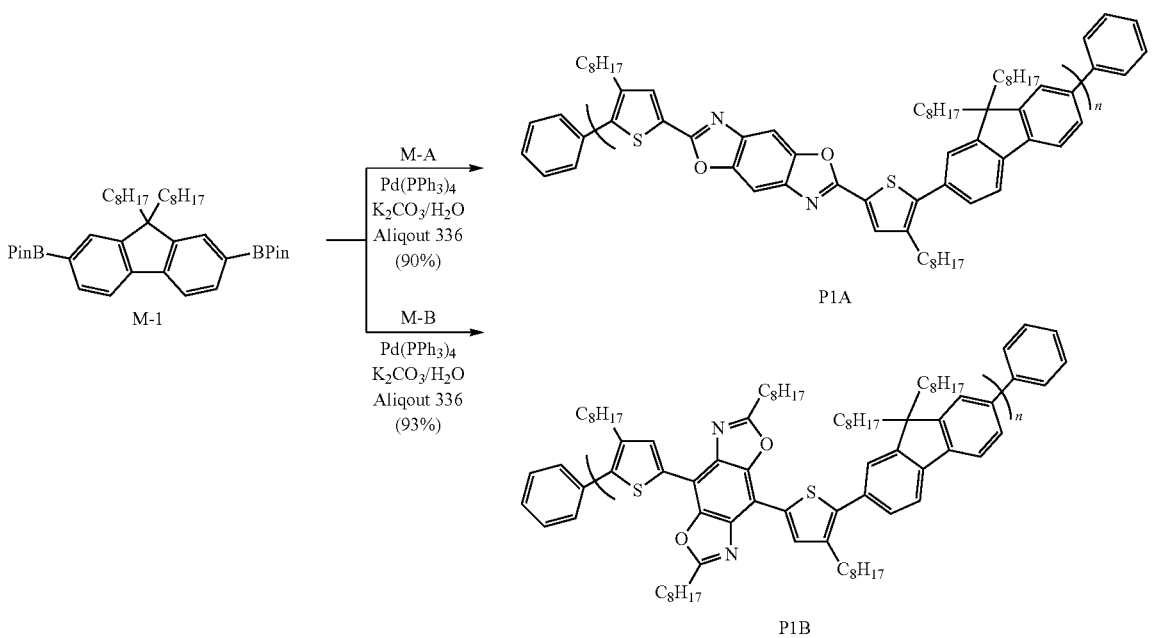

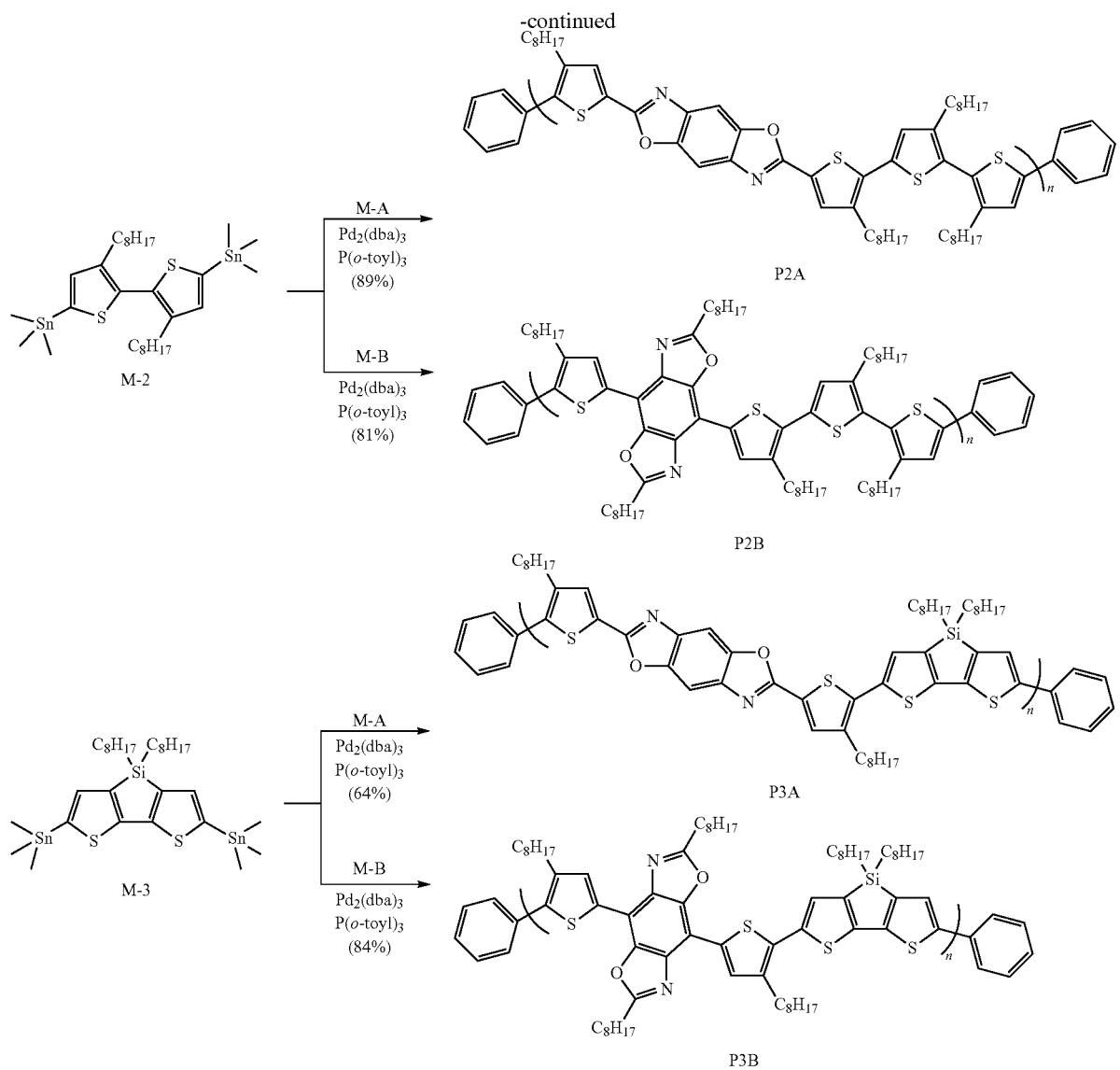

The syntheses of the six polymers are illustrated in Scheme 3. The fluorene-containing polymers P1A and P1B were made via Suzuki polymerizations between M-1 and the corresponding BBO monomer using aqueous $NaCO_3$ and catalytic $Pd(PPh_3)_4$ in toluene followed by end-capping of the polymer chains with phenyl groups. This produced polymers in good yields and molecular weights after removal of low molecular weight material. Polymer P1A should exhibit better performance in devices as reactive end groups such as boronic acids can act as low energy charge traps and non-radiative recombination sites. Polymers P2A, P2B, P3A, and P3B were synthesized via Stille polymerizations using M-2 and the corresponding BBO monomer with catalytic $Pd_2(dba)_3$ and tri-o-tolylphosphine in toluene followed by end-capping of the polymer chains with phenyl groups. All of the polymers had good solubility in common organic solvents such as chloroform, THF, o-dichlorobenzene, and toluene.

Example 3.2

Physical Properties

The molecular weights of the polymers were determined by gel permeation chromatography (GPC) using polystyrene standards in THF, the results of which are listed in Table 6. Due to its poor solubility, the molecular weights for P3A are low. The poly dispersities (PDIs) of the polymers were all in line with step-growth polymerizations (~2). The dithienosilole-containing polymers had much higher PDIs than the other polymers despite the similar reaction conditions of P3A and P3B with P2A and P2B.

TABLE 6

Physical Properties of Benzobisoxazole Polymers.

| Polymer | $M_n^a$ (kDa) | $M_w^a$ (kDa) | PDI | $DP^b$ | $T_g^c$ (°C.) | $T_m^c$ (°C.) | $T_d^d$ (°C.) |
|---|---|---|---|---|---|---|---|
| P1A | 16.1 | 29.8 | 1.8 | 17 | — | — | 327 |
| P1B | 20.2 | 44.6 | 2.2 | 17 | 142 | 202 | 356 |
| P2A | 11.7 | 29.1 | 2.5 | 13 | 198 | — | 388 |
| P2B | 11.3 | 23.6 | 2.1 | 10 | 104 | 180 | 365 |

TABLE 6-continued

Physical Properties of Benzobisoxazole Polymers.

| Polymer | $M_n{}^a$ (kDa) | $M_w{}^a$ (kDa) | PDI | $DP^b$ | $T_g{}^c$ (° C.) | $T_m{}^c$ (° C.) | $T_d{}^d$ (° C.) |
|---|---|---|---|---|---|---|---|
| P3A | 4.5 | 20.0 | 4.4 | 5 | — | — | 315 |
| P3B | 10.2 | 47.4 | 4.6 | 9 | — | — | 342 |

$^a$Determined by GPC in THF using polystyrene standards.
$^b$Degree polymerization calculated from the number averaged molecular weight.
$^c$Glass transition ($T_g$) and melting point ($T_m$) data from second scan reported, heating rate 20° C./min under $N_2$.
$^d$5% weight loss temperature by TGA in air.

The thermal properties of the polymers were studied using thermal gravimetric analysis (TGA) and differential scanning calorimetry (DSC), the results of which are summarized in Table 6. All of the polymers had high thermal stabilities with 5% weight loss occurring above 300° C. The fluorene and dithienosilole-containing polymers show an improvement in thermal stability of 17-19° C. in the polymers featuring conjugation pathway B over the pathway A polymers. This is not a particularly large improvement and the trend does not exist in the bithiophene-containing polymers, which shows a higher thermal stability in the polymer containing pathway A. Only three of the polymers, P1B, P2A, and P2B, showed endotherms corresponding to glass transition temperatures. Of those, P1B and P2B had melting points at 202 and 180° C., respectively. No previously reported benzobisoxazole-containing polymer has exhibited a melting point below its decomposition temperature. P2A has been measured to have a $T_g$ of only 84.6° C., synthesized using boronic acid and bromine end groups that could have an impact on the solid state packing of the material, lowering its $T_g$ into an observable temperature range. The increase in $T_g$ seen here may be the result of the larger molecular weight of the polymer.

All of the polymers showed either $T_g$s or $T_d$s above typical operating temperatures of organic electronic devices and although there is a very limited selection from which to draw conclusions from, it appears the 4,8-BBO-containing polymers exhibit lower glass transition temperatures. In all likelihood, this is more of an effect of the introduction of flexible side chains to the 4,8-BBO and not necessarily a consequence of changing the conjugation pathway of the polymer. It is entirely possible, however, that pathway B causes twisting of the polymer's backbone to a greater extent than pathway A, reducing its ability to π-stack efficiently, lowering its $T_g$. If the latter is true, a large increase in the optical bandgap of the polymers utilizing pathway B would be seen, due to a reduced effective conjugation length. However, no such increase was observed.

Example 3.3

Optical Properties

Figure 16A:
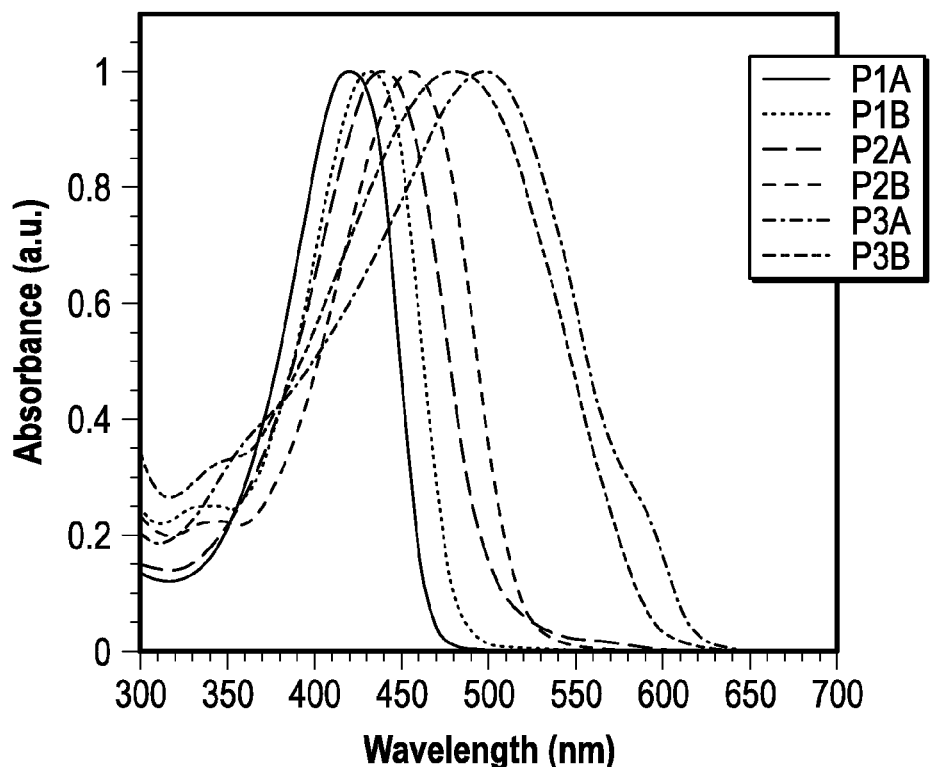
FIGS. 16a-b illustrate UV-Vis absorption spectra of polymers in solution (left) and as thin films (right), in accordance with various embodiments.
Figure 16B:
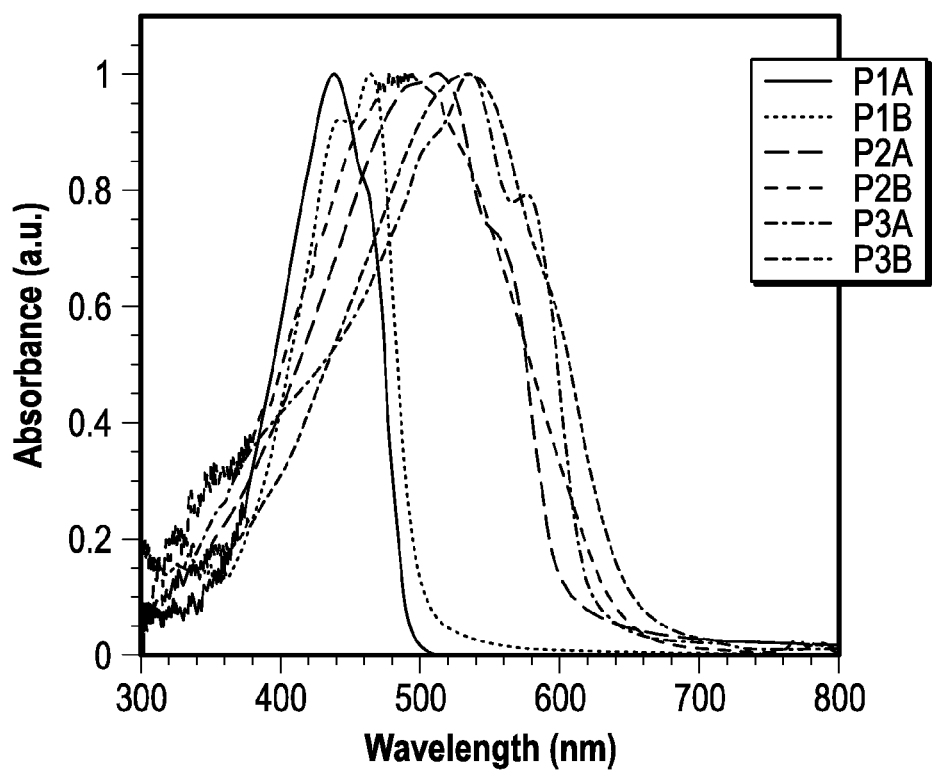

The optical properties of the polymers were examined using UV-Vis and fluorescence spectroscopy, the results of which are summarized in Table 7. The UV-Vis absorption spectra of the polymers in solution and as thin films are shown in FIGS. 16a-b. The fluorene-containing polymers P1A and P1B had the shortest wavelength absorption of the six polymers in solution. P1B had an absorption that was red-shifted 13 nm with respect to P1A's absorption. In films, these two polymers had maximum absorptions that were red-shifted 18 nm and 32 nm for P1A and P1B, respectively, compared to their solution absorption maxima. The difference in the shift appears to be the result in differing intensities of two different electronic transitions in the polymers. In film, P1A has an absorption maximum at 438 nm and a shoulder at 460 nm, while P1B has an absorption maximum at 465 nm with a shoulder at 442 nm. This suggests that the overall spectrum of P1A and P1B is only separated by 4-5 nm, a slightly smaller difference than seen in solution. This means that P1A red-shifts slightly more than P1B between film and solution, indicating slightly increased aggregation in the film of P1A compared to P1B.

TABLE 7

Optical Properties of the Benzobisoxazole Polymers in Solution and Film.

| | Solution$^a$ | | | Thin Film | | $E_g{}^{opt}$ |
|---|---|---|---|---|---|---|
| Polymer | $\lambda_{max}$ (nm) | $\lambda_{em}$ (nm) | $\Phi_{rel}{}^b$ | $\lambda_{max}$ (nm) | $\lambda_{em}$ (nm) | (eV)$^c$ |
| P1A | 420 | 472 | 0.43 | 438 | 524 | 2.55 |
| P1B | 433 | 492 | 0.37 | 465 | 548 | 2.46 |
| P2A | 438 | 553 | 0.20 | 514 | 601 | 2.07 |
| P2B | 455 | 569 | 0.22 | 494 | 720 | 1.94 |
| P3A | 499 | 577 | 0.15 | 535 | 649 | 2.01 |
| P3B | 480 | 600 | 0.09 | 534 | 652 | 1.91 |

$^a$Solution measurements performed in chloroform.
$^b$Photoluminescence quantum yields measured in chloroform relative to Coumarin 152 in acetonitrile.
$^c$Optical bandgap measured from absorption onset.

Polymers P2A and P2B had absorptions in solution of 438 and 455 nm, respectively. They are red-shifted compared to the fluorene-containing polymers, which is the product of the increased donor strength of bithiophene relative to fluorene. In films, the absorption spectra of the two polymers are red-shifted to 514 nm (shifted 76 nm) and 494 nm (shifted 39 nm) compared to solution spectra. The increased red-shift of the absorptions of these polymers, compared to the fluorene-containing polymers, is the result of substituting the fluorene unit with the bithiophene. The C-9 carbon on the fluorene possesses sp$^3$ hybridization which causes the octyl chains on the fluorene to point out of the plane of the π-system, disrupting π-stacking and limiting intermolecular effects between polymer chains. This creates highly amorphous films which is evident from the x-ray diffraction analysis of the films (see FIG. 23 in the supporting information) which shows no statistically meaningful periodicity in the films. The bithiophene moiety has alkyl chains that are oriented in the plane of the π-system, leading to increased aggregation of the polymer chains and a red-shifted absorption. The larger red-shift of the P2A spectrum, relative to P2B, can be explained as increased aggregation in the films resulting from possessing fewer alkyl chains than P2B. The x-ray diffraction data of the P2A and P2B films shows no statistically meaningful periodicity in the P2A films, but does show periodicity in the P2B films, with a d-spacing of 19.6 Å. This distance correlates well with a side-by-side polymer chain configuration with the alkyl chains on adjacent polymer chains pointed towards each other. This suggests the alkyl chains on P2B helps assist in interdigitation of the alkyl chains, leading to greater order in the film. This is beneficial as increased film order is known to improve charge carrier mobilities in devices. Though there is no periodicity in the PIA films, the reduced number of alkyl chains is likely causing increased formation of amorphous aggregates in the film, resulting in the increased red-shift of its absorption.

The dithienosilole containing polymers, P3A and P3B, have the longest wavelength of absorption in solution at 499 and 480 nm, consistent with the increased donor character of the dithienosilole compared to bithiophene and fluorene. Oddly, P3A has a longer wavelength of absorption relative to P3B. This goes against the trend seen in the fluorene and bithiophene-containing polymers where the polymers possessing pathway B have a longer wavelength of absorption. There is no obvious reason for this change in trend but one possibility could be that the much higher molecular weight of P3B has a much broader distribution of HOMO energy levels than P3A, causing increased absorption at shorter wavelengths. This conclusion is somewhat supported by the film measurements of the polymers as the dithienosilole-containing polymers have nearly identical absorption maxima. The fact that P3B has a smaller optical bandgap than P3A, yet has a similar absorption maximum in film, additionally supports the notion that P3B has a broader HOMO distribution. The x-ray diffraction data is not particularly helpful in this case, as it shows periodicity in both polymers with d-spacings of 53.2 and 43.1 Å for P3A and P3B, respectively. These values are too large to correspond to co-facially stacked polymer chains or interdigitation distances of the polymers and are more likely the result of periodicity between amorphous aggregates within the film.

Figure 17:
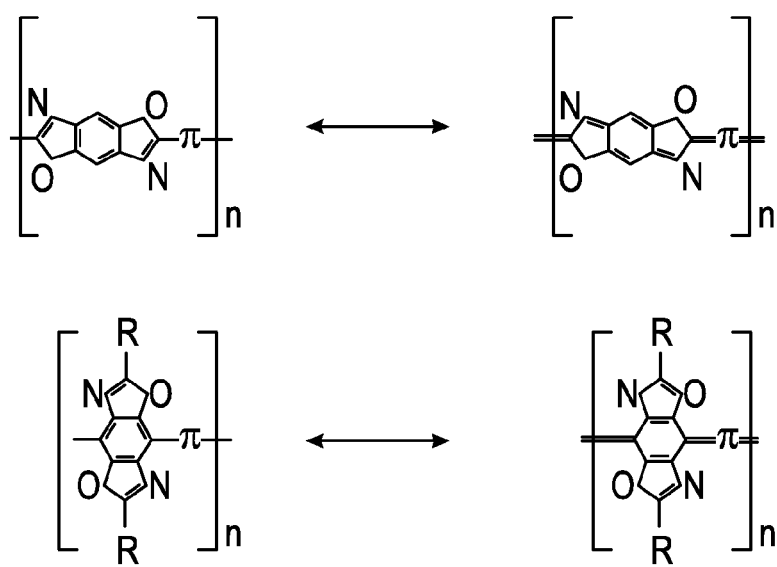
FIG. 17 illustrates benzoid and quinoid resonance structures of benzobisoxazole polymers, in accordance with various embodiments.

One trend in the optical data that stands out is that the optical bandgaps of the polymers featuring the B pathway are all around 0.1 eV smaller than the polymers containing the A pathway, without exception. The likely reason for this trend is the improved stabilization of the quinoid resonance form from pathway B. FIG. 17 illustrates how when the BBO is connected at the 2 and 6-positions, both the oxazole and benzene rings of the BBO lose their aromaticity, causing a large difference in the energy between the benzoid and quinoid resonance forms. But when the BBO is connected through the 4 and 8-positions, the oxazole rings remain aromatic in the quinoid form, lowering its energy and resulting in increased quinoid character of the polymer in the ground state. This is known to increase the HOMO energy levels while decreasing the LUMO of the polymer by extending the effective conjugation length of the π-system, narrowing the bandgap.

Figure 18A:
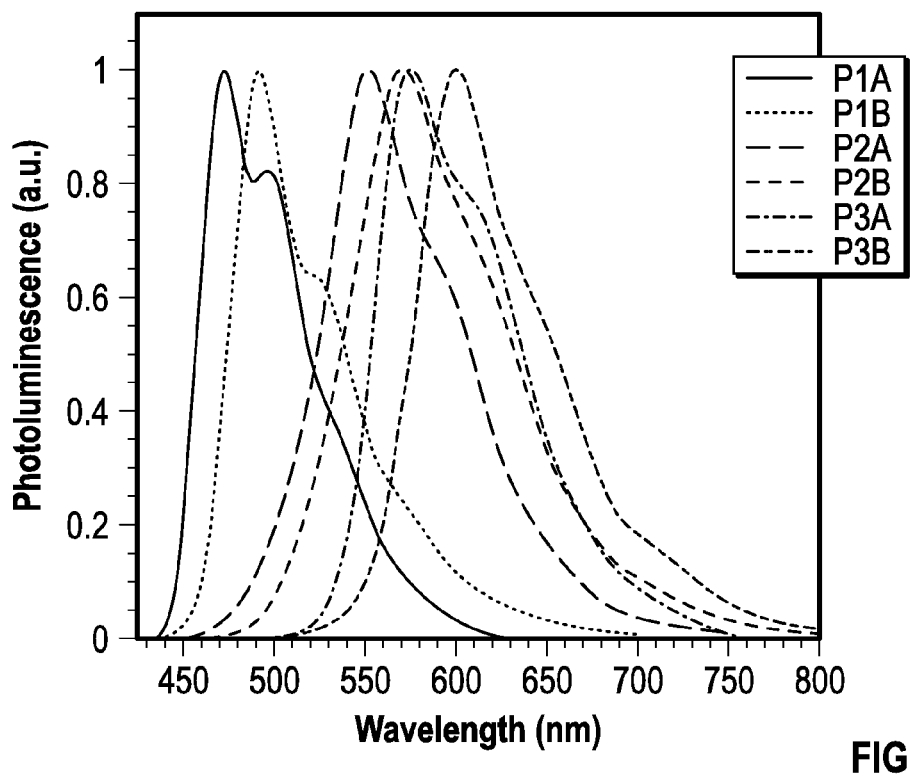
FIGS. 18a-b illustrate photoluminescence spectra of polymers in chloroform solutions (a) and as thin films (b), in accordance with various embodiments.
Figure 18B:
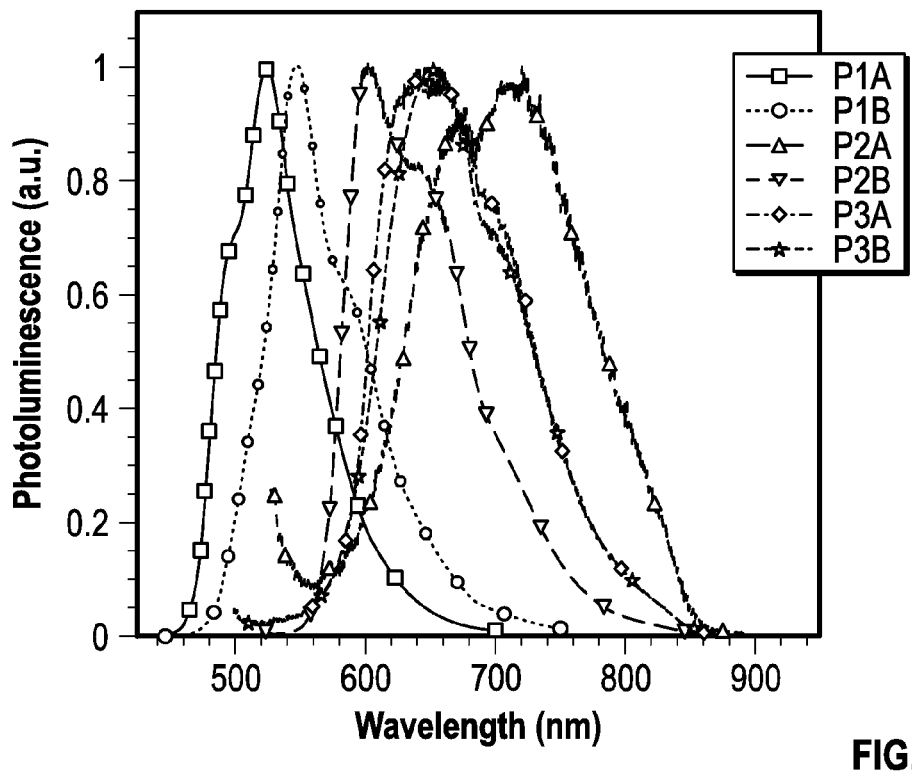

The photoluminescence (PL) spectra of the polymers in solution and as thin films are shown in FIGS. 18a-b. The fluorene-containing polymers exhibited the shortest wavelength of emission at 472 and 492 nm for P1A and P1B, respectively. In films, the emission of the polymers red-shifts to 524 and 548 nm, shifts of 52 and 56 nm for P1A and P1B, respectively, due to exciplex formation between polymers within the film. The bithiophene-containing polymers, P2A and P2B, show a similar trend in solution with P2B having a longer wavelength of emission at 569 nm than P2A (553 nm). In films, however, P2B has a much more drastic red-shift than P2A. P2A red-shifts between solution and film to 601 nm (a 48 nm shift) while P2B red-shifts to 720 nm (a shift of 151 nm). The extremely large red-shift seen in the P2B films is surprising and it can be noted that P2B films (as well as P3A and P3B films) was extremely weakly fluorescent, with the noise in the PL spectra being a consequence of this fact. This behavior is not seen in P3A or P3B, however, despite also being weak fluorophores. As seen in the previously mentioned polymers, the pathway B-containing P3B shows a longer wavelength of emission than the pathway A-containing P3A, with emission maxima of 577 and 600 nm for P3A and P3B, respectively. The photoluminescence of the polymers red-shifts to 649 and 652 nm in films, corresponding to shifts of 72 and 52 nm, respectively. The larger red-shift in the pathway A-containing P3A is not consistent with the fluorene and bithiophene-containing polymers and the data as a whole suggests that how the two BBO moieties effect intermolecular interactions is highly dependent on the donor-acceptor system.

Photoluminescence quantum yield measurements of the polymers were taken in dilute chloroform solutions relative to coumarin 152 in acetonitrile and the results are summarized in Table 7. The quantum yields of the polymers decreased with increased acceptor strength and there was no significant change in the quantum yields between the two different conjugation pathways. Of the six polymers, only P1A and P1B were reasonably efficient fluorophores in solution. This suggests these two polymers are candidates as active materials in OLEDs.

Example 3.4

Electrochemical Properties

Electrochemical analysis of the polymers was performed using differential pulse voltammetry (DPV), with the resulting data summarized in Table 8. Of the six polymers, only P1A showed a reduction wave. Ultraviolet photoelectron spectroscopy measurements of this polymer indicate that that DPV gives an accurate measurement of the ionization potential of the polymer but largely underestimates the electron affinity. This is why the measured electrochemical bandgap of P1A (3.06 eV) is so much larger than the optical bandgap of 2.55 eV. This fact, coupled with the use of the optical bandgaps to calculate the electron affinities of the other polymers, suggests a better approach to comparing frontier orbital energy levels of the polymers may be to use electron affinity values obtained from subtracting the optical bandgap from the IP for each polymer. This gives P1A an EA of −3.12 eV, instead of the measured −2.61 eV.

TABLE 8

Electrochemical Properties of Benzobisoxazole Polymers[a].

| Polymer | $E^{ox}_{onset}$ (V) | HOMO[b] (eV) | $E^{red}_{onset}$ (V) | LUMO[c] (eV) |
|---|---|---|---|---|
| P1A | 0.87 | −5.67 | −2.19 | −3.12, −2.61[d] |
| P1B | 0.64 | −5.44 | — | −2.98 |
| P2A | 0.82 | −5.62 | — | −3.55 |
| P2B | 0.43 | −5.23 | — | −3.29 |
| P3A | 0.37 | −5.17 | — | −3.16 |
| P3B | 0.39 | −5.19 | — | −3.28 |

[a]Differential pulse voltammetry performed using a three-electrode cell with a Ag/AgNO$_3$ reference electrode, a platinum wire counter electrode, and a platinum button working electrode cast with a polymer film. Measurements performed in a 0.1 M Bu$_4$NPF$_6$ acetonitrile solution as the electrolyte and then referenced to Fc/Fc$^+$.
[b]Ionization potentials calculated using IP = −4.8 − ($E^{ox}_{onset}$).
[c]Electron affinities calculated from the optical bandgap using EA = IP − $E_g^{oPt}$.
[d]Electron affinity calculated from EA = −4.8 − ($E^{red}_{onset}$).

The polymers show a general trend of higher HOMO energy levels for the pathway B-containing polymers. This is consistent with the notion that pathway B leads to increased quinoid character, simultaneously increasing the HOMO energy level and decreasing the LUMO energy level. The LUMO energies for the polymers are generally lower for the pathway A-containing polymers, though. This indicates that when the conjugation pathway of the polymer goes directly through the oxazole rings, the BBO acts as a stronger acceptor, resulting in lower lying LUMOs.

These trends are not as well defined in the dithienosilole polymers. P3A and P3B have virtually identical HOMO energy levels while the LUMO of P3B is much deeper than P3A. This may be the result of differences in donor-acceptor orbital mixing in these polymers due to contributions from the electron deficient silole ring in the dithienosilole. It may be that the silole is a better acceptor than one or both of the BBO moieties. If this is the case it will have a heavy influence over the HOMO and LUMO energy levels that doesn't exist in the fluorene and bithiophene-containing polymers.

Example 3.4

Summary

Two different benzobisoxazole systems were examined, one with a conjugation pathway through the oxazole rings and the other with a conjugation pathway through the central benzene ring of the moiety. The structure-property relationships of the two systems were examined by making six donor-acceptor polymers and studying the changes in the physical and electronic properties caused by the difference in conjugation pathway. It was found that polymers with a conjugation pathway through the oxazole rings had higher ionization potentials, suggesting this configuration led to increased electron accepting strength of the moiety. Polymers featuring a conjugation pathway through the central benzene ring had narrower bandgaps due to improved stabilization of the polymer's quinoid resonance form. This configuration also allowed for alkyl functionalization on the benzobisoxazole which resulted in lower glass transition temperatures and melting points for these polymers. Further work is currently underway to fabricate OLEDs and OPVs out of these materials to study how the change in conjugation pathway affects the performance in organic electronic devices.

4. Experimental Methods for Example 3

Materials. 3,6-Diamino-2,5-dibromo-1,4-hydroquinone (1), 2-trimethylstannyl-4-octylthiophene, 2,6-bis(2-bromo-3-dodecyl-thiophene-5-yl)benzo[1,2-d;4,5-d']bisoxazole (M-A), 2,7-bis(4,4,5,5-tetramethyl-1,3,2-dioxaborolan-2-yl)-9,9-dioctylfluorene (M–1), 5,5'-bis(trimethylstan-nyl)-3,3'-dioctyl-2,2'-bithiophene (M–2), and 4,4-dioctyl-2,6-bis(trimethylstannyl)dithieno[3,2-b:2',3'-d]silole (M-3) were made according to literature procedures. Toluene was dried using an Innovative Technologies solvent purification system. Tetrakis(triphenylphosphine)palladium(0) was purchased from Strem Chemicals. Spectral grade coumarin-152 was purchased from Exciton. Poly(3,4-ethylenedioxythiophene):poly(4-styrenesulfonate) (PEDOT:PSS) was purchased from H. C. Stark. All other chemicals were purchased from Sigma Aldrich and used without further purification.

Example 4.1

4,8-dibromo-2,6-dioctylbenzo[1,2-d;4,5-d']bisoxazole (2)

A dry 2-neck 250 mL flask was purged with argon and poly(trimethylsilyl phosphate) (18.0 g, 118 mmol) was added followed by o-DCB (65 mL). The solution was then degassed by bubbling argon through it for 30 minutes. Freshly prepared 3,6-diamino-2,5-dibromo-1,4-hydroquinone (6.55 g, 23.0 mmol) and nonanoyl chloride (9.72 g, 55.0 mmol) were then added and the mixture was heated to 90° C. under an argon atmosphere for 72 hrs. The solution is concentrated by vacuum distillation of the o-DCB and the remaining liquid precipitated into methanol (200 mL). The precipitated product was filtered and washed with methanol. The product was then dissolved in hot hexanes, hot gravity filtered, and then allowed to recrystallize to yield white needles (6.35 g, 53%): mp 96-98° C.; 1H NMR (400 MHz, CDCl3) δ: 0.88 (t, J=8 Hz, 6H), 1.27-1.36 (m, 16H) 1.45 (m, 4H), 1.93 (q, J=8 Hz, 4H), 3.01 (t, J=8 Hz, 4H); 13C NMR (100 MHz, CDCl3) δ: 14.3, 22.8, 27.2, 29.21, 29.28, 29.3, 29.4, 32.0, 91.4, 138.6, 146.7, 169.4; HRMS (ESI, m/z): [M+H]+ Calcd for $C_{24}H_{35}N_2O_2Br_2$, 541.1060. found 541.1062.

Example 4.2

4,8-Bis(4-octylthien-2-yl)-2,6-dioctylbenzo[1,2-d;4,5-d']bisoxazole (3)

To a dry 250 mL round-bottom flask was added compound 2 (2.71 g, 5 mmol), 2-(trimethylstannyl)-4-octylthiophene (3.95 g, 11 mmol), tri-o-tolylphosphine (122 mg, 8 mol %), and toluene (100 mL). The mixture was deoxygenated by bubbling argon through it for 30 minutes. Tris(dibenzylideneacetone)dipalladium(0) (137 mg, 3 mol %) was then added and the reaction was refluxed under argon for 24 hours. After cooling the mixture to room temperature, it was passed through a silica gel plug using an eluent of 9:1 hexanes: ethylacetate. The solvent was evaporated and the residue was recrystallized from hexanes to yield a yellow solid (3.04 g, 79% yield). Mp 95-96° C.; $^1$H NMR (CDCl$_3$) δ: 0.89 (t, J=6.8 Hz, 12H), 1.30 (br m, 36H), 1.53 (m, J=7.6 Hz, 4H), 1.72 (m, J=7.6 Hz, 4H), 2.00 (m, J=7.6 Hz, 4H), 2.73 (t, J=8 Hz, 4H), 3.09 (t, J=7.6 Hz, 4H), 7.10 (s, 2H), 8.15 (s, 2H); $^{13}$C NMR (CDCl$_3$) δ: 14.10, 14.11, 22.66, 22.68, 26.87, 29.02, 29.17, 29.25, 29.26, 29.31, 29.39, 29.50, 30.55, 31.84, 31.91, 107.69, 122.06, 130.02, 133.86, 135.38, 143.59, 144.35, 167.59; HRMS (ESI, m/z): [M+H]$^+$ Calcd for $C_{48}H_{73}N_2O_2S_2$, 773.5108. found 773.5113.

Example 4.3

4,8-Bis(5-bromo-4-octylthien-2-yl)-2,6-dioctylbenzo[1,2-d;4,5-d']bisoxazole

M-B

Compound 3 (1.16 g, 1.5 mmol), glacial acetic acid (12.5 mL), and chloroform (50 mL) were added to a round-bottom flask and stirred while gently heating the mixture until all solid was dissolved. The mixture was then cooled to room temperature before adding N-bromosuccinimide (547.3 mg, 3.075 mmol) as a single portion. The solution was stirred in the dark for 48 hours and then poured into water (100 mL). The mixture was diluted with chloroform (75 mL) and separated from the aqueous layer. It was then washed with 1M aqueous potassium hydroxide solution (120 mL) and brine before drying over magnesium sulfate. After evaporation of the solvent, the crude residue was purified via silica gel column chromatography using an eluent of 4:1 hexanes:toluene. Evaporation of the solvent gave the product as a yellow solid (1.15 g, 82% yield). Mp=74-75° C.; $^1$H NMR (CDCl$_3$) δ: 0.88 (m, 12H), 1.29-1.42 (br m, 32H), 1.53 (m, J=8 Hz, 4H), 1.69 (m, J=7.6 Hz, 4H), 1.99 (m, J=7.6 Hz, 4H), 2.67 (t, J=8 Hz, 4H), 3.07 (t, J=7.6 Hz, 4H), 7.96 (s, 2H); $^{13}$C NMR (CDCl$_3$) δ: 14.01, 14.11, 22.66, 22.68, 26.83, 28.94, 29.18, 29.22, 29.25, 29.28, 29.29, 29.44, 29.58, 29.82, 31.84, 31.90, 107.06, 112.06, 129.40, 133.84, 135.24, 142.32, 143.95, 167.70; HRMS (ESI, m/z): [M+H]$^+$ Calcd for $C_{48}H_{71}Br_2N_2O_2S_2$, 929.3318. found 929.3305.

Example 4.4

P1A

Monomers M-1 (321.4 mg, 0.5 mmol) and M-A (353.2 mg, 0.5 mmol) were added to a Schlenk flask and placed under an argon atmosphere. 2M aqueous sodium carbonate (5 mL), toluene (7.5 mL), and 2 drops of Aliquat 336 were then added and the mixture was deoxygenated by bubbling argon through it for 30 minutes.
Tetrakis(triphenylphosphine)palladium(0) (11.6 mg, 2 mol %) was then added and the mixture was refluxed under argon for 4 days. A drop of 4,4,5,5-tetramethyl-2-phenyl-1,3,2-dioxaborolane was then added and the reaction was refluxed for another 2 hours. Two drops of iodobenzene were then added and the mixture was refluxed overnight. The polymer was then precipitated twice in methanol (100 mL) and then washed sequentially with methanol, acetone, and chloroform in a Soxhlet extractor. The chloroform extract was evaporated to yield the polymer as a yellow solid (420 mg, 90% yield). $^1$H NMR (CDCl$_3$) δ: 0.81-0.91 (16H), 1.10-1.43 (40H), 1.73 (4H), 2.05 (4H), 2.79 (4H), 7.52 (4H), 7.82 (2H), 7.86 (4H).

Example 4.5

P1B

The polymer was made using the same procedure as P1A using monomer M-B (465.5 mg, 0.5 mmol) in place of M-A. The reaction yielded the polymer as a yellow solid (540 mg, 93% yield). $^1$H NMR (CDCl$_3$) δ: 0.84-0.90 (22H), 1.14-1.43 (56H), 1.59 (4H), 1.78 (4H), 2.06 (8H), 2.85 (4H), 3.14 (4H), 7.57 (4H), 7.80 (2H), 8.25 (2H).

Example 4.6

P2A

Monomers M-2 (358.2 mg, 0.5 mmol) and M-A (465.5 mg, 0.5 mmol) were added to a flame-dried Schlenk flask and placed under an argon atmosphere. Tri-o-tolylphosphine (12.2 mg, 8 mol %) and toluene (10 mL) were added and the mixture was deoxygenated by bubbling argon through it for 30 minutes.
Tris(dibenzylideneacetone)dipalladium(0) (9.2 mg, 2 mol %) was then added and the mixture was reflux for 3 days under argon. A drop of trimethylphenyltin was then added and the reaction was refluxed an additional 2 hours. Two drops of iodobenzene was then added and the reaction was refluxed overnight. The polymer was then precipitated twice in methanol and then washed sequentially in methanol, acetone, and chloroform in a Soxhlet extractor. The chloroform extract was then evaporated to yield the polymer as a red solid (417 mg, 89% yield). $^1$H NMR (CDCl$_3$) δ: 0.89 (12H), 1.28 (38H), 1.64 (6H), 1.75 (4H), 2.61 (4H), 2.86 (4H), 7.12 (2H), 7.80 (4H).

Example 4.7

P2B

Polymer was made using the same procedure as P2A using monomer M-B (465.5 mg, 0.5 mmol) in place of M-A. The reaction yielded the polymer as a red solid (470 mg, 81% yield). $^1$H NMR (CDCl$_3$) δ: 0.89 (18H), 1.31-1.47 (56H), 1.59 (4H), 1.68 (4H), 1.81 (4H), 2.05 (4H), 2.65 (4H), 2.94 (4H), 3.14 (4H), 7.17 (2H), 8.20 (2H).

Example 4.8

P3A

Monomers M-3 (372.2 mg, 0.5 mmol) and M-A (353.3 mg, 0.5 mmol) were added to a flame-dried Schlenk flask. Tri-o-tolylphosphine (12.2 mg, 8 mol %) and toluene (10 mL) were then added and the mixture was deoxygenated by bubbling argon through it for 30 minutes. Tris(dibenzylideneacetone)dipalladium(0) (9.2 mg, 2 mol %) was then added and the reaction was refluxed for 24 hours under argon. A drop of trimethylphenyltin was added to the reaction and then refluxed an additional 2 hours. Two drops of iodobenzene was then added and the reaction was then refluxed overnight. The reaction was cooled to room temperature and the polymer was precipitated twice in methanol. It was then washed sequentially with methanol, acetone, and chloroform in a Soxhlet extractor. The chloroform extract was evaporated to yield the polymer as a purple solid (310 mg, 64% yield). $^1$H NMR (CDCl$_3$) δ: 0.89-1.01 (22H), 1.27 (34H), 1.63 (4H), 1.76 (4H), 2.87 (4H), 7.80 (4H).

Example 4.9

P3B

Polymer was made using the same procedure as P3A using monomer M-B (465.5 mg, 0.5 mmol) in place of M-A. The reaction yielded the polymer as a purple solid (503 mg, 84% yield). $^1$H NMR (CDCl$_3$) δ: 0.88 (18H), 1.02 (4H), 1.31 (64H), 1.80 (4H), 2.03 (4H), 2.94 (4H), 3.11 (4H), 8.19 (4H).

Example 4.10

Characterization

NMR spectra were obtained on a Varian MR-400 at 400 MHz using CDCl$_3$ as the solvent and all samples were referenced to their internal protonated solvent. High-resolution mass spectra were recorded on a double focusing magnetic sector mass spectrometer using EI at 70 eV. Gel permeation chromatography (GPC) measurements were performed on a Viscotek GPC Max 280 separation module equipped with three 5 μm I-gel columns connected in a series (guard, HMW, MMW and LMW) with a refractive index and UV-Vis detector. Analyses were performed at 35° C. using THF as the eluent with the flow rate at 1.0 mL/min. Calibration was based on polystyrene standards. Fluorescence spectroscopy and UV-Visible spectroscopy were obtained using polymer solutions in chloroform, and thin films. The films were made by spin-coating 25×25×1 mm glass slides, using a solution of 10 mg of polymer per 1 mL o-dichlorobenzene at a spin rate of 1000 rpms on a Spin-Coater. Thermal gravimetric analysis measurements were made within the temperature interval of 30° C.-850° C., with a heating rate of 20° C./minute, under ambient atmosphere. Differential scanning calorimetry was performed with a first scan at a heating rate of 15° C./min to erase thermal history and a second scan to measure transitions from 0° C. to 250° C. under nitrogen. Transitions were also measured with cooling at 15° C./min. Differential pulse voltammetry was performed on an eDaq e-corder 410 potentiostat using a three-electrode cell (electrolyte: 0.1M nBu$_4$NPF$_6$ in acetonitrile) with an Ag/Ag+ reference electrode, a platinum auxiliary electrode, and a platinum button electrode as the working electrode. Polymer films were made by drop coating a 2.5 mg/mL solution of the polymers in 3:1 chloroform:o-dichlorobenzene on to the working electrode. All films were dried at 120° C. for 2 hours in a vacuum oven prior to use. All differential pulse voltammetry experiments were carried out under argon atmosphere and were recorded at a scan rate of 125 mV/s, a pulse height of 100 mV, a pulse width of 25 ms, a ramp width of 50 ms, and a sampling period of 10 ms. Photoluminescence quantum yields were measured in dilute chloroform solutions relative to coumarin 152 in acetonitrile. X-ray data was collected using a Rigaku Ultima IV X-ray Diffractometer equipped with a cross-beam optics and a point focus Cu x-ray tube emitting Kα radiation (1.541 Å). X-rays were generated under a 2.2 kW total load (40 kV and 44 mA). Powder diffraction studies were performed with parallel beam geometry and a θ/2θ goniometer. Samples were first aligned with the beam using a moveable sample stage (MPA-U4 Eulerian cradle) in order to prevent collection of diffraction data from the sample plate. The incident angle of the beam was varied between 0.02° and 0.1° at increments of 0.02° in order to minimize internal reflectance; samples were then scanned from 1°-10° 2θ.

Example 4.11

Additional Data for Example 4

Figure 19:
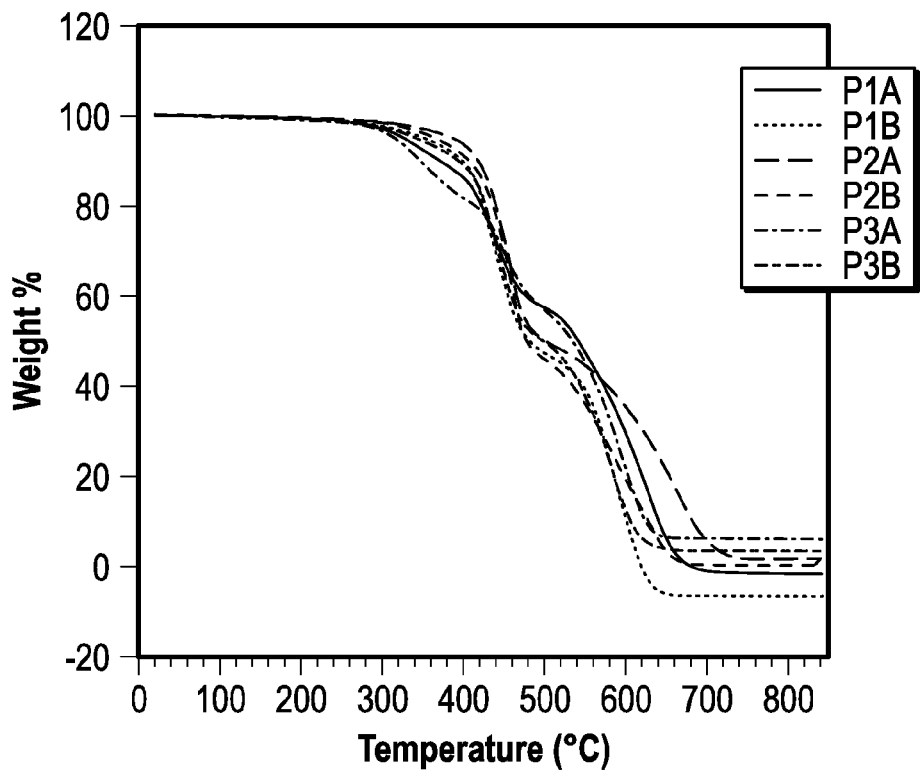
FIG. 19 illustrates a thermal gravimetric analysis of benzobisoxazole polymers, in accordance with various embodiments.
Figure 20A:
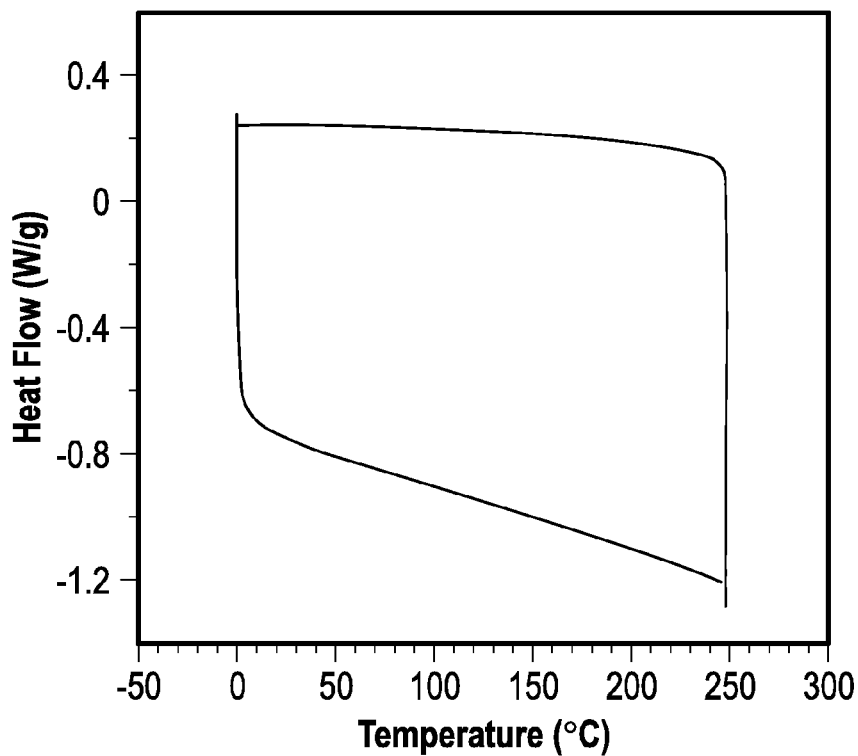
FIGS. 20a-b illustrate differential scanning calorimetry plots for P1A (a) and P1B (b), in accordance with various embodiments.
Figure 20B:
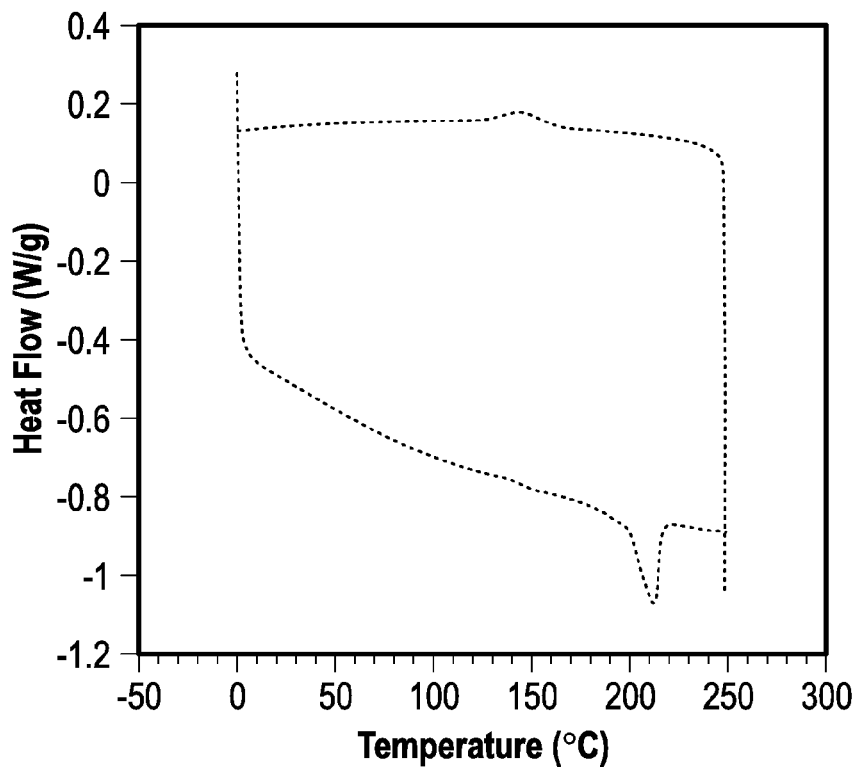
Figure 21A:
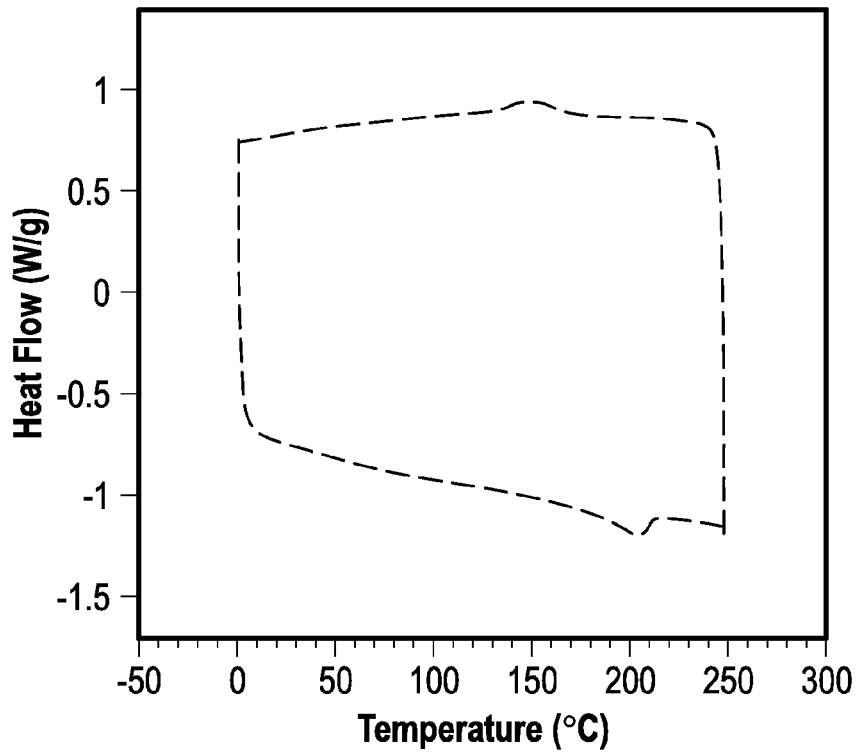
FIGS. 21a-b illustrate differential scanning calorimetry plots for P2A (a) and P2B (b), in accordance with various embodiments.
Figure 21B:
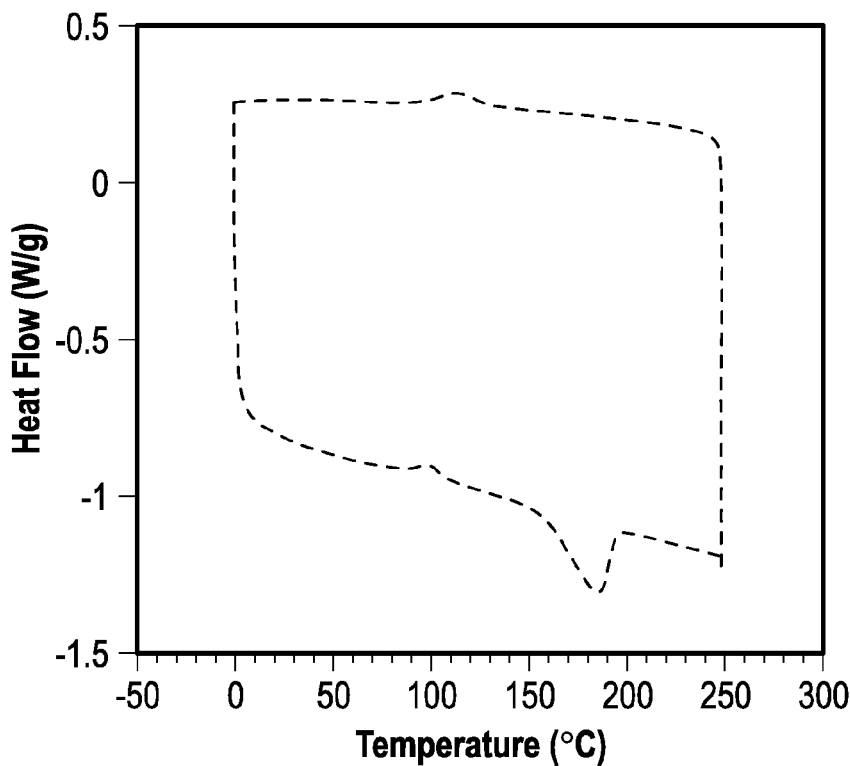
Figure 22A:
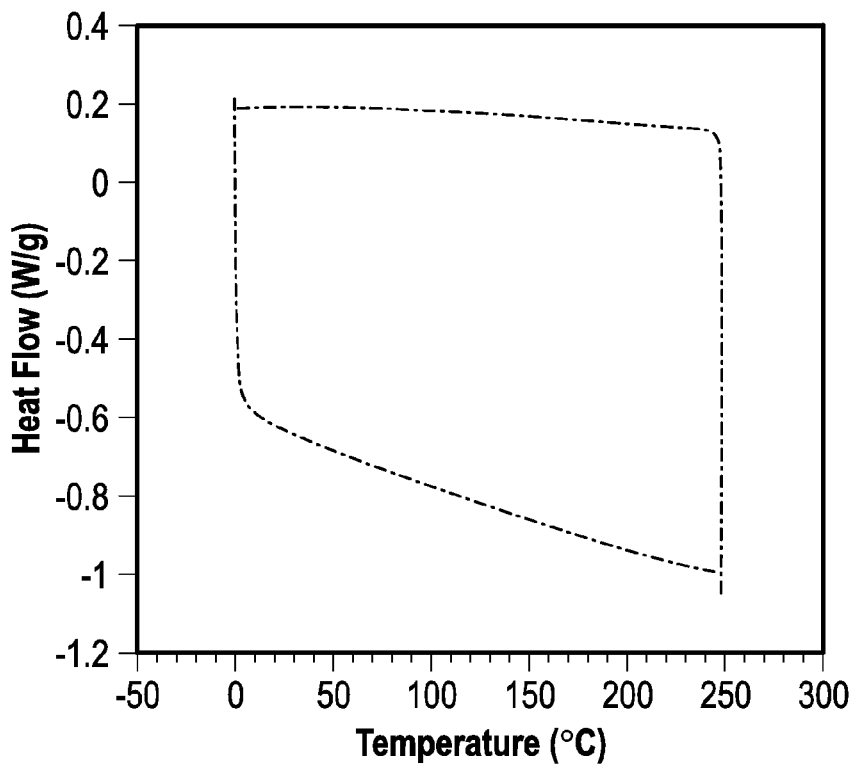
FIGS. 22a-b illustrate differential scanning calorimetry plots for P3A (a) and P3B (b), in accordance with various embodiments.
Figure 22B:
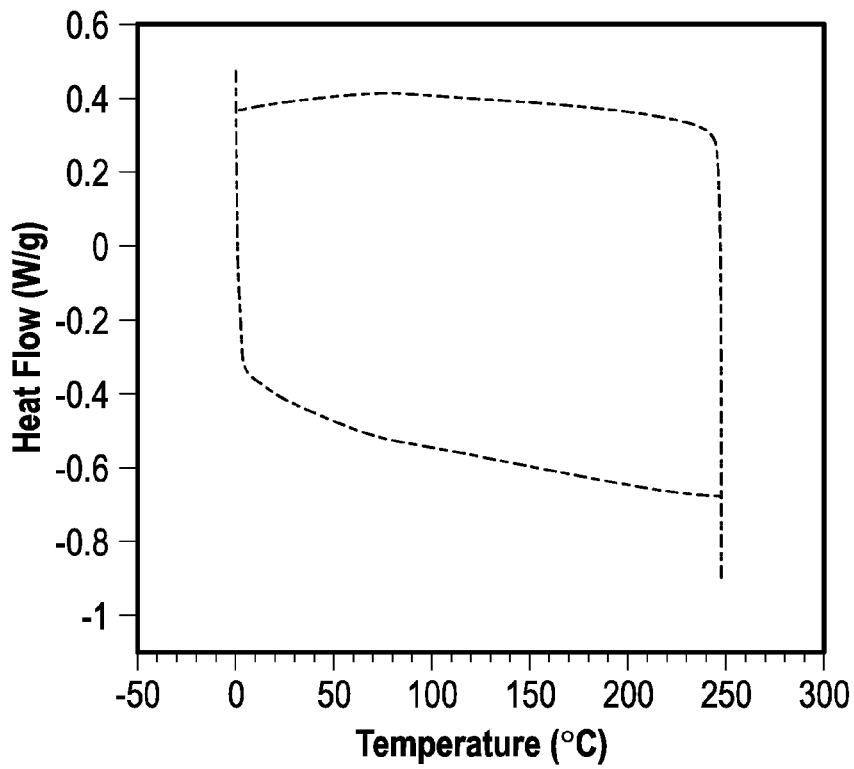
Figure 23A:
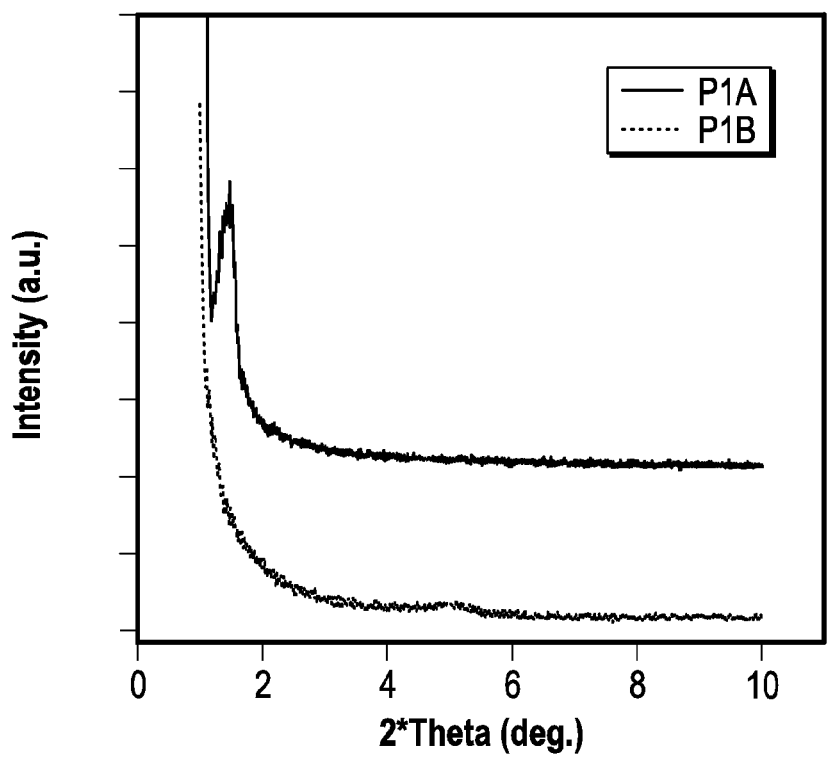
FIGS. 23a-c illustrate X-ray diffraction plots of benzobisoxazole polymers, in accordance with various embodiments.
Figure 23B:
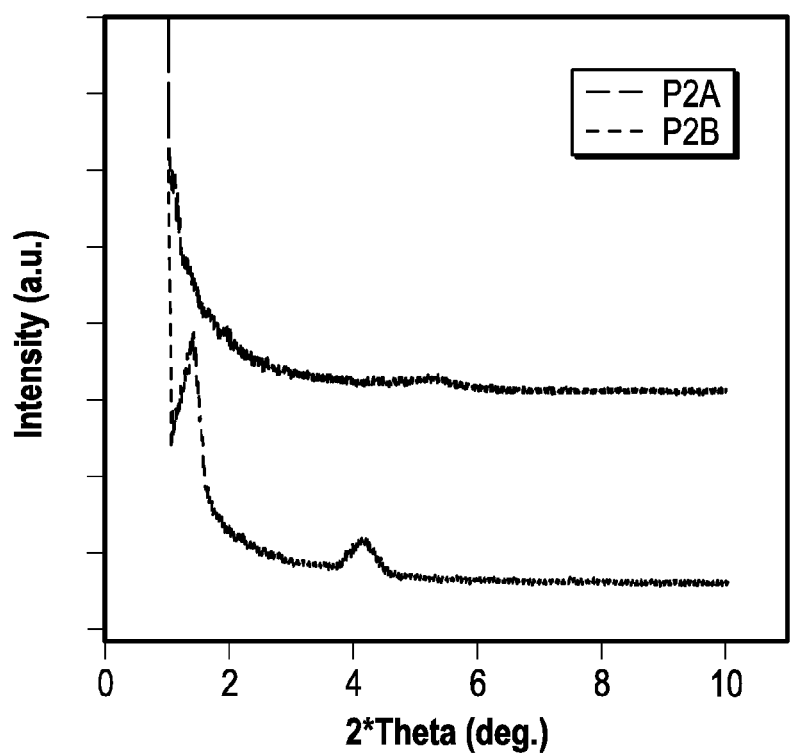
Figure 23C:
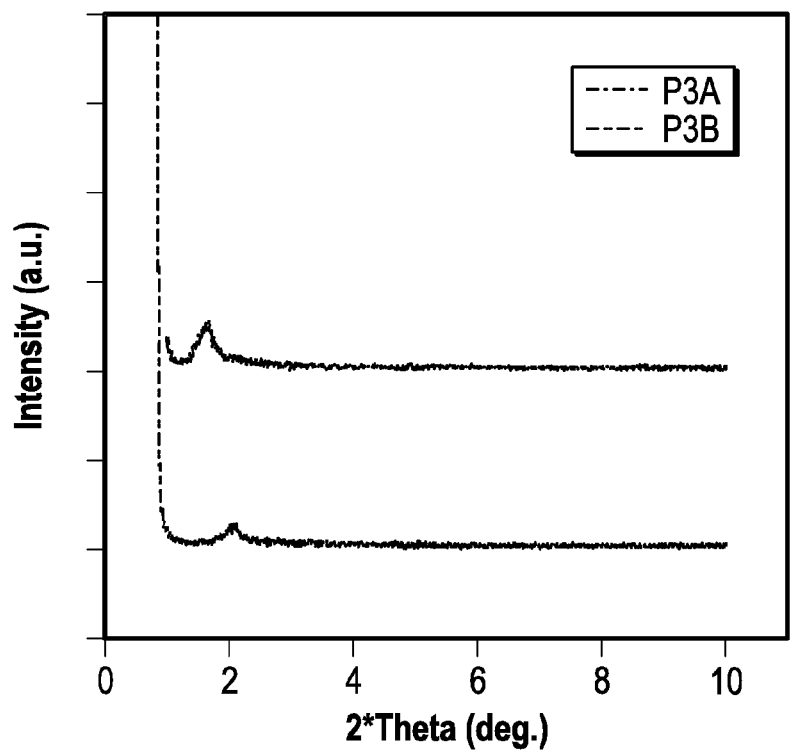
Figure 24:
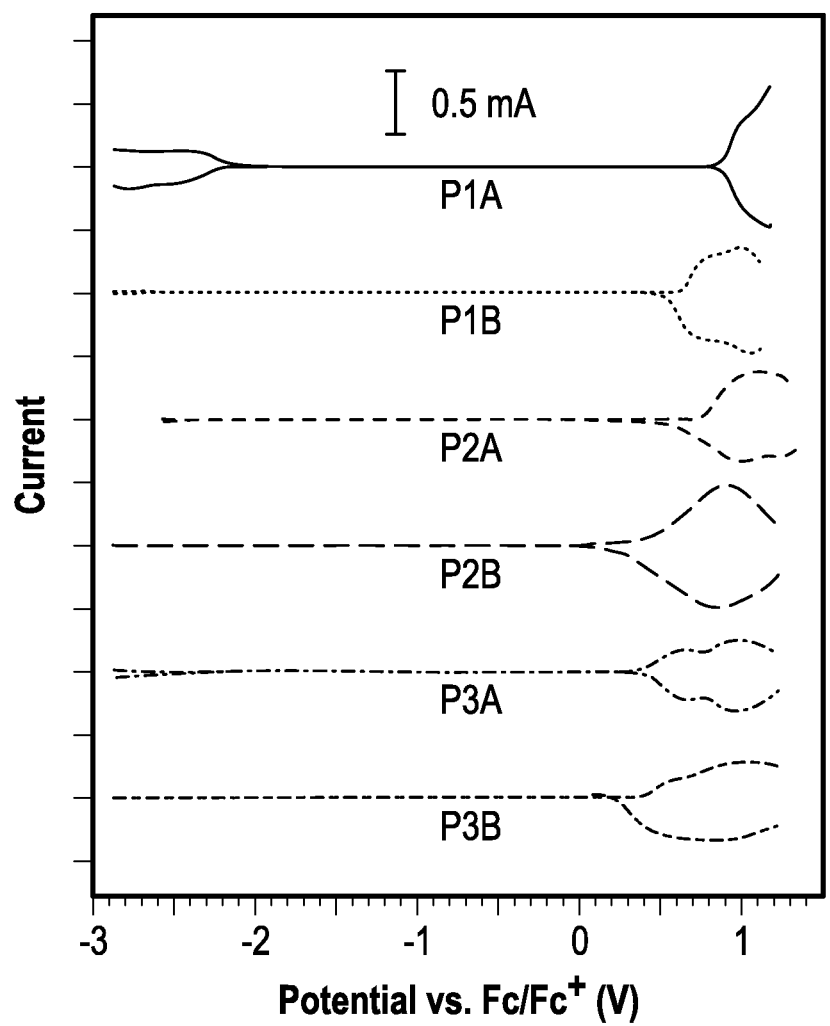
FIG. 24 illustrates differential pulse voltammetry plots of benzobisoxazole polymers, in accordance with various embodiments.

FIG. 19 illustrates a thermal gravimetric analysis of benzobisoxazole polymers. FIGS. 20a-b illustrates differential scanning calorimetry plots for P1A (a) and P1B (b). FIGS. 21a-b illustrates differential scanning calorimetry plots for P2A (a) and P2B (b). FIGS. 22a-b illustrates differential scanning calorimetry plots for P3A (a) and P3B (b). FIG. 23 illustrates X-ray diffraction plots of benzobisoxazole polymers. FIG. 24 illustrates differential pulse voltammetry plots of benzobisoxazole polymers.

Example 4.12

Spectra for Example 4

Figure 37:
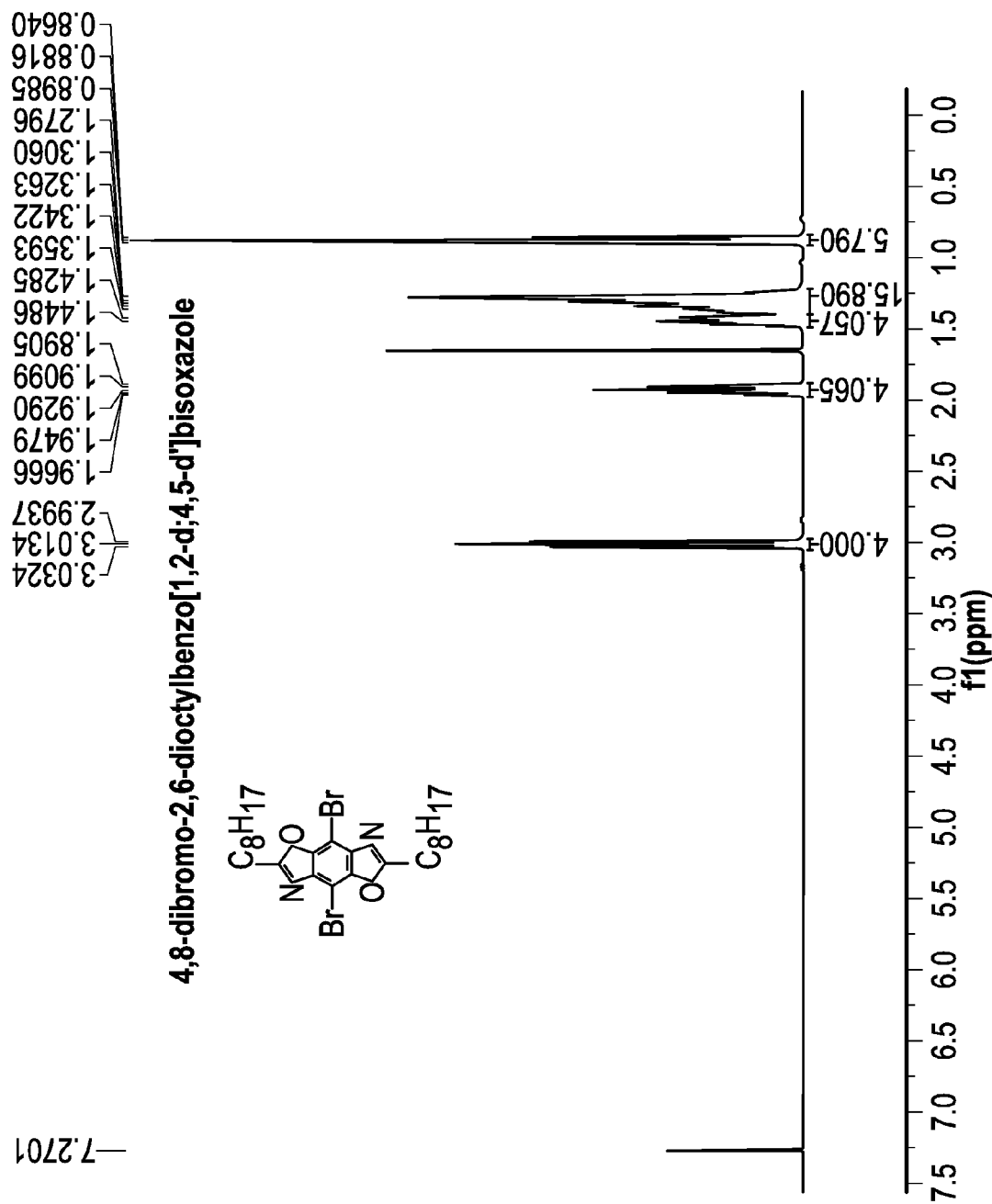
FIG. 37 illustrates a $^1$H NMR of 4,8-dibromo-2,6-dioctyl-benzo[1,2-d;4,5-d']bisoxazole, in accordance with various embodiments.
Figure 38:
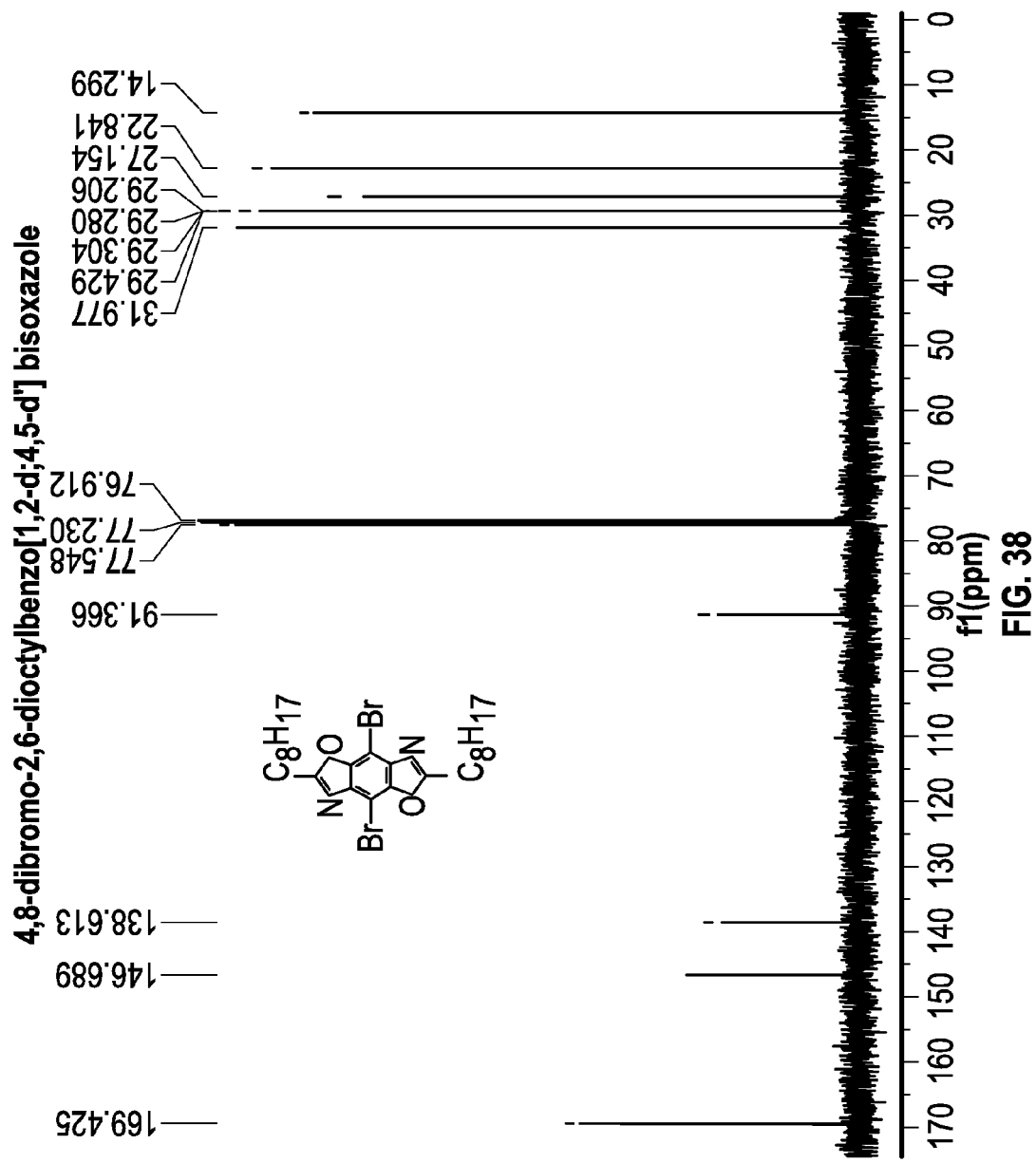
FIG. 38 illustrates a $^{13}$C NMR of 4,8-dibromo-2,6-dioctyl-benzo[1,2-d;4,5-d']bisoxazole, in accordance with various embodiments.
Figure 39:
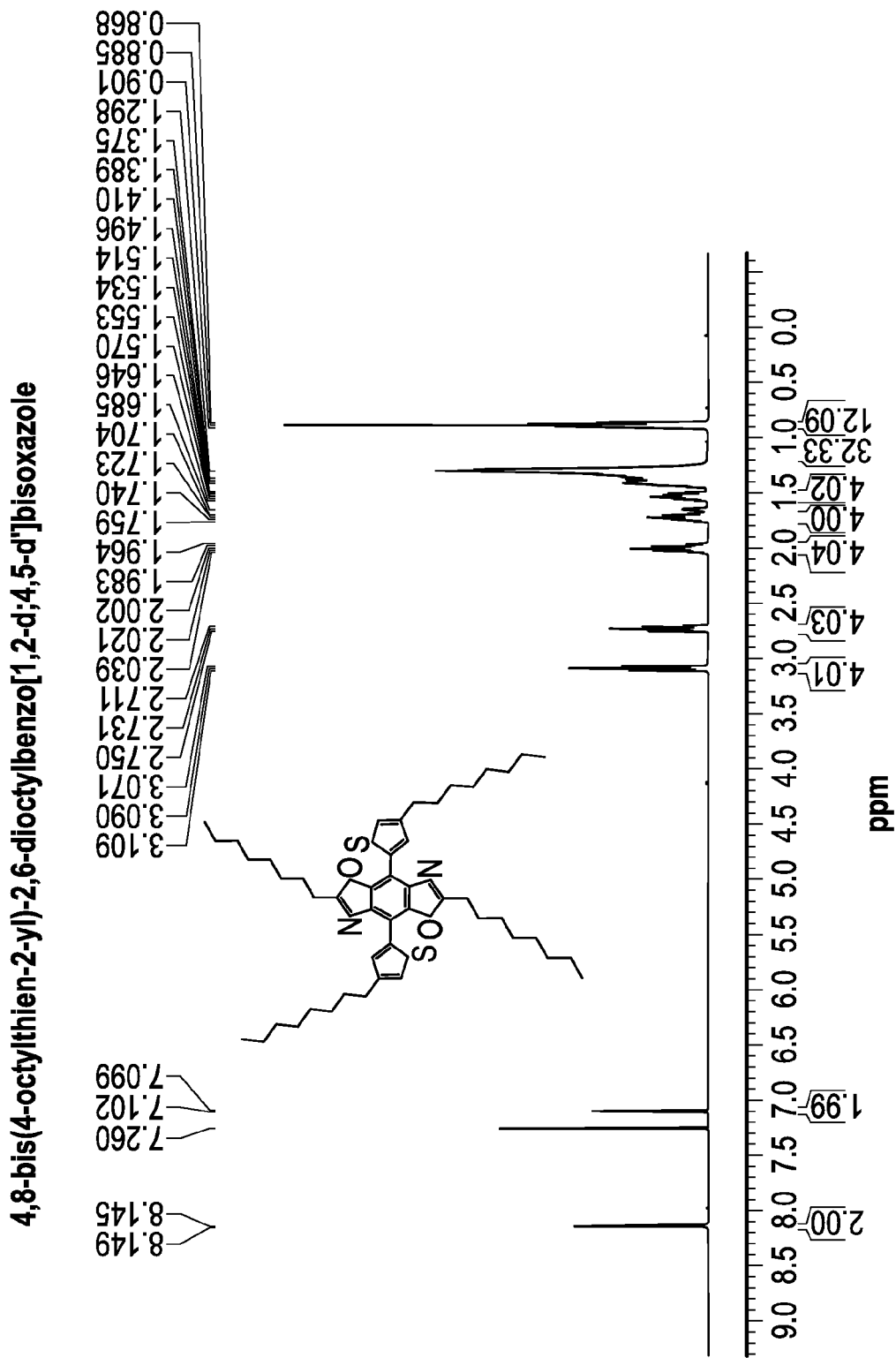
FIG. 39 illustrates a $^1$H NMR of 2,6-dioctyl-4,8-bis(4-octylthien-2-yl)benzo[1,2-d;4,5-d]bisoxazole, in accordance with various embodiments.
Figure 40:
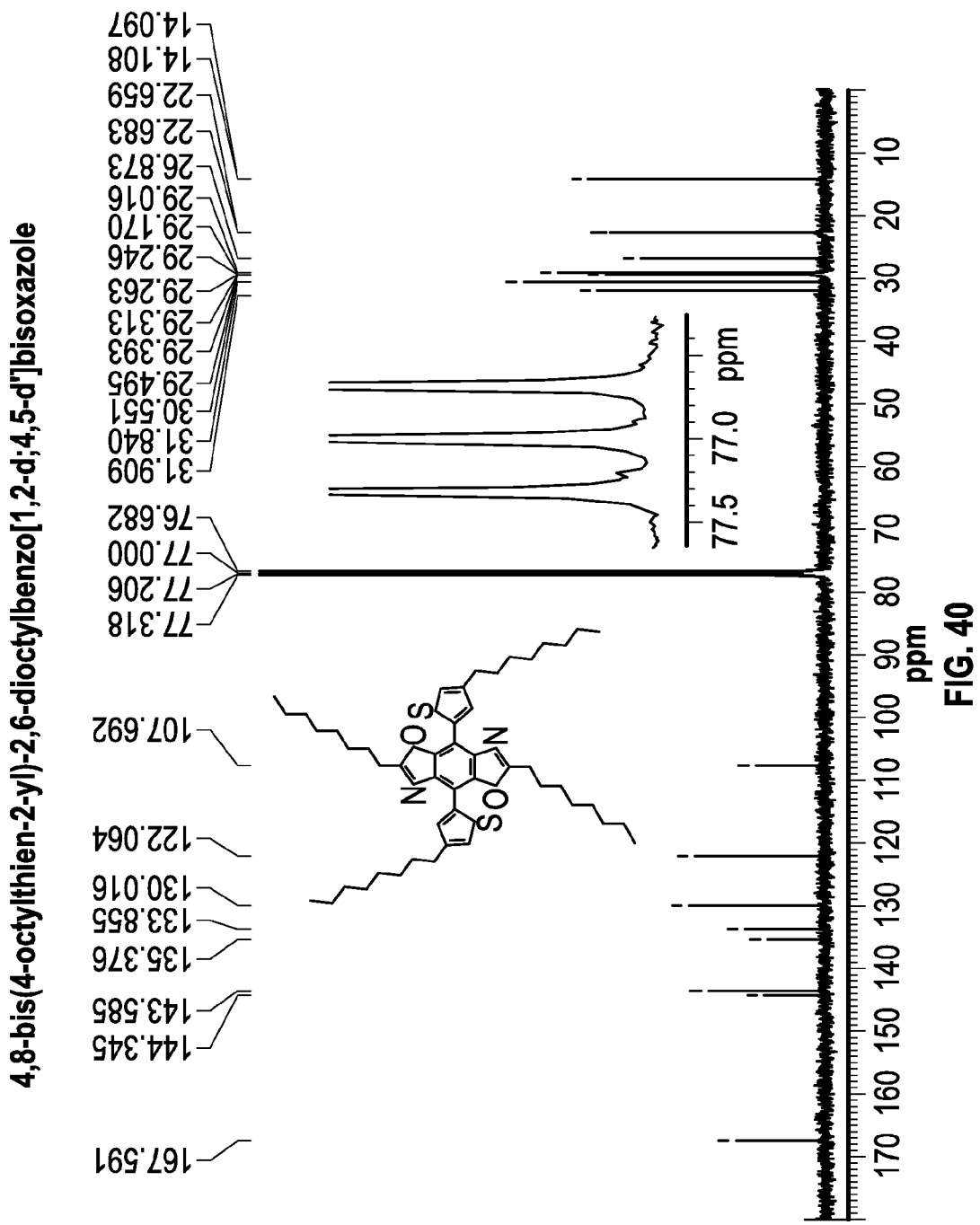
FIG. 40 illustrates a $^{13}$C NMR of 2,6-dioctyl-4,8-bis(4-octylthien-2-yl)benzo[1,2-d;4,5-d]bisoxazole, in accordance with various embodiments.
Figure 41:
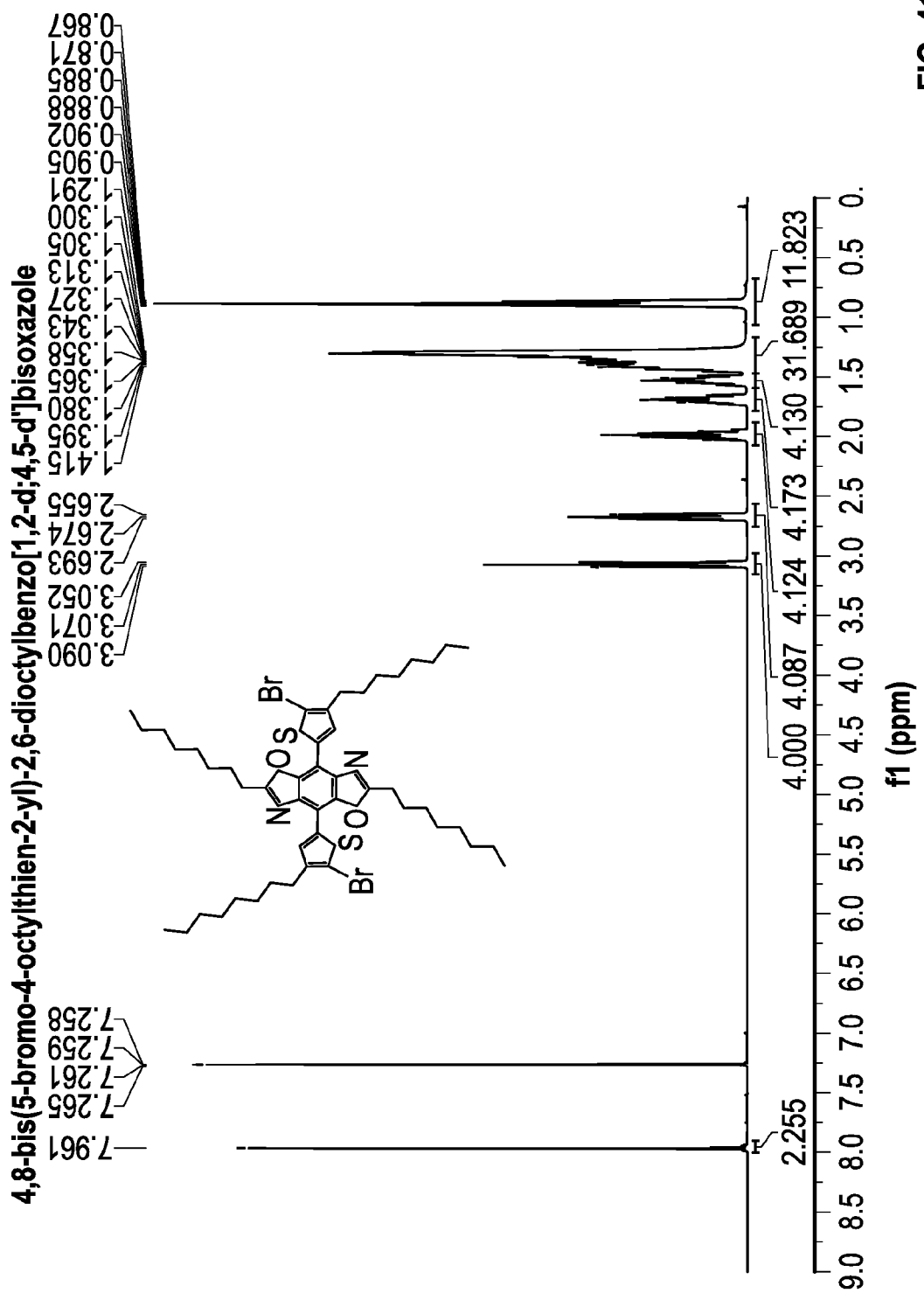
FIG. 41 illustrates a $^1$H NMR of 4,8-bis(5-bromo-4-octylthien-2-yl)-2,6-dioctylbenzo[1,2-d;4,5-d]bisoxazole, in accordance with various embodiments.
Figure 42:
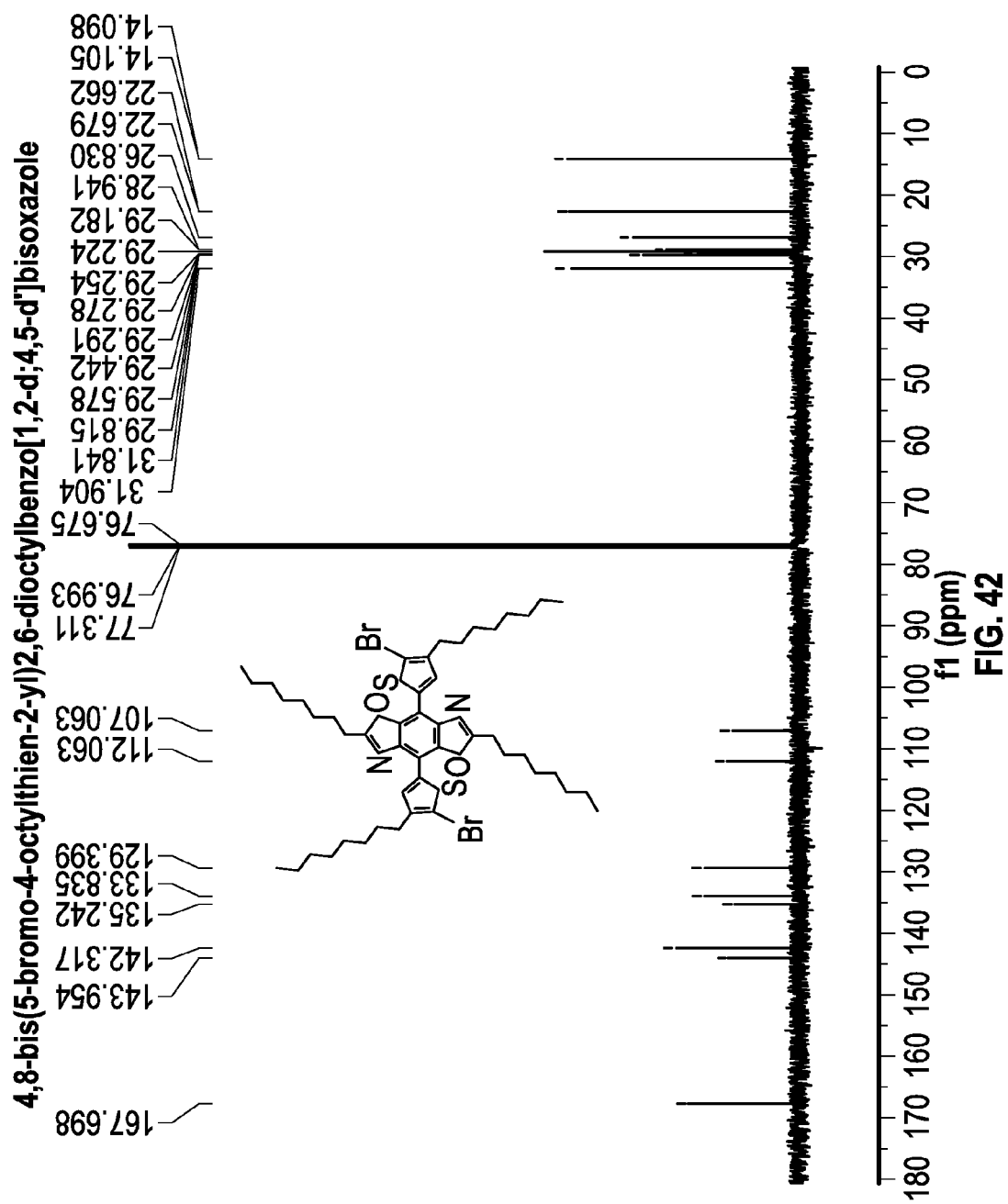
FIG. 42 illustrates a $^{13}$C NMR of 4,8-bis(5-bromo-4-octylthien-2-yl)-2,6-dioctylbenzo[1,2-d;4,5-d]bisoxazole, in accordance with various embodiments.
Figure 43:
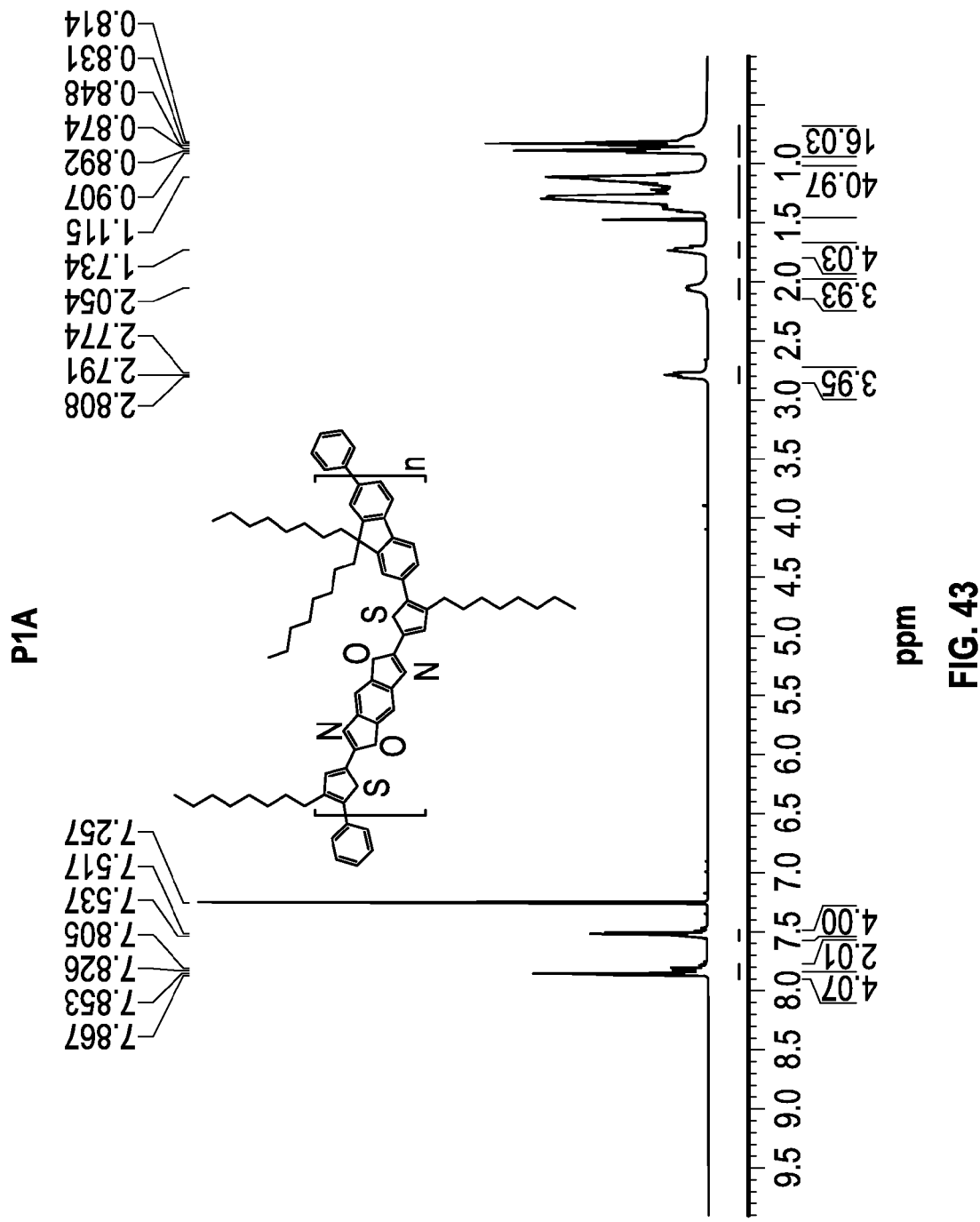
FIG. 43 illustrates a $^1$H NMR of P1A, in accordance with various embodiments.
Figure 44:
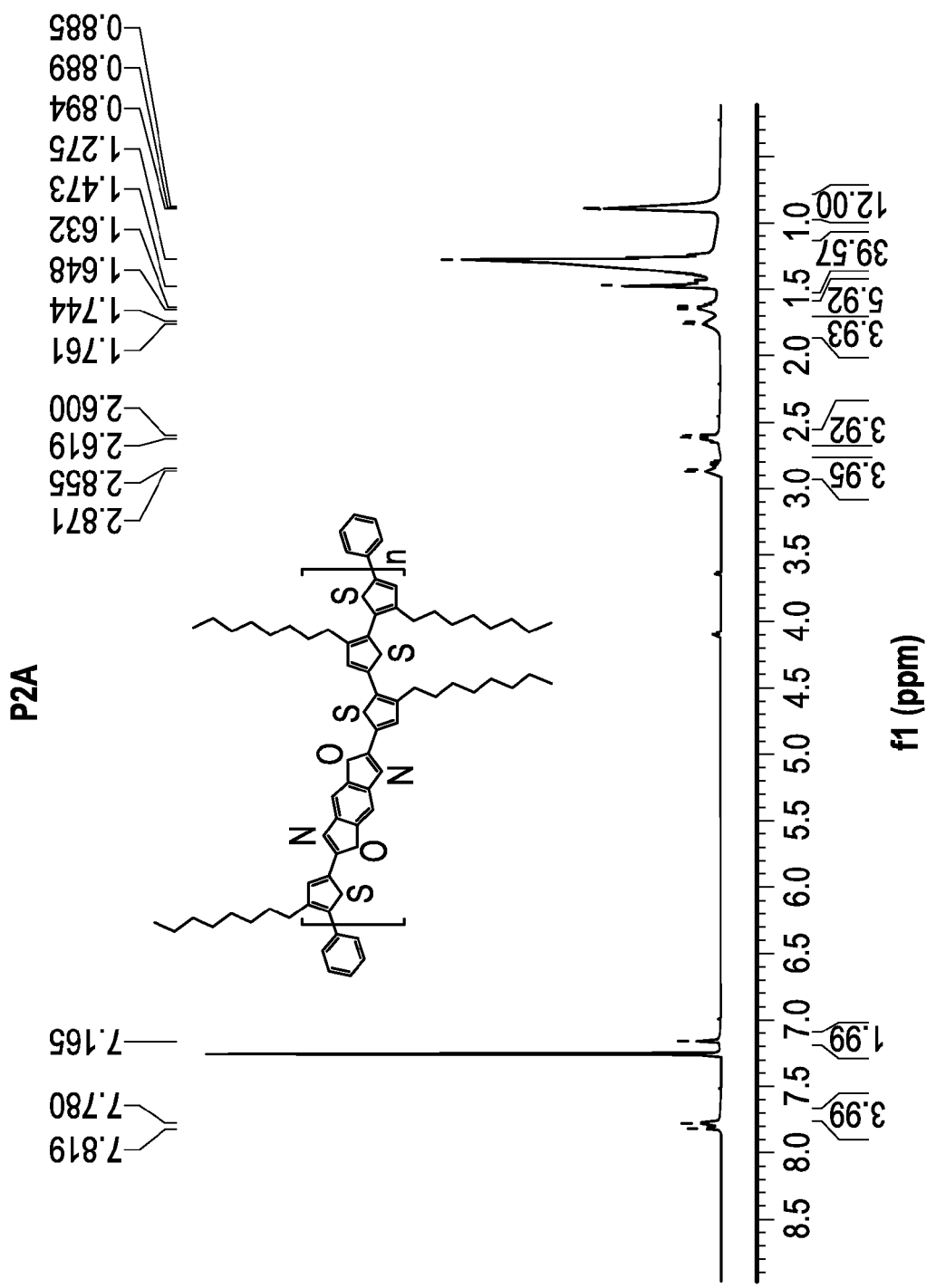
FIG. 44 illustrates a $^1$H NMR of P2A, in accordance with various embodiments.
Figure 45:
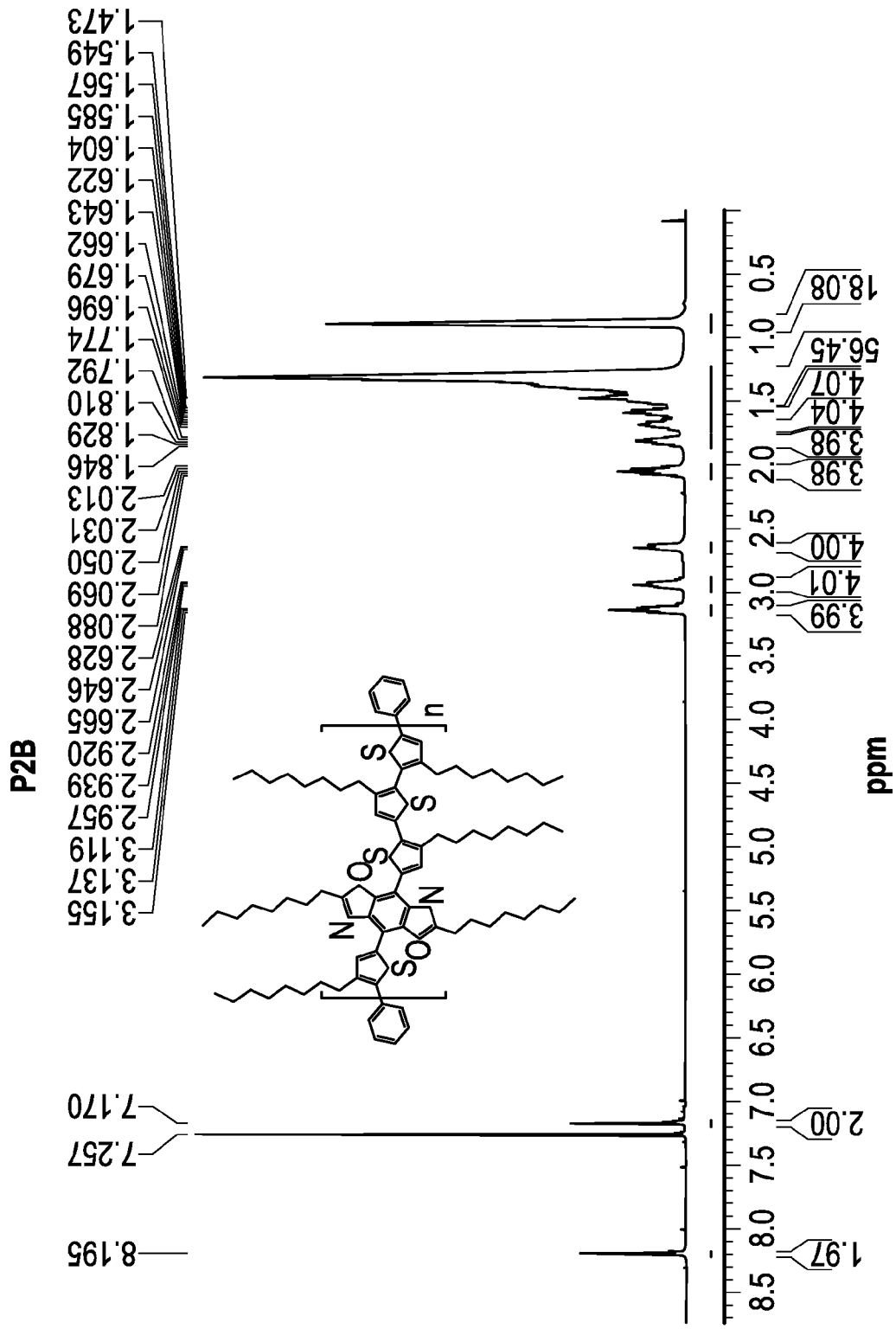
FIG. 45 illustrates a $^1$H NMR of P2B, in accordance with various embodiments.
Figure 46:
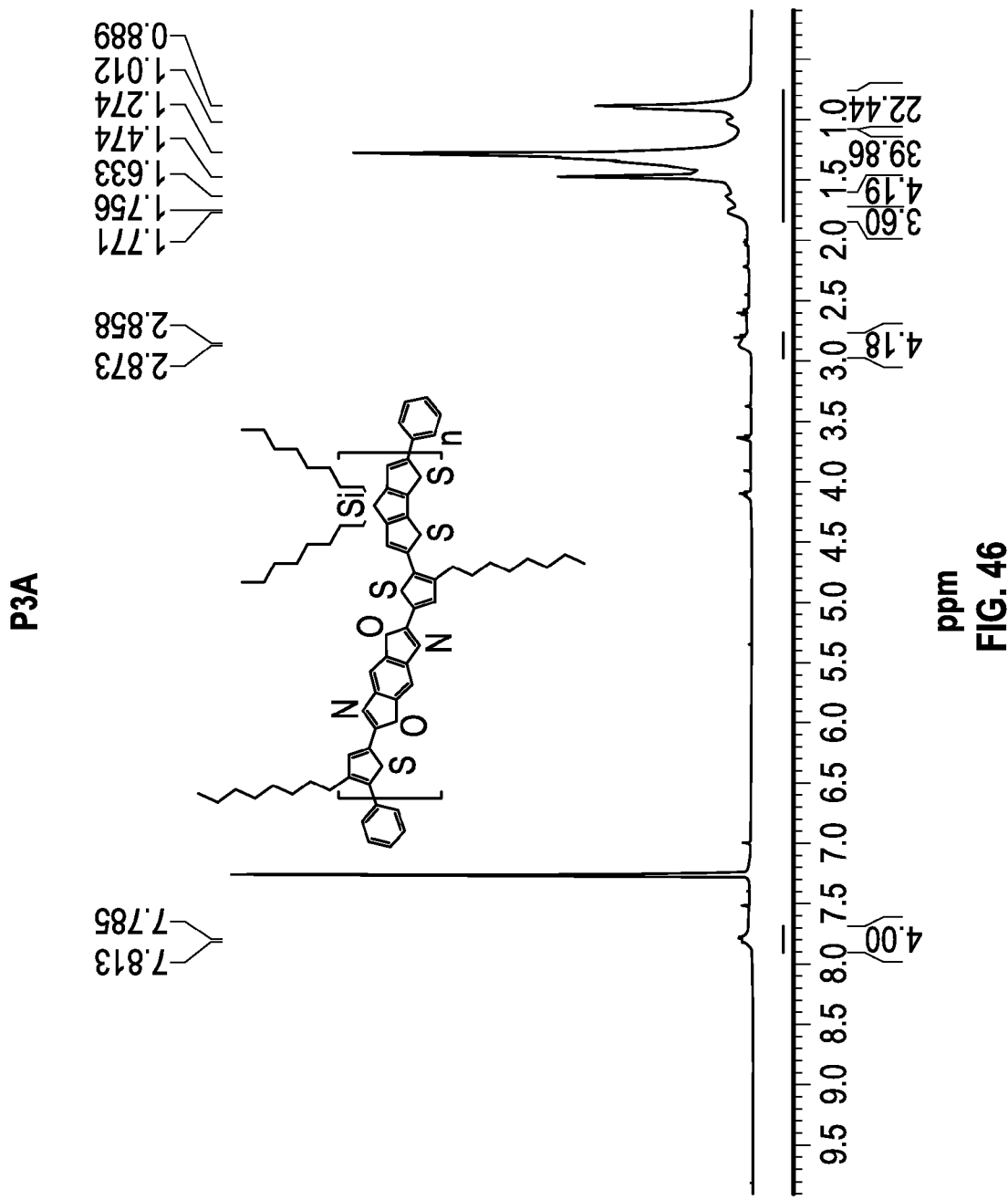
FIG. 46 illustrates a $^1$H NMR of P3A, in accordance with various embodiments.
Figure 47:
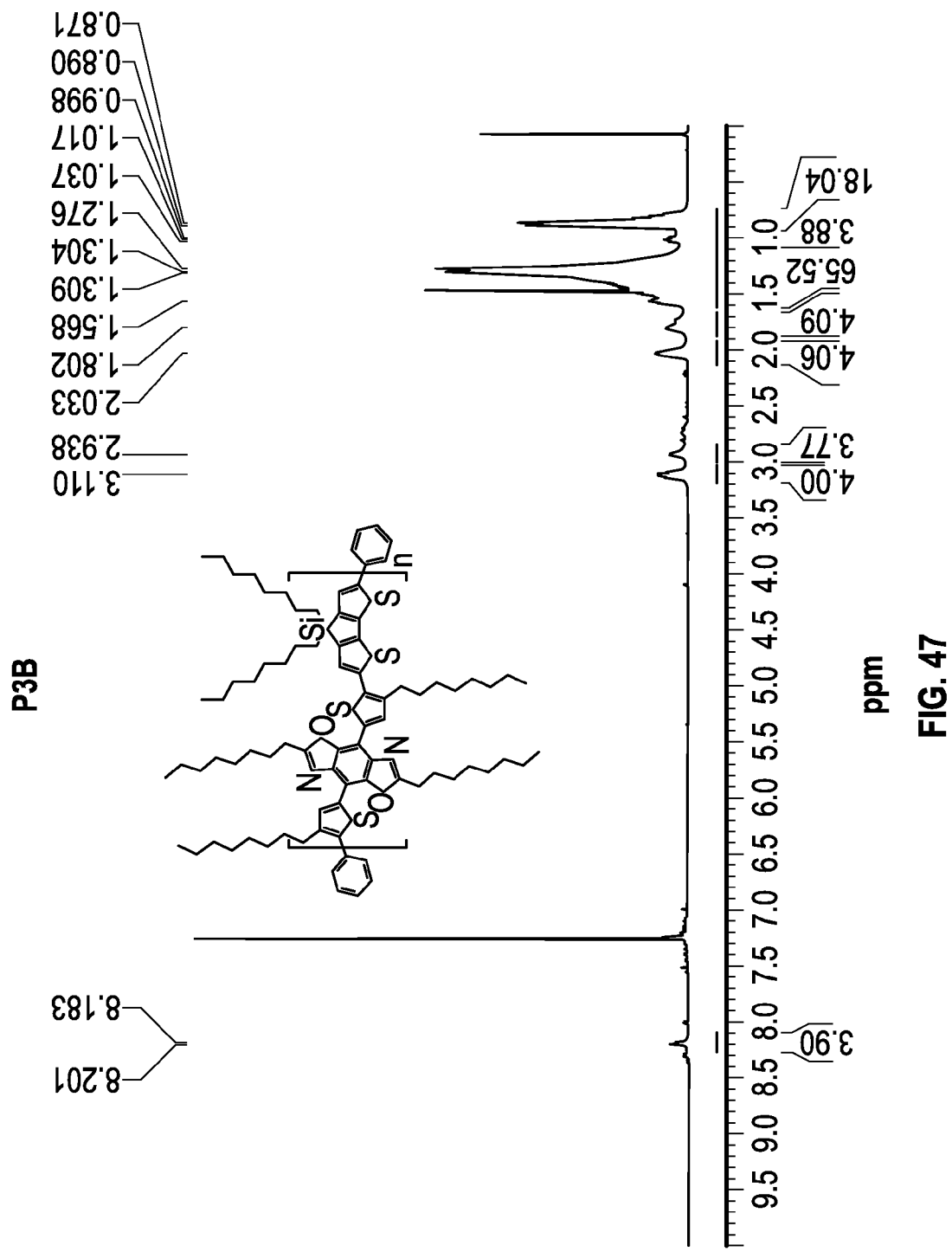
FIG. 47 illustrates a $^1$H NMR of P3B, in accordance with various embodiments.

FIG. 37 illustrates a $^1$H NMR of 4,8-dibromo-2,6-dioctyl-benzo[1,2-d;4,5-d']bisoxazole. FIG. 38 illustrates a $^{13}$C NMR of 4,8-dibromo-2,6-dioctylbenzo[1,2-d;4,5-d']bisoxazole. FIG. 39 illustrates a $^1$H NMR of 2,6-dioctyl-4,8-bis(4-octylthien-2-yl)benzo[1,2-d;4,5-d']bisoxazole. FIG. 40 illustrates a $^{13}$C NMR of 2,6-dioctyl-4,8-bis(4-octylthien-2-yl)benzo[1,2-d;4,5-d]bisoxazole. FIG. 41 illustrates a $^1$H NMR of 4,8-bis(5-bromo-4-octylthien-2-yl)-2,6-dioctylbenzo[1,2-d;4,5-d']bisoxazole. FIG. 42 illustrates a $^{13}$C NMR of 4,8-bis(5-bromo-4-octylthien-2-yl)-2,6-dioctylbenzo[1,2-d;4,5-d'] bisoxazole. FIG. 43 illustrates a $^1$H NMR of P1A. FIG. 44 illustrates a $^1$H NMR of P2A. FIG. 45 illustrates a $^1$H NMR of P2B. FIG. 46 illustrates a $^1$H NMR of P3A. FIG. 47 illustrates a $^1$H NMR of P3B.

The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those of ordinary skill in the art, and that such modifications and variations are considered to be within the scope of this invention as defined by the appended claims.

Additional Embodiments

The present invention provides for the following exemplary embodiments, the numbering of which is not to be construed as designating levels of importance:

Embodiment 1 provides a conjugated polymer comprising a repeating unit comprising structure (I):

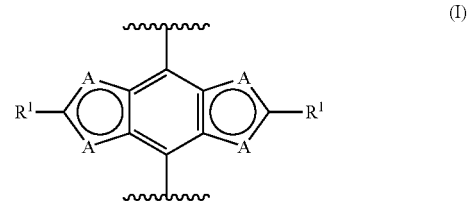

wherein each $R^1$ at each occurrence is independently chosen from —$R^2$, —H, —OH, —$OR^2$, —$NR^2_2$ and halide, wherein $R^2$ at each occurrence is independently chosen from —H and substituted or unsubstituted $C_{1-60}$ hydrocarbyl, and each A at each occurrence is independently chosen from N, S, and O, wherein each 5-membered ring in structure (I) independently at each occurrence has one A that is N and one A that is S or O.

Embodiment 2 provides the polymer of Embodiment 1, wherein structure (I) is

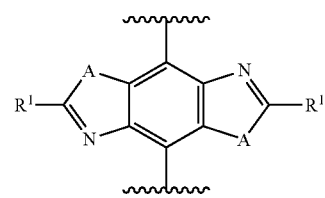

wherein each A at each occurrence is independently chosen from O and S.

Embodiment 3 provides the polymer of any one of Embodiments 1-2, wherein structure (I) is

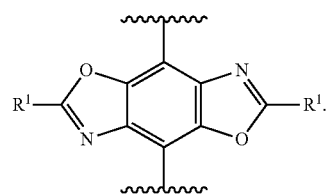

Embodiment 4 provides the polymer of any one of Embodiments 1-3, wherein each $R^1$ at each occurrence is independently substituted or unsubstituted $C_{1-30}$ alkyl.

Embodiment 5 provides the polymer of any one of Embodiments 1-4, wherein each $R^1$ at each occurrence is independently $C_{1-15}$ alkyl.

Embodiment 6 provides the polymer of any one of Embodiments 1-5, wherein the benzene ring of structure (I) in each repetition of the repeating unit in the polymer is conjugated together.

Embodiment 7 provides the polymer of any one of Embodiments 1-6, wherein the polymer comprises a polymer backbone, wherein the polymer backbone comprises a conjugated system including the benzene ring of structure (I).

Embodiment 8 provides the polymer of any one of Embodiments 1-7, wherein the polymer is a copolymer.

Embodiment 9 provides the polymer of any one of Embodiments 1-8, wherein the polymer comprises a polymer backbone, wherein the polymer backbone comprises at least one of double and triple bonds, wherein each double or triple bond is conjugated with the benzene ring of structure (I).

Embodiment 10 provides the polymer of any one of Embodiments 1-9, wherein the repeating unit comprises structure (II)

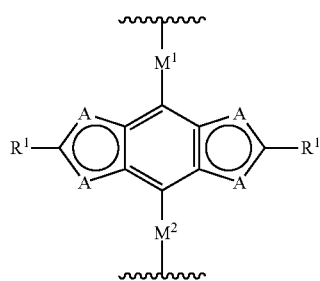

(II)

wherein $M^1$ and $M^2$ are each independently at each occurrence chosen from a bond and

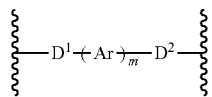

wherein each of $D^1$ and $D^2$ at each occurrence are independently chosen from a bond, substituted or unsubstituted ethenylene, and ethynylene, each Ar at each occurrence is independently chosen from substituted or unsubstituted aryl and substituted or unsubstituted heteroaryl, each m at each occurrence is 0 to 30, and at least one of $M^1$ and $M^2$ is not a bond.

Embodiment 11 provides the polymer of any one of Embodiments 1-10, wherein the repeating unit is structure (II).

Embodiment 12 provides the polymer of any one of Embodiments 10-11, wherein $M^2$ is a bond.

Embodiment 13 provides the polymer of any one of Embodiments 10-12, wherein $D^1$ is ethynylene, $D^2$ is a bond, and m is 0.

Embodiment 14 provides the polymer of any one of Embodiments 10-13, wherein $D^1$ and $D^2$ are both ethynylene.

Embodiment 15 provides the polymer of any one of Embodiments 10-14, wherein m at each occurrence is independently chosen from 1, 2, and 3.

Embodiment 16 provides the polymer of any one of Embodiments 10-15, wherein $D^1$ and $D^2$ are both bonds and m is at each occurrence is independently chosen from 1, 2, and 3.

Embodiment 17 provides the polymer of any one of Embodiments 10-16, wherein m is 1.

Embodiment 18 provides the polymer of any one of Embodiments 10-17, wherein Ar at each occurrence is independently chosen from

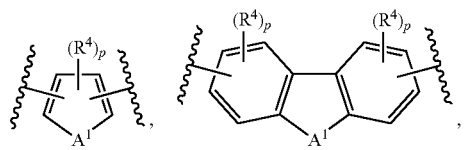

-continued

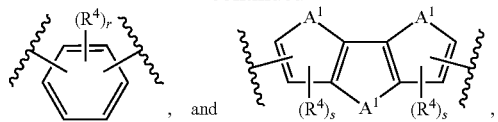

wherein $A^1$ at each occurrence is independently chosen from $N-R^3$, $CR^3_2$, $SiR^3_2$, S, and O, each $R^3$ at each occurrence is independently chosen from —H and substituted or unsubstituted $C_{1-60}$ hydrocarbyl, each $R^4$ at each occurrence is independently chosen from —H, —$R^3$, —$OR^3$, —$NR^3_2$, and halide, p at each occurrence is independently chosen from 0, 1, and 2, r at each occurrence is independently chosen from 0, 1, 2, 3, and 4, q at each occurrence is independently chosen from 0, 1, 2, and 3, and s at each occurrence is independently chosen from 0 and 1.

Embodiment 19 provides the polymer of Embodiment 18, wherein Ar at each occurrence is independently chosen from

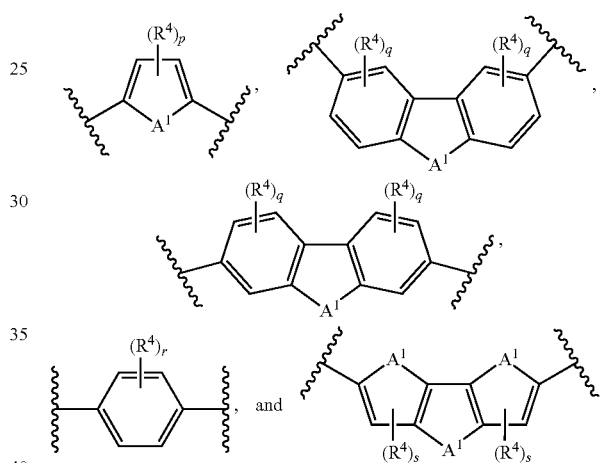

Embodiment 20 provides the polymer of any one of Embodiments 18-19, wherein p, q, r, or s is 1.

Embodiment 21 provides the polymer of any one of Embodiments 18-20, wherein $R^3$ is at each occurrence independently $C_{1-15}$ hydrocarbyl.

Embodiment 22 provides the polymer of any one of Embodiments 18-21, wherein $R^3$ is at each occurrence independently $C_{1-15}$ alkyl.

Embodiment 23 provides the polymer of any one of Embodiments 18-22, wherein Ar at each occurrence is independently chosen from

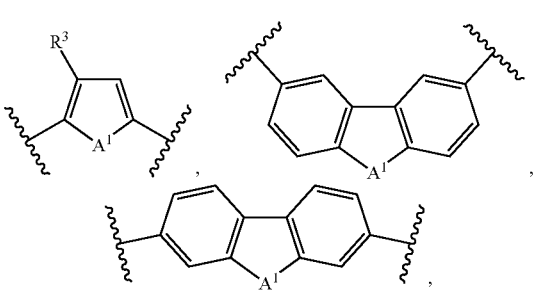

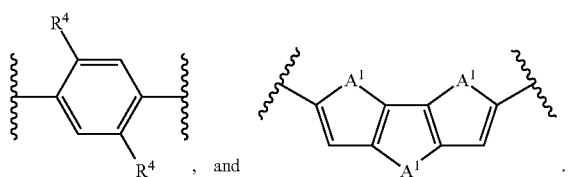

Embodiment 24 provides the polymer of any one of Embodiments 18-23, wherein Ar at each occurrence is independently chosen from

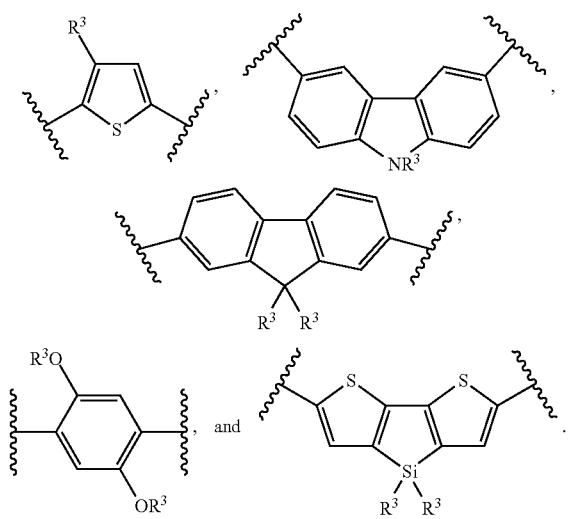

Embodiment 25 provides the polymer of any one of Embodiments 18-24, wherein the polymer comprises the structure

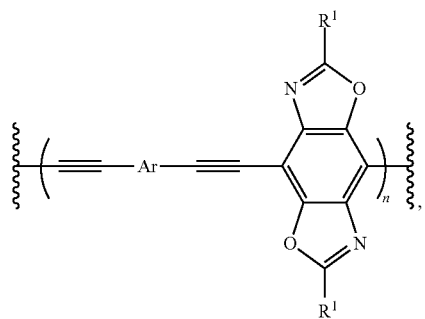

wherein Ar at each occurrence is independently chosen from

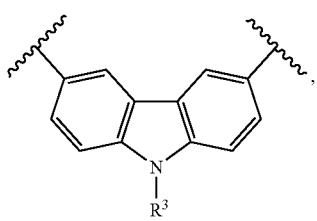

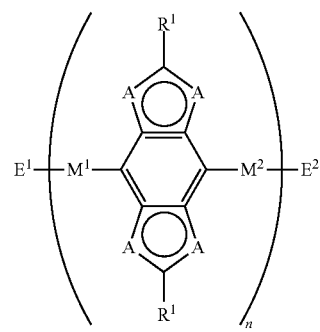

Embodiment 26 provides the polymer of Embodiment 25, wherein $R^3$ at each occurrence is independently chosen from octyl, 2-ethylhexyl, 3,7-dimethyloctyl, dodecyl, methyl, and 2-ethylhexyl.

Embodiment 27 provides the polymer of any one of Embodiments 25-26, wherein $R^1$ is —$C_6H_{13}$.

Embodiment 28 provides the polymer of any one of Embodiments 1-27, wherein the polymer is terminated by end groups -E wherein each -E at each occurrence is independently chosen from substituted or unsubstituted —$R^5$, —H, —OH, —$OR^5$, —$NR^5_2$ and halide, wherein $R^5$ at each occurrence is independently chosen from —H and substituted or unsubstituted $C_{1-60}$ hydrocarbyl.

Embodiment 29 provides the polymer of any one of Embodiments 1-28, wherein -E at each occurrence is independently $C_{1-15}$ aryl and heteroaryl.

Embodiment 30 provides the polymer of any one of Embodiments 1-29, wherein -E at each occurrence is independently substituted or unsubstituted phenyl.

Embodiment 31 provides the polymer of any one of Embodiments 1-30, wherein each -E is phenyl.

Embodiment 32 provides the polymer of any one of Embodiments 10-31, wherein the polymer is structure (II)

wherein n is about 2 to about 10,000, and end groups $E^1$ and $E^2$ are each independently at each occurrence chosen from substituted or unsubstituted —$R^5$, —H, —OH, —$OR^5$, —$NR^5_2$ and halide, wherein $R^5$ at each occurrence is independently chosen from —H and substituted or unsubstituted $C_{1-60}$ hydrocarbyl.

Embodiment 33 provides the polymer of Embodiment 32, wherein n is about 5 to about 75.

Embodiment 34 provides the polymer of any one of Embodiments 1-33, wherein the polymer has the structure

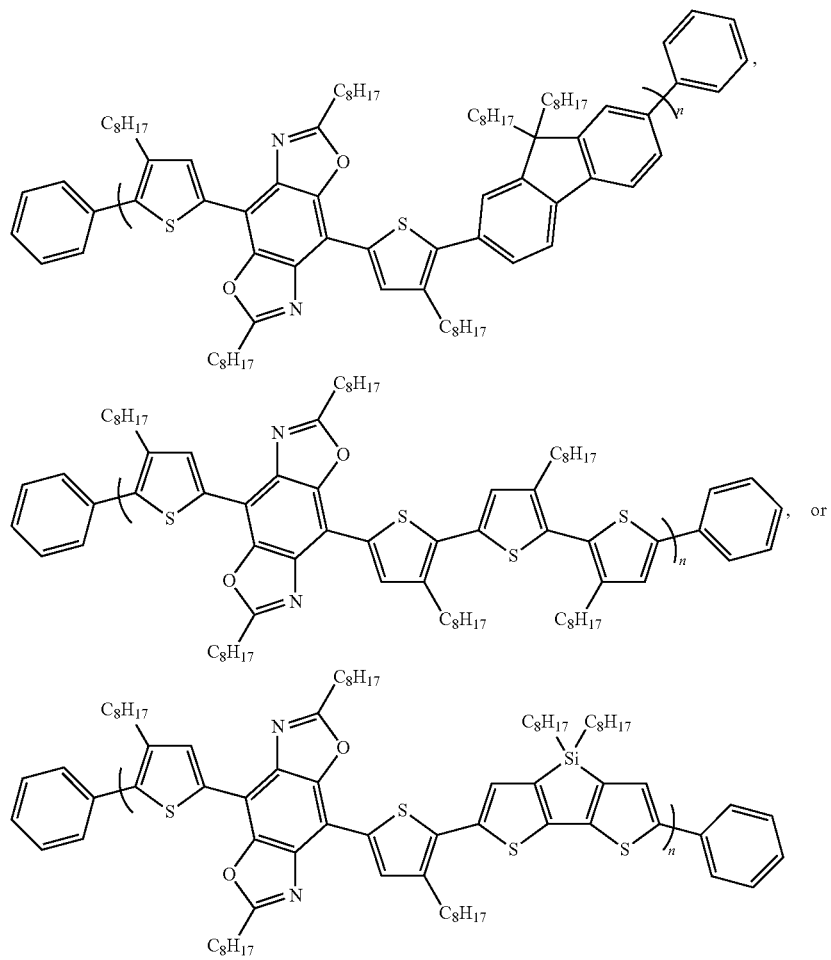

wherein n is about 2 to 10,000.

Embodiment 35 provides the polymer of any one of Embodiments 1-34, wherein the polymer has the structure

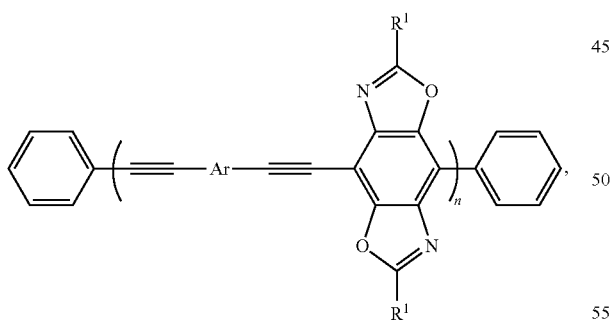

wherein Ar at each occurrence is independently chosen from

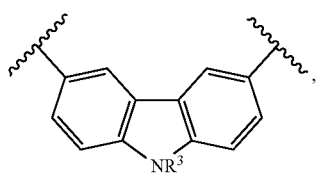

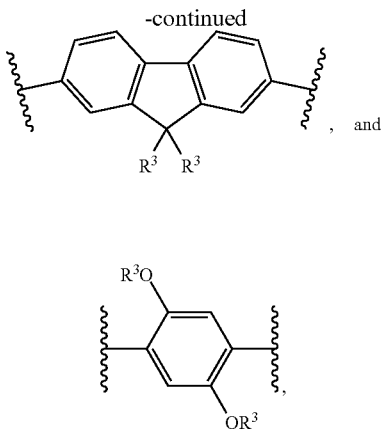

wherein each $R^3$ at each occurrence is independently chosen from —H and substituted or unsubstituted $C_{1-60}$ hydrocarbyl, and n is about 2 to about 10,000.

Embodiment 36 provides a semiconductor device comprising the polymer of any one of Embodiments 1-35.

Embodiment 37 provides the semiconductor device of Embodiment 36, wherein the semiconductor device comprises at least one of a transistor, a diode, a photovoltaic cell, an integrated circuit, or an optoelectronic device.

Embodiment 38 provides a conjugated polymer having the formula

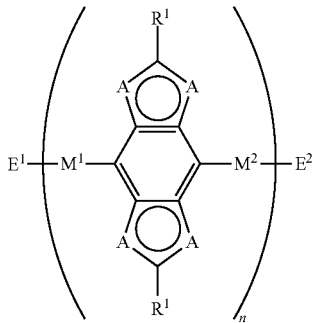

wherein each A at each occurrence is independently chosen from N, S, and O, wherein each 5-membered ring in the fused benzene ring system independently at each occurrence has one A that is N and one A that is S or O, and $M^1$ and $M^2$ are each independently at each occurrence chosen from a bond and

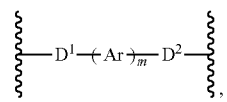

wherein each of $D^1$ and $D^2$ at each occurrence are independently chosen from a bond, substituted or unsubstituted ethenylene, and ethynylene, each m at each occurrence is 0 to 30, and at least one of $M^1$ and $M^2$ is not a bond, wherein Ar at each occurrence is independently chosen from

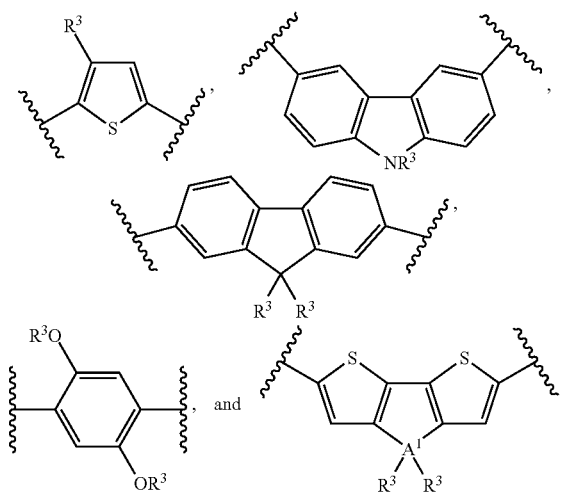

wherein each $R^3$ at each occurrence is independently chosen from —H and $C_{1-15}$ hydrocarbyl, and wherein n is about 2 to about 10,000, and $E^1$ and $E^2$ are each independently at each occurrence chosen from substituted or unsubstituted —$R^5$, —H, —OH, —$OR^5$, —$NR^5_2$ and halide, wherein $R^5$ at each occurrence is independently chosen from —H and substituted or unsubstituted $C_{1-60}$ hydrocarbyl.

Embodiment 39 provides a method of making a polymer, comprising: obtaining or providing a fused benzene ring system having the structure

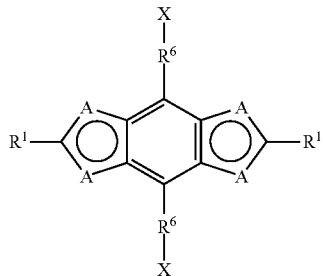

(III)

wherein each A at each occurrence is independently chosen from N, S, and O, wherein each 5-membered ring in structure (III) independently at each occurrence has one A that is N and one A that is S or O, each $R^1$ at each occurrence is independently chosen from —$R^2$, —H, —OH, —$OR^2$, —$NR^2_2$ and halide, wherein $R^2$ at each occurrence is independently chosen from —H and substituted or unsubstituted $C_{1-60}$ hydrocarbyl, and X is —I, —Br, —Cl, or —F, and each $R^6$ at each occurrence is independently a bond or Ar, wherein each Ar at each occurrence is independently chosen from substituted or unsubstituted aryl and substituted or unsubstituted heteroaryl; obtaining or providing a conjugated linker having the structure

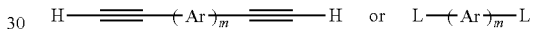

wherein each L at each occurrence is —$Sn(R^7)_3$ or —$B(OR^8)_2$, wherein $R^7$ at each occurrence is independently $C_{1-15}$ hydrocarbyl, wherein $R^8$ is $C_{1-30}$ hydrocarbyl or together with another $R^8$ is a $C_{2-30}$ hydrocarbylene that forms a cyclic boronic acid ester structure with the —B(O—)$_2$, and each m at each occurrence is 0 to 30; and contacting the fused benzene ring system and the conjugated linker under conditions so as to provide a conjugated polymer having a repeating unit comprising structure (II)

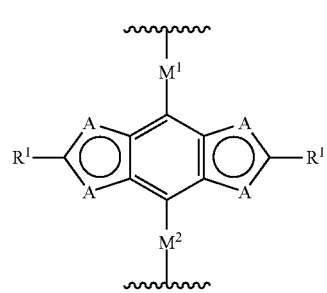

(II)

wherein $M^1$ and $M^2$ are each independently at each occurrence chosen from a bond and

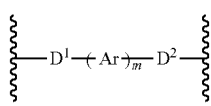

wherein each of $D^1$ and $D^2$ at each occurrence are independently chosen from a bond and ethynylene, and at least one of $M^1$ and $M^2$ is not a bond.

Embodiment 40 provides the method of Embodiment 39, further comprising contacting E-X or E-Ar-X with the conjugated polymer under conditions so as to provide the conjugated polymer with end groups -E, wherein each end group -E at each occurrence is substituted or unsubstituted $C_{1-60}$ hydrocarbyl.

Embodiment 41 provides the apparatus or method of any one or any combination of Embodiments 1-40 optionally configured such that all elements or options recited are available to use or select from.

What is claimed is:

1. A conjugated polymer comprising a repeating unit comprising structure (I):

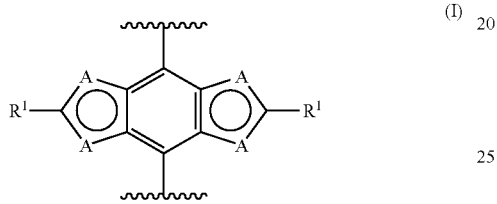

wherein each $R^1$ at each occurrence is independently chosen from $-R^2$, $-H$, $-OH$, $-OR^2$, $-NR^2_2$ and halide, wherein $R^2$ at each occurrence is independently chosen from $-H$ and substituted or unsubstituted $C_{1-60}$ hydrocarbyl, and each A at each occurrence is independently chosen from N, S, and O, wherein one 5-membered ring in structure (I) independently at each occurrence has one A that is N and one A that is S or O and the other 5-membered ring in structure (I) independently at each occurrence has one A that is N and one A that is O.

2. The polymer of claim 1, wherein structure (I) is

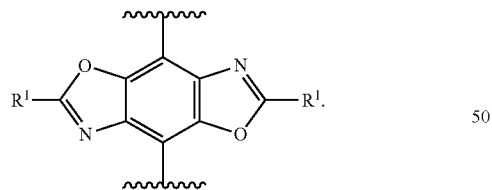

3. The polymer of claim 1, wherein each $R^1$ at each occurrence is independently substituted or unsubstituted $C_{1-30}$ alkyl.

4. The polymer of claim 1, wherein the benzene ring of structure (I) in each repetition of the repeating unit in the polymer is conjugated together.

5. The polymer of claim 1, wherein the polymer comprises a polymer backbone, wherein the polymer backbone comprises a conjugated system including the benzene ring of structure (I).

6. The polymer of claim 1, wherein the repeating unit comprises structure (II)

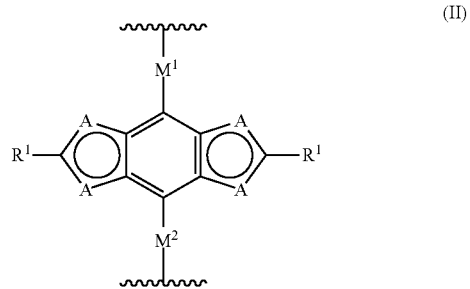

wherein $M^1$ and $M^2$ are each independently at each occurrence chosen from a bond and

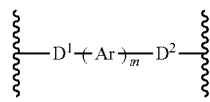

wherein each of $D^1$ and $D^2$ at each occurrence are independently chosen from a bond, substituted or unsubstituted ethenylene, and ethynylene, each Ar at each occurrence is independently chosen from substituted or unsubstituted aryl and substituted or unsubstituted heteroaryl, each m at each occurrence is 0 to 30, and at least one of $M^1$ and $M^2$ is not a bond.

7. The polymer of claim 6, wherein $M^2$ is a bond.

8. The polymer of claim 6, wherein m is 1.

9. The polymer of claim 6, wherein Ar at each occurrence is independently chosen from

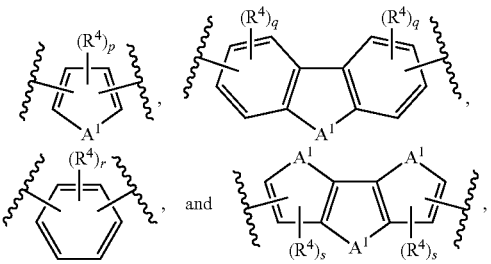

wherein $A^1$ at each occurrence is independently chosen from $N-R^3$, $CR^3_2$, $SiR^3_2$, S, and O, each $R^3$ at each occurrence is independently chosen from $-H$ and substituted or unsubstituted $C_{1-60}$ hydrocarbyl, each $R^4$ at each occurrence is independently chosen from $-H$, $-R^3$, $-OR^3$, $-NR^3_2$, and halide, p at each occurrence is independently chosen from 0, 1, and 2, r at each occurrence is independently chosen from 0, 1, 2, 3, and 4, q at each occurrence is independently chosen from 0, 1, 2, and 3, and s at each occurrence is independently chosen from 0 and 1.

10. The polymer of claim 9, wherein Ar at each occurrence is independently chosen from

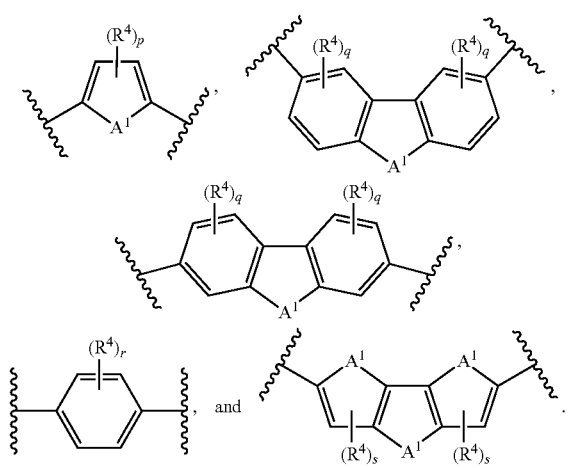

11. The polymer of claim 9, wherein $R^3$ is at each occurrence independently $C_{1-15}$ hydrocarbyl.

12. The polymer of claim 9, wherein the polymer comprises the structure

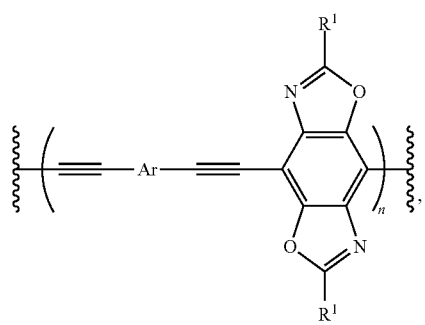

wherein Ar at each occurrence is independently chosen from

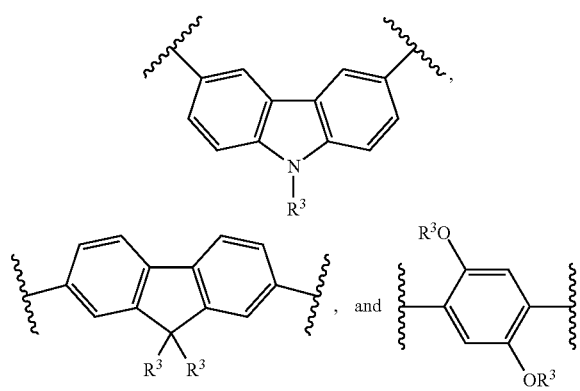

13. The polymer of claim 1, wherein the polymer is terminated by end groups -E wherein each -E at each occurrence is independently chosen from substituted or unsubstituted —$R^5$, —H, —OH, —$OR^5$, —$NR^5_2$ and halide, wherein $R^5$ at each occurrence is independently chosen from —H and substituted or unsubstituted $C_{1-60}$ hydrocarbyl.

14. The polymer of claim 1, wherein -E at each occurrence is independently $C_{1-15}$ aryl and heteroaryl.

15. The polymer of claim 6, wherein the polymer is structure (II)

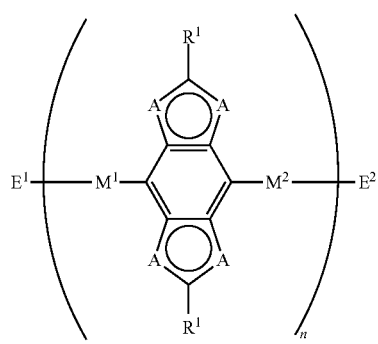

wherein n is about 2 to about 10,000, and end groups $E^1$ and $E^2$ are each independently at each occurrence chosen from substituted or unsubstituted —$R^5$, —H, —OH, —$OR^5$, —$NR^5_2$ and halide, wherein $R^5$ at each occurrence is independently chosen from —H and substituted or unsubstituted $C_{1-60}$ hydrocarbyl.

16. The polymer of claim 1, wherein the polymer has the structure

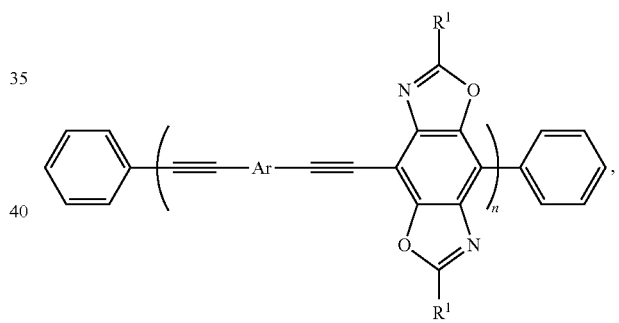

wherein Ar at each occurrence is independently chosen from

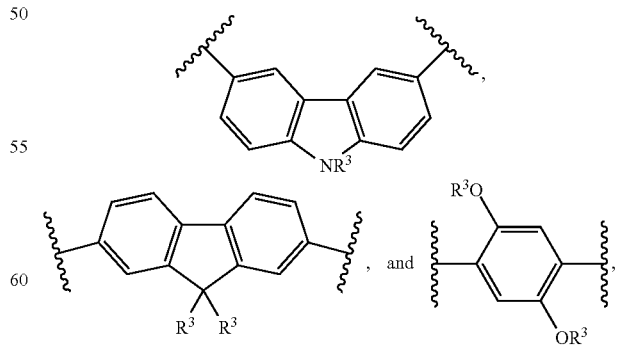

wherein each $R^3$ at each occurrence is independently chosen from —H and substituted or unsubstituted $C_{1-60}$ hydrocarbyl, and n is about 2 to about 10,000.

17. A semiconductor device comprising the polymer of claim 1.

18. The semiconductor device of claim 17, wherein the semiconductor device comprises at least one of a transistor, a diode, a photovoltaic cell, an integrated circuit, or an optoelectronic device.

19. The polymer of claim 1, wherein the polymer has the structure

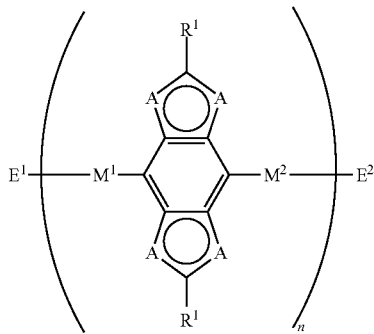

wherein each A at each occurrence is independently chosen from N, S, and O, wherein one 5-membered ring in the fused benzene ring system independently at each occurrence has one A that is N and one A that is S or O and the other 5-membered ring in the fused benzene ring system independently at each occurrence has one A that is N and one A that is O, and $M^1$ and $M^2$ are each independently at each occurrence chosen from a bond and

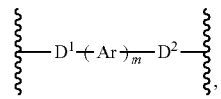

wherein each of $D^1$ and $D^2$ at each occurrence are independently chosen from a bond, substituted or unsubstituted ethenylene, and ethynylene, each m at each occurrence is 0 to 30, and at least one of $M^1$ and $M^2$ is not a bond, wherein Ar at each occurrence is independently chosen from

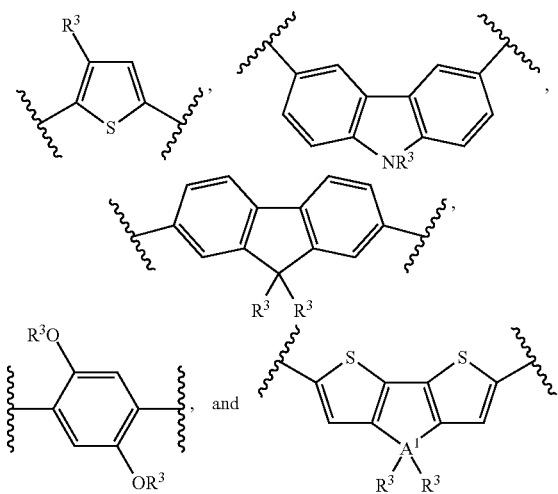

wherein $A^1$ at each occurrence is independently chosen from $N-R^3$, $CR^3{}_2$, $SiR^3{}_2$, S, and O, wherein each $R^3$ at each occurrence is independently chosen from —H and $C_{1-15}$ hydrocarbyl, and wherein n is about 2 to about 10,000, and $E^1$ and $E^2$ are each independently at each occurrence chosen from substituted or unsubstituted —$R^5$, —H, —OH, —$OR^5$, —$NR^5{}_2$ and halide, wherein $R^5$ at each occurrence is independently chosen from —H and substituted or unsubstituted $C_{1-60}$ hydrocarbyl.

20. A method of making a polymer, comprising:

obtaining or providing a fused benzene ring system having the structure

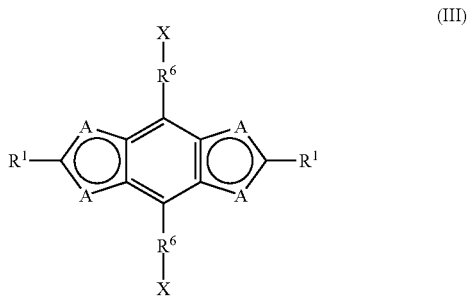

wherein each A at each occurrence is independently chosen from N, S, and O, wherein one 5-membered ring in structure (III) independently at each occurrence has one A that is N and one A that is S or O and the other 5-membered ring in structure (III) independently at each occurrence has one A that is N and one A that is O, each $R^1$ at each occurrence is independently chosen from —$R^2$, —H, —OH, —$OR^2$, —$NR^2{}_2$ and halide, wherein $R^2$ at each occurrence is independently chosen from —H and substituted or unsubstituted $C_{1-60}$ hydrocarbyl, and X is —I, —Br, —Cl, or —F, and each $R^6$ at each occurrence is independently a bond or Ar, wherein each Ar at each occurrence is independently chosen from substituted or unsubstituted aryl and substituted or unsubstituted heteroaryl;

obtaining or providing a conjugated linker having the structure

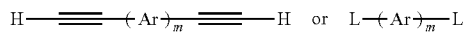

wherein each L at each occurrence is —$Sn(R^7)_3$ or —$B(OR^8)_2$, wherein $R^7$ at each occurrence is independently $C_{1-15}$ hydrocarbyl, wherein $R^8$ is $C_{1-30}$ hydrocarbyl or together with another $R^8$ is a $C_{2-30}$ hydrocarbylene that forms a cyclic boronic acid ester structure with the —B(O—)$_2$, and each m at each occurrence is 0 to 30; and contacting the fused benzene ring system and the conjugated linker under conditions so as to provide a conjugated polymer having a repeating unit comprising structure (II)

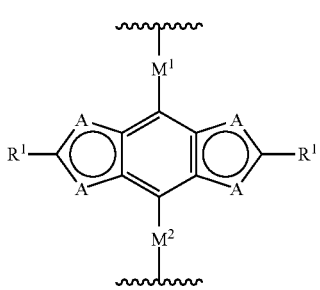

(II)

wherein $M^1$ and $M^2$ are each independently at each occurrence chosen from a bond and

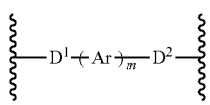

wherein each of $D^1$ and $D^2$ at each occurrence are independently chosen from a bond and ethynylene, and at least one of $M^1$ and $M^2$ is not a bond.

21. A conjugated polymer having the formula

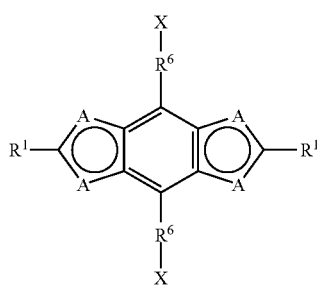

(III)

wherein each $R^1$ at each occurrence is independently chosen from —$R^2$, —H, —OH, —$OR^2$, —$NR^2_2$ and halide, wherein $R^2$ at each occurrence is independently chosen from —H and substituted or unsubstituted $C_{1-60}$ hydrocarbyl, and each A at each occurrence is independently chosen from N, S, and O, wherein one 5-membered ring independently at each occurrence has one A that is N and one A that is S or O and the other 5-membered ring independently at each occurrence has one A that is N and one A that is O and $M^1$ and $M^2$ are each independently at each occurrence chosen from a bond and

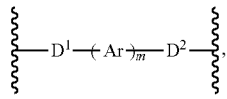

wherein each of $D^1$ and $D^2$ at each occurrence are independently chosen from a bond, substituted or unsubstituted ethenylene, and ethynylene, each m at each occurrence is 0 to 30, and at least one of $M^1$ and $M^2$ is not a bond, wherein Ar at each occurrence is independently chosen from

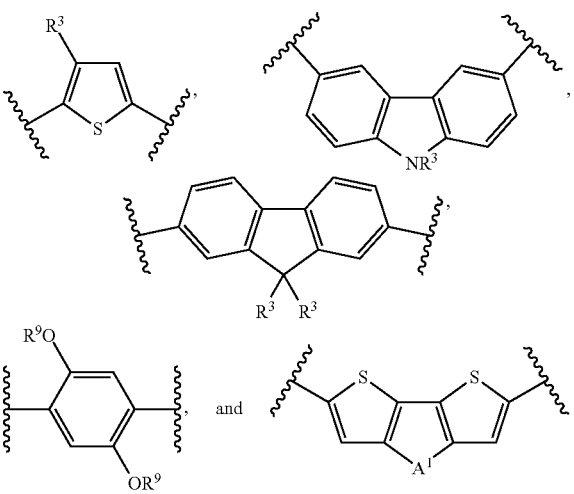

wherein $A^1$ at each occurrence is independently chosen from N—$R^3$, $CR^3_2$, $SiR^3_2$, S, and O, wherein each $R^3$ at each occurrence is independently chosen from —H and $C_{1-15}$ hydrocarbyl, and wherein each $R^9$ at each occurrence is independently chosen from —H, $C_{1-8}$ straight chain alkyl, dodecyl, $C_{1-15}$ branched alkyl, and $C_{1-15}$ cyclic hydrocarbon, wherein n is about 2 to about 10,000, and $E^1$ and $E^2$ are each independently at each occurrence chosen from substituted or unsubstituted —$R^5$, —H, —OH, —$OR^5$, —$NR^5_2$, and halide, wherein $R^5$ at each occurrence is independently chosen from —H and substituted or unsubstituted $C_{1-60}$ hydrocarbyl.

* * * * *

UNITED STATES PATENT AND TRADEMARK OFFICE
CERTIFICATE OF CORRECTION

PATENT NO. : 9,023,964 B2  
APPLICATION NO. : 14/207033  
DATED : May 5, 2015  
INVENTOR(S) : Jeffries-EL et al.

Page 1 of 5

It is certified that error appears in the above-identified patent and that said Letters Patent is hereby corrected as shown below:

Title Page, in item (72), in "Inventors", in column 1, line 2, delete "Intermann" and insert --Intemann--, therefor Specification In column 6, line 66, delete "-d]" and insert -- -d']--, therefor In column 7, line 2, delete "-d]" and insert -- -d']--, therefor In column 7, line 5, delete "-d]" and insert -- -d']--, therefor In column 7, line 8, delete "-d]" and insert -- -d']--, therefor In column 9, line 41, delete "SW, SOW," and insert --SR', SOR',--, therefor In column 12, line 40, delete "yl-1,2,3" and insert --yl, 1,2,3--, therefor In column 14, line 44, delete "15° C. to 28° C." and insert --15 °C. to 28 °C.--, therefor In column 28, Table 1, line 26, delete "$T_d[° C.]^b$" and insert --$T_d [°C.]^b$--, therefor In column 28, Table 1, line 26, delete "$T_g [° C.]^c$" and insert --$T_g [°C.]^c$--, therefor In column 28, line 34, delete "15° C." and insert --15 °C.--, therefor In column 28, line 44, delete "298-354° C." and insert --298-354 °C.--, therefor In column 28, line 48, delete "140° C." and insert --140 °C.--, therefor Signed and Sealed this  
First Day of December, 2015

Michelle K. Lee  
*Director of the United States Patent and Trademark Office*

CERTIFICATE OF CORRECTION (continued)

U.S. Pat. No. 9,023,964 B2

Specification

In column 28, line 49, delete "110° C." and insert --110 °C.--, therefor

In column 29, line 11, delete "n-stacking" and insert --π-stacking--, therefor

In column 36, line 57, delete "90° C." and insert --90 °C.--, therefor

In column 36, line 59, delete "-40° C." and insert -- -40 °C.--, therefor

In column 36, line 64, delete "108-110° C.;" and insert --108-110 °C.;--, therefor In column 37, line 2, delete "485.0434." and insert --485.0434;--, therefor In column 37, line 4, after "fluorine", insert --:--, therefor In column 37, line 31, delete "639.4776." and insert --639.4776;--, therefor In column 37, line 51, delete "495.3985." and insert --495.3985;--, therefor In column 37, line 64, delete "70° C." and insert --70 °C.--, therefor In column 38, line 49, delete "35° C." and insert --35 °C.--, therefor In column 38, line 58, delete "30-850° C." and insert --30-850 °C.--, therefor In column 38, line 58, delete "20° C." and insert --20 °C.--, therefor In column 38, line 60, delete "15° C." and insert --15 °C.--, therefor In column 38, line 62, delete "0-250° C." and insert --0-250 °C.--, therefor In column 38, line 63, delete "15° C." and insert --15 °C.--, therefor In column 39, line 38, delete "120° C." and insert --120 °C.--, therefor In column 39, line 38-39, delete "120° C." and insert --120 °C.--, therefor In column 39, line 45, delete "60° C." and insert --60 °C.--, therefor In column 44, Table 6, line 60, delete "(° C.)" and insert --(°C.)--, therefor In column 44, Table 6, line 60, delete "(° C.)" and insert --(°C.)--, therefor In column 44, Table 6, line 60, delete "(° C.)" and insert --(°C.)--, therefor

CERTIFICATE OF CORRECTION (continued)
U.S. Pat. No. 9,023,964 B2

Specification

In column 45, Table 6, line 5, delete "(° C.)" and insert --(°C.)--, therefor

In column 45, Table 6, line 5, delete "(° C.)" and insert --(°C.)--, therefor

In column 45, Table 6, line 5, delete "(° C.)" and insert --(°C.)--, therefor

In column 45, Table 6, line 12, delete "20° C." and insert --20 °C.--, therefor

In column 45, line 18, delete "300° C." and Insert --300 °C.--, therefor

In column 45, line 20, delete "17-19° C." and insert --17-19 °C.--, therefor

In column 45, line 27, delete "180° C.," and insert --180 °C.,--, therefor

In column 45, line 31, delete "84.6° C.," and insert --84.6 °C.,--, therefor

In column 46, line 61, delete "PIA" and insert --P1A--, therefor

In column 48, Table 8, line 49, delete "$E_g^{oPt}$." and insert --$E_g^{opt}$.--, therefor In column 49, line 60, delete "90° C." and insert --90 °C.--, therefor In column 49, line 67, delete "96-98° C.;" and insert --96-98 °C.;--, therefor In column 49, line 67, delete "1H" and insert --$^1$H--, therefor In column 49, line 67, delete "CDCl3" and insert --$CDCl_3$--, therefor In column 50, line 2, delete "13C" and insert --$^{13}$C--, therefor In column 50, line 2, delete "CDCl3" and insert --$CDCl_3$--, therefor In column 50, line 4, delete "[M+H]+" and insert --$[M+H]^+$--, therefor In column 50, line 5, delete "C24H35N2O2Br2" and insert --$C_{24}H_{35}N_2O_2Br_2$--, therefor In column 50, line 5, delete "541.1060." and insert --541.1060;--, therefor In column 50, line 22, delete "95-96° C.;" and insert --95-96 °C.;--, therefor In column 50, line 30, delete "773.5108." and insert --773.5108;--, therefor In column 50, line 52, delete "74-75° C.;" and insert --74-75 °C.;--, therefor Specification In column 50, line 60, delete "929.3318." and insert --929.3318;--, therefor In column 52, line 40, delete "35° C." and insert --35 °C.--, therefor In column 52, line 49, delete "35° C.-850° C.," and insert --35 °C.-850 °C.,--, therefor In column 52, line 49, delete "20° C." and insert --20 °C.--, therefor In column 52, line 51, delete "15° C." and insert --15 °C.--, therefor In column 52, line 53, delete "0° C.-250° C.," and insert --0 °C.-250 °C.--, therefor In column 52, line 54, delete "15° C." and insert --15 °C.--, therefor In column 52, line 62, delete "120° C." and insert --120 °C.--, therefor In column 53, line 13, delete "20." and insert --20.--, therefor

Claims

In column 67, line 60-65, in Claim 19, delete " 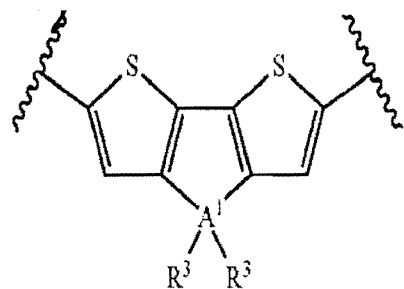 " and insert -- 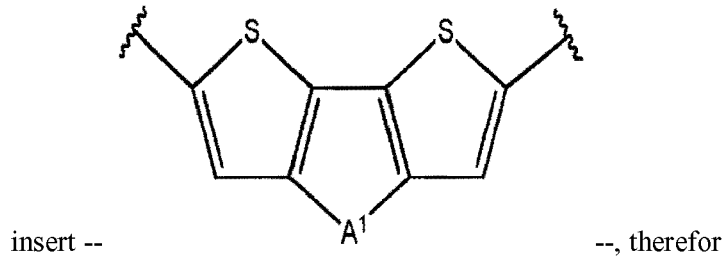 --, therefor

CERTIFICATE OF CORRECTION (continued)
U.S. Pat. No. 9,023,964 B2

Claims

In column 69, line 30-40, in Claim 21, delete " 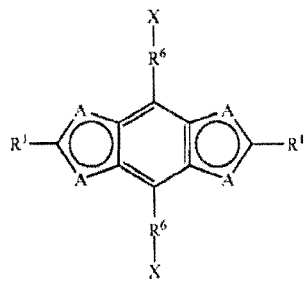 " and insert -- 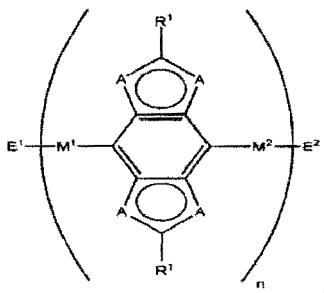 --, therefor